(12) United States Patent
Ohuchi et al.

(10) Patent No.: US 7,852,434 B2
(45) Date of Patent: Dec. 14, 2010

(54) AROMATIC POLYMER

(75) Inventors: Kazuei Ohuchi, Ibaraki (JP); Daisuke Fukushima, Ibaraki (JP); Takeshi Yamada, Ibaraki (JP); Makoto Anryu, Ibaraki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 274 days.

(21) Appl. No.: 11/921,754

(22) PCT Filed: Jun. 9, 2006

(86) PCT No.: PCT/JP2006/311605

§ 371 (c)(1),
(2), (4) Date: Dec. 7, 2007

(87) PCT Pub. No.: WO2006/132354

PCT Pub. Date: Dec. 14, 2006

(65) Prior Publication Data

US 2009/0207346 A1    Aug. 20, 2009

(30) Foreign Application Priority Data

Jun. 10, 2005   (JP)  ............................ 2005-171064

(51) Int. Cl.
*G02F 1/1335* (2006.01)
(52) U.S. Cl. ....................................... 349/69
(58) Field of Classification Search ................. None
See application file for complete search history.

(56) References Cited

U.S. PATENT DOCUMENTS

| 2001/0037000 | A1 | 11/2001 | Goto et al. | |
|---|---|---|---|---|
| 2005/0237780 | A1* | 10/2005 | Sakai | 365/111 |

FOREIGN PATENT DOCUMENTS

| JP | 9-278879 | A | 10/1997 |
|---|---|---|---|
| JP | 2005-8860 | A | 1/2005 |
| JP | 2005-39086 | A | 2/2005 |
| JP | 2005-226065 | A | 8/2005 |
| JP | 2005-306998 | A | 11/2005 |
| JP | 2006-69999 | A | 3/2006 |
| WO | WO 01/62822 | A1 | 8/2001 |
| WO | WO 02/092723 | A1 | 11/2002 |
| WO | WO 02/092724 | A1 | 11/2002 |
| WO | WO 02/095586 | A2 | 11/2002 |

OTHER PUBLICATIONS

A.D. Schluter, The Tenth Anniversary of Suzuki Polycondensation (SPC), Journal of Polymer Science: Part A, Polymer Chemistry, vol. 39, (2001), pp. 1533-1556.
L. Akcelrud, "Electroluminescent polymers", Progress in Polymer Science, 28, (2003), pp. 875-962.

* cited by examiner

*Primary Examiner*—Sung H Pak
(74) *Attorney, Agent, or Firm*—Sughrue Mion, PLLC

(57) ABSTRACT

Disclosed is an aromatic polymer containing one or more repeating units represented by the following formula (1). (In the formula, $Ar^1$ represents an arylene group having a fused ring structure or a divalent heterocyclic compound group having a π-conjugated system, and contains a group represented by the formula (2) below. This group is bonded to a carbon atom having a $sp^2$ hybrid orbital which is contained in a ring of the ring structure of the arylene group having a fused ring structure or the divalent heterocyclic compound group having a π-conjugated system represented by $Ar^1$. (In the formula (2), $E^1$ represents a hydrogen atom, a halogen atom or a monovalent organic group; $Ar^2$ represents a group having a divalent π-conjugated cyclic compound residue, and two $Ar^2$'s may be the same as or different from each other; $X^1$ represents a divalent group selected from the group consisting of —$NQ^1$-, —$PQ^2$- and —$BQ^3$-, and $Q^1$-$Q^3$ independently represent a substituent; Z represents a direct bond or a divalent linking group, and two Z's may be the same as or different from each other; $m_i$'s respectively represent 0 or 1; and in case where two $X^1$'s exist, they may be the same as or different from each other.)

25 Claims, 3 Drawing Sheets

AROMATIC POLYMER

TECHNICAL FIELD

The present invention relates to a novel aromatic polymer.

BACKGROUND ART

Polymer compounds having an aromatic ring in the main chain show unique properties in electronic properties such as charge transfer property, light-emitting property and the like, mechanical properties such as rigidity, thermal stability and the like, etc. Therefore, applications thereof have been actively pushed forward in electron material field, chemical field, energy material field, medicinal field, etc. (for example, Non-Patent Document 1 and Patent Document 1). In particular, applications as an electron device are being investigated and there are known, as polymer compounds used as, for example, high-molecular-weight light-emitting material (a polymer fluorescent material), polyarylene type polymer compounds (e.g. polyfluorene and poly-p-phenylene derivatives) and polyarylenevinylene type polymer compounds (for example, Non-Patent Document 2).

Non-Patent Document 1: Journal of Polymer Science: Part A, Vol. 39, p. 1533 (2001)

Non-Patent Document 2: Progress in Polymer Science, Vol. 28, p. 875 (2003)

Patent Document 1: Japan Patent No. 3606217 (US 2001037000 A1)

DISCLOSURE OF THE INVENTION

Problems to be Solved by the Invention

Conventional polymer compounds having an aromatic ring in the main chain, however, have not been sufficient in charge transfer property and light emission property when used as a polymer fluorescent material.

The object of the present invention is to provide a novel aromatic polymer. More particularly, the object of the present invention is to provide a novel aromatic polymer superior in charge transfer property and light emission property.

Means for Solving the Problems

The present inventors made a study in order to achieve the above object. As a result, the present inventors found a novel aromatic polymer containing an aromatic repeating unit having a group of particular structure which forms a π-conjugated system with the main chain of the aromatic polymer and whose π-conjugated carbon atom is bonded to the π-conjugated carbon atom of the main chain. This finding has led to the completion of the present invention.

The present invention provides an aromatic polymer containing at least one kind of the repeating units represented by the following formula (1):

$$—Ar^1— \qquad (1)$$

wherein $Ar^1$ represents an arylene group having a fused ring structure or a divalent heterocyclic compound group having a π-conjugated system and has a group represented by the following formula (2), bonding to a carbon atom having a sp² hybrid orbital, which carbon atom is contained in a ring of a ring structure of the arylene group having a fused ring structure or the divalent heterocyclic compound group having a π-conjugated system, each represented by $Ar^1$:

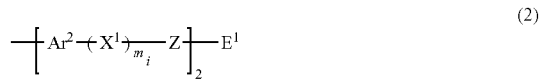

(wherein $E^1$ represents a hydrogen atom, a halogen atom or a monovalent organic group; $Ar^2$ represents a group having a divalent, π-conjugated cyclic compound residue; two $Ar^2$'s may be the same or different from each other; $X^1$ represents a divalent group selected from the group consisting of $—NQ^1—$, $—PQ^2—$ and $—BQ^3—$; $Q^1$ to $Q^3$ independently represent a substituent; Z represents a direct bond or a divalent linking group; two Z's may be the same or different from each other; $m_i$'s each represent 0 or 1; in case where two $X^1$'s exist, they may be the same or different from each other).

ADVANTAGES OF THE INVENTION

The aromatic polymer of the present invention is expected to be used, in electron material field, chemical field, energy material field, medicinal field, etc., as a polymer material useful for production of various highly functional materials.

When the present aromatic polymer is used, in electron material field, as, for example, a polymer light-emitting device (which may hereinafter be referred to as polymer LED), there can be attained high functions such as the followings:

improvement in charge injection and transfer property, brought about by allowing the main chain having a charge transfer property to have a substituent capable of giving an improved charge injection and transfer property, control of emitted light wavelength, brought about by allowing the main chain to have a functional substituent including a fluorescence- or phosphorescence-emitting dye, and improvement in light emission efficiency and charge injection and transfer property, brought about by allowing the light-emitting main chain to have a side chain having a charge injection and transfer property.

With the present aromatic polymer, there can further be attained high functions such as mentioned below. In random copolymers, block copolymers, etc. each having, in combination, a repeating unit having a charge injection and transfer property, a repeating unit having a hole injection and transfer property and a light-emitting repeating unit, it is considered that the charge injection and transfer properties possessed by individual repeating units are hampered by each other. In the present aromatic polymer, however, as compared with when using the above-mentioned random copolymers and block copolymers, functions such as injection of positive charge, injection of negative charge, transfer of positive charge, transfer of negative charge, and light emission are possessed separately between main chain and side chains or between side chains; thereby, individual functions can be expressed without being sacrificed, and introduction (inclusion) of moieties having respective functions can be controlled as intended, that is, the amount of each functional substituent introduced is controlled and an appropriate balance is attained between the function originally possessed by the main chain and the functions possessed by the functional substituents introduced.

When the present aromatic polymer is used, in chemical field, as a structural material, high functions such as inhibition of phase separation and the like can be expected by using the aromatic polymer as a main component or as an additive.

There is known a case in which an aromatic polymer is used, in energy material field, for production of a polymer electrolyte such as proton-conductive membrane for fuel cell. In such a case, by using an aromatic polymer in which a side chain having an ion-exchangeable substituent has been introduced, it can be expected to attain a high function of improved ion exchange capacity while maintaining the membrane strength, as compared with a case of using a corresponding straight-chain polymer.

Further, in the aromatic polymer of the present invention, since the main chain and the side chain are bonded to each other between the respective carbon atoms which form a π-conjugated system; the aromatic polymer is expected to have high thermal and chemical stabilities. Furthermore, owing to the above bonding between the carbon atoms which form a π-conjugated system, the possibility of tuning of electronic energy level of main chain by side chain is expected. In addition, in the present aromatic polymer, since the main chain bonding to the side chain between the respective carbon atoms which form a π-conjugated system, is an arylene group having a fused ring structure, or a divalent heterocyclic group, it is possible to design properties of main chain such as charge injection and transfer property and light emission property, at a higher level than when the side chain is bonded to a phenylene group, and high functions can be imparted more effectively by the side chain.

Thus, in the aromatic polymer of the present invention, it is expected that functional groups can control or improve the functions of main chain or can impart new functions to the main chain without impairing the original functions of main chain. Further, in the present aromatic polymer, it is expected that various high functions can be achieved at a high freedom and with less restriction, as compared with when using a mixture of corresponding straight-chain polymers, a corresponding random copolymer, a corresponding block copolymer, etc.

BEST MODE FOR CARRYING OUT THE INVENTION

Figure 1:
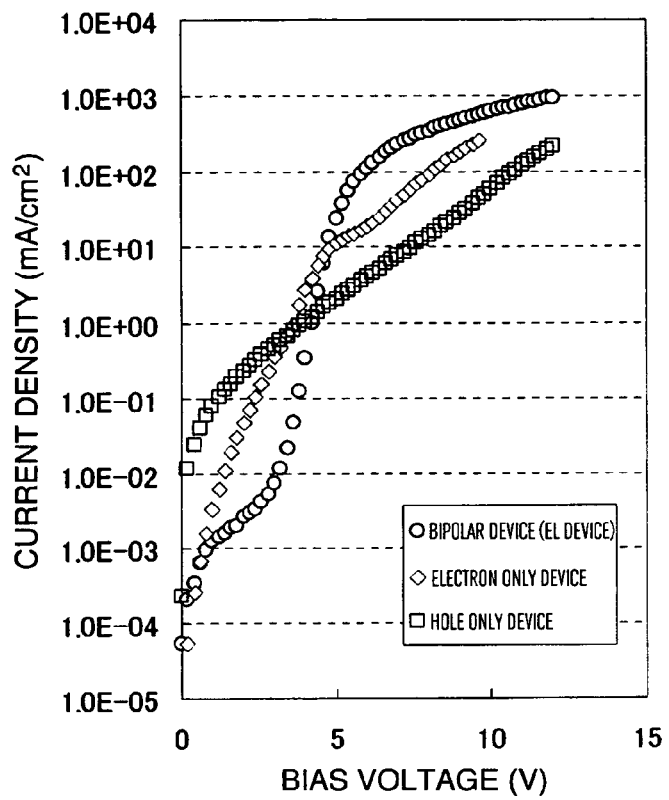
FIG. 1 shows the results of measurement of voltage-current characteristics of the electron only device and hole only device of Example 7 and the EL device of Example 8.

The aromatic polymer of the present invention contains at least one kind of the repeating units represented by the formula (1).

Each repeating unit represented by the formula (1) represents an arylene group having a fused ring structure or a divalent heterocyclic compound group having a π-conjugated system, having a group represented by the formula (2). That is, the group represented by the formula (2) bonds to a carbon atom having a sp² hybrid orbital, contained in the ring of the ring structure of the arylene group having a fused ring structure or the divalent heterocyclic compound group having a π-conjugated system, each represented by Ar¹. Therefore, the nucleus of the arylene group or the divalent heterocyclic compound group having a π-conjugated system, each represented by Ar¹, is substituted by the group represented by the formula (2).

The upper limit of the number of the groups represented by the formula (2) bonding to the arylene group having a fused ring structure or the divalent heterocyclic compound group, each represented by Ar¹ is a maximum number in which the groups of formula (2) can bond to the arylene group having a fused ring structure or the divalent heterocyclic compound group, each represented by Ar¹. However, the number is preferably not less than 1 and not more than 4, more preferably not less than 1 and not more than 2, further preferably 1 per one arylene group having a fused ring structure or one divalent heterocyclic compound group, each represented by Ar¹, from the standpoint of easiness of synthesis of the present aromatic polymer.

The arylene group having a fused ring structure is an atomic group formed by removing, from an aromatic hydrocarbon having a fused ring structure, two of the hydrogen atoms bonding to carbon atoms having a sp² hybrid orbital, present in the ring of the main chain ring structure. The arylene group having a fused ring structure may have other substituent in addition to the group represented by the formula (2). However, the group represented by the formula (2) does not bond to any carbon atom of the substituent other than the substituent represented by the formula (2). In the arylene group having a fused ring structure, the number of the carbon atoms of the moiety excluding the substituents is ordinarily about 9 to 60, preferably 9 to 20. The number of the total carbon atoms of the arylene group having a fused ring structure, including the substituents is ordinarily about 9 to 100. As examples of the arylene group, there can be shown groups represented by the following formulas 1A-2 to 1A-14.

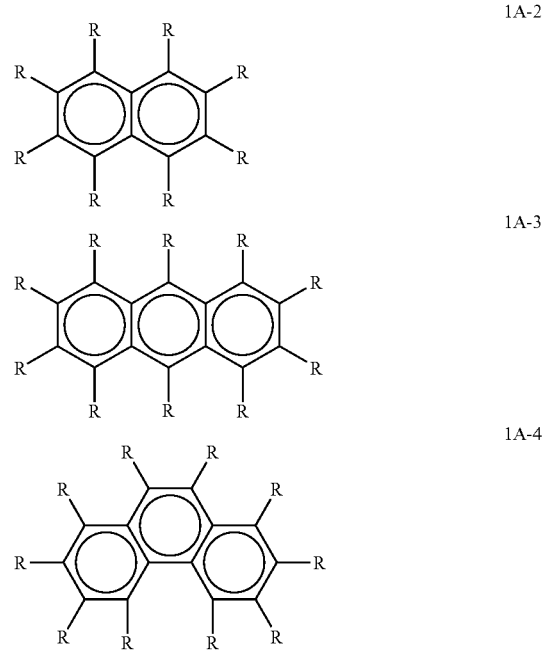

1A-5
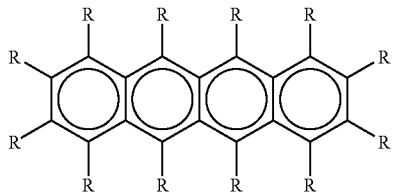

1A-6
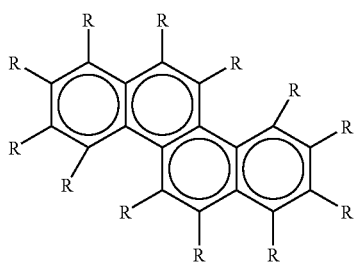

1A-7
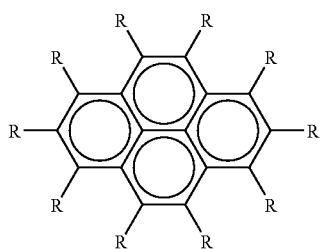

1A-8
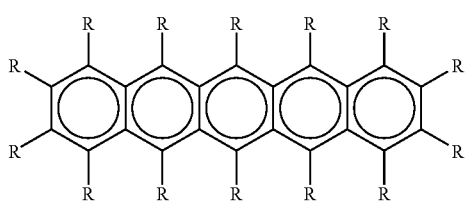

1A-9
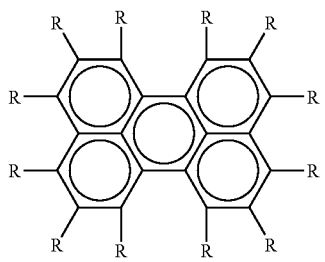

1A-10
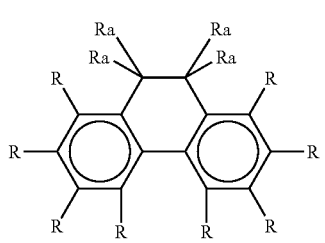

1A-11
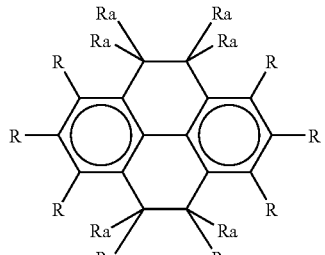

1A-12
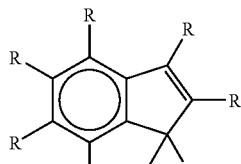

1A-13
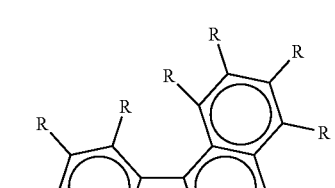

1A-14
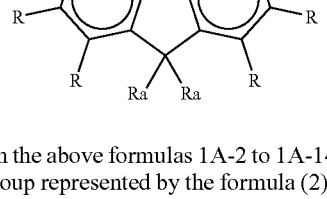

In the above formulas 1A-2 to 1A-14, R represents a bond, a group represented by the formula (2), a hydrogen atom or a substituent; any two of a plurality of R's represent a bond. When there exist a plurality of substituents represented by R, they may be the same or different from each other. Ra represents a hydrogen atom or a substituent other than the group represented by the formula (2). A plurality of Ra's may be the same or different from each other. When two Ra's exist on one atom, they may together form an oxo group or a thioxo group, or may be bonded to each other to form a ring.

Also, the substituent represented by R, when existing on two adjacent atoms, may form a 5- to 7-membered aliphatic ring which may contain a hetero atom such as oxygen atom, sulfur atom, nitrogen atom or the like, or a 5- to 7-membered aromatic ring which may contain a hetero atom such as oxygen atom, sulfur atom, nitrogen atom or the like.

As the arylene group represented by Ar¹, there are preferred, of the formulas 1A-2 to 1A-14, naphthalene-diyl group (formula 1A-2), anthracene-diyl group (1A-3), fluorene-diyl group (formula 1A-13) and benzofluorene-diyl group (1A-14), from the standpoint of easiness of synthesis. Particularly preferred are naphthalene-diyl group (formula 1A-2), fluorene-diyl group (formula 1A-13) and benzofluorene-diyl group (1A-14).

For the higher device properties in charge transfer, fluorescent intensity, light emission efficiency, etc when the aromatic polymer of the present invention has been used in a polymer LED, there are preferred, as the arylene group represented by Ar¹, the following groups selected from the formulas 1A-2 to 1A-14, that is, dihydrophenathrene-diyl group (formula 1A-10), fluorene-diyl group (formula 1A-13) and benzofluorene-diyl group (formula 1A-14). Particularly preferred are fluorene-diyl group (formula 1A-13) and benzofluorene-diyl group (formula 1A-14).

The divalent heterocyclic compound group having a π-conjugated system is an atomic group formed by removing, from a heterocyclic compound having a π-conjugated system, two of the hydrogen atoms bonding to carbon atoms having a sp² hybrid orbital, present in the ring of the main chain ring structure, and includes those having a fused ring. The divalent heterocyclic compound group having a π-conjugated system may have other substituent in addition to the group represented by the formula (2). However, the group represented by the formula (2) does not bond to any carbon atom of the substituent other than the substituent represented by the formula (2). Here, the heterocyclic compound refers to a an aromatic compound having a ring structure, which contains, as the ring-constituting elements, not only carbon atom but also hetero atoms such as oxygen atom, sulfur atom, nitrogen atom, phosphorus atom, boron atom, arsenic atom, silicon atom, selenium atom and the like.

The number of the carbon atoms of the moiety of divalent heterocyclic compound group having a π-conjugated system, excluding the substituents is ordinarily about 2 to 60, preferably 2 to 20. The number of total carbon atoms of the divalent heterocyclic compound group having a π-conjugated system, including the substituents is ordinarily about 2 to 100. As examples of the divalent heterocyclic compound group having a π-conjugated system, there can be mentioned groups such as the following formulas 2A-1 to 2A-53.

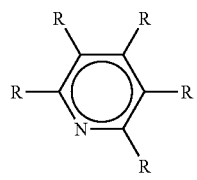

2A-1

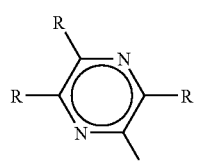

2A-2

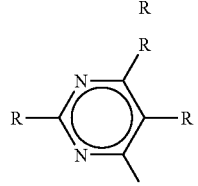

2A-3

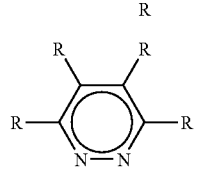

2A-4

-continued

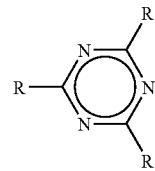

2A-5

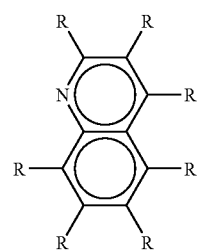

2A-6

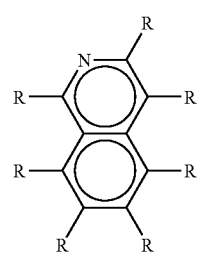

2A-7

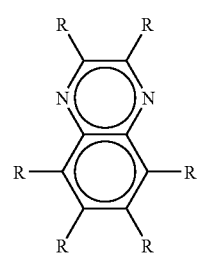

2A-8

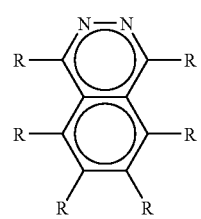

2A-9

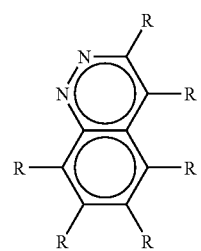

2A-10

-continued
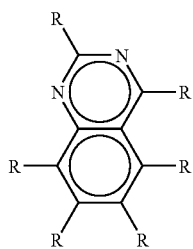
2A-11
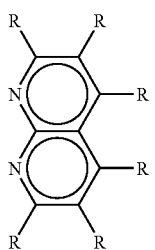
2A-12
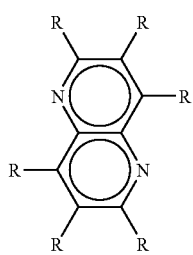
2A-13
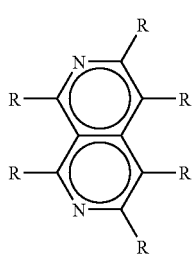
2A-14
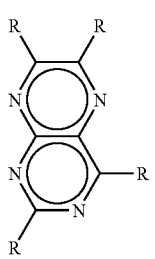
2A-15
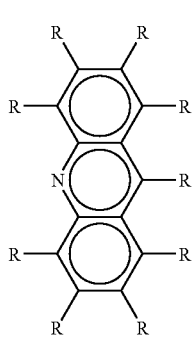
2A-16
-continued
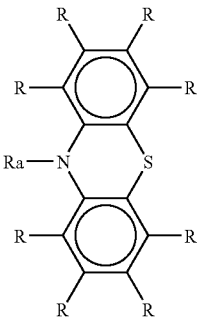
2A-17
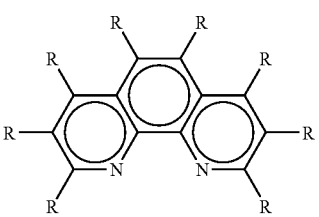
2A-18
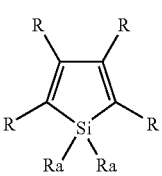
2A-19
2A-20
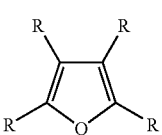
2A-21
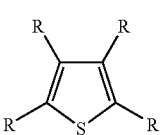
2A-22
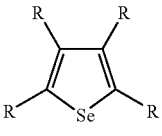
2A-23
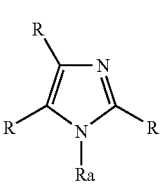
2A-24

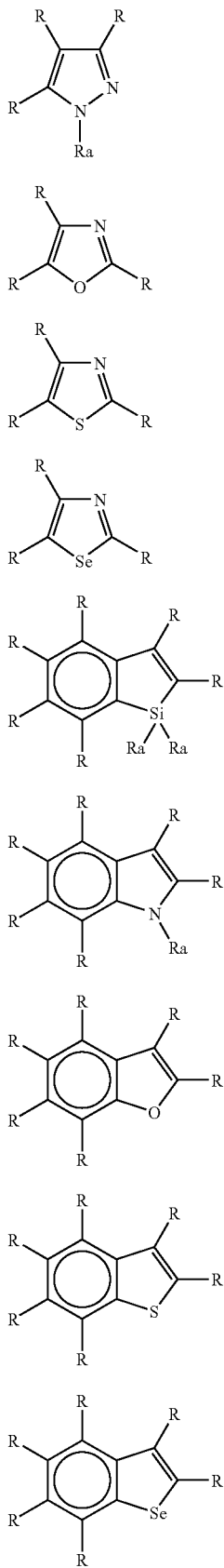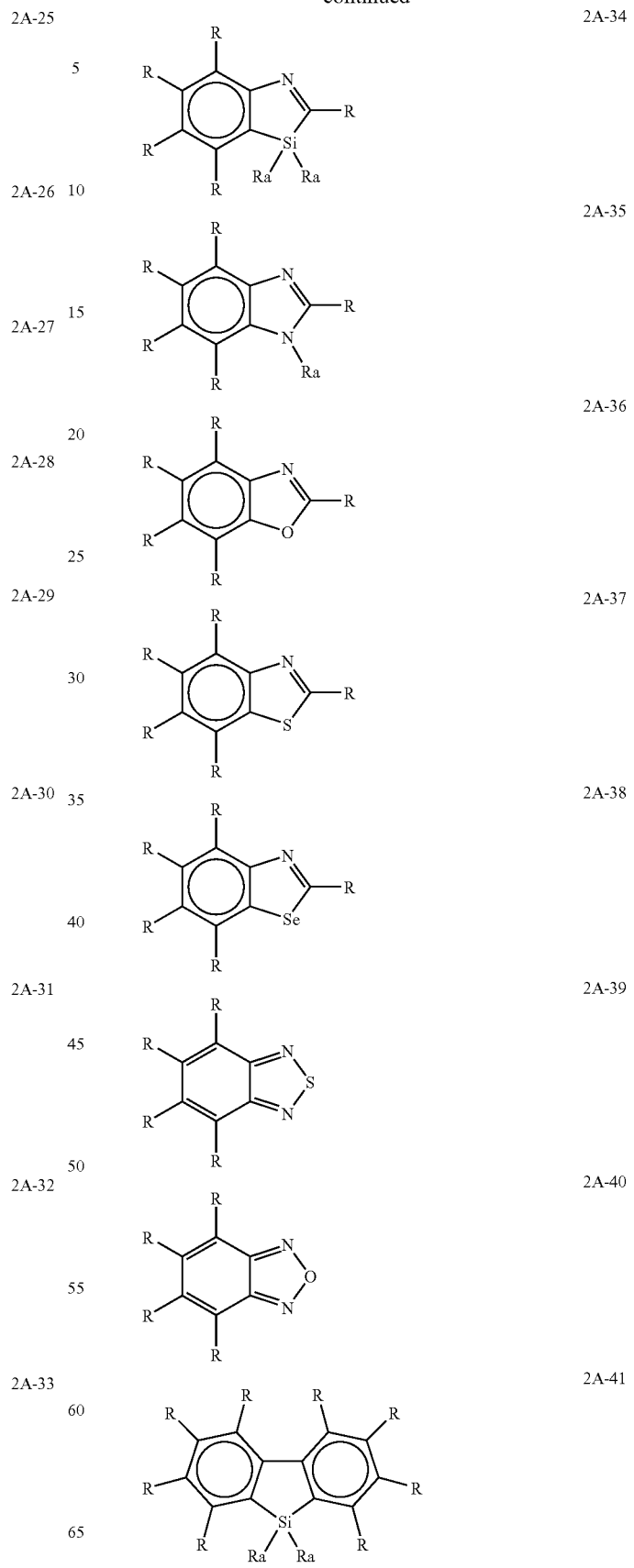

-continued

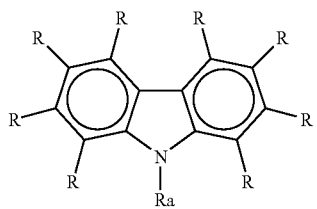
2A-42

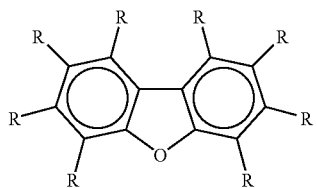
2A-43

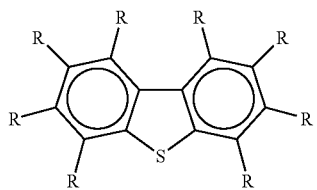
2A-44

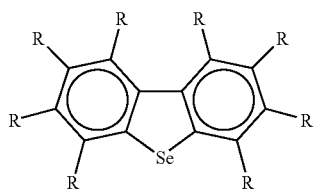
2A-45

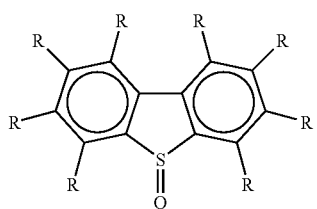
2A-46

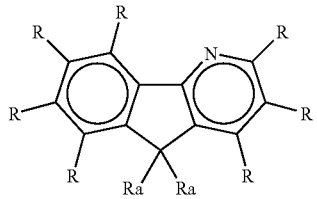
2A-47

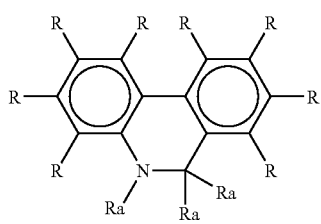
2A-48

-continued

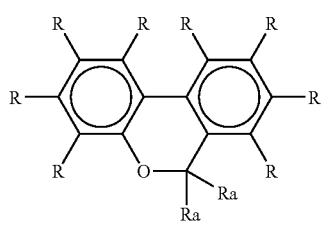
2A-49

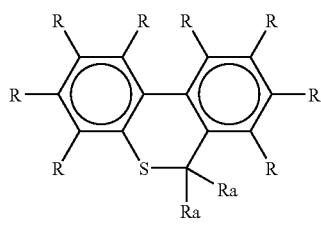
2A-50

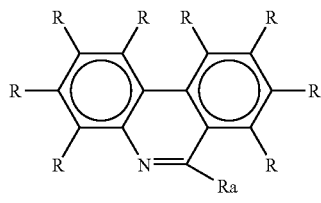
2A-51

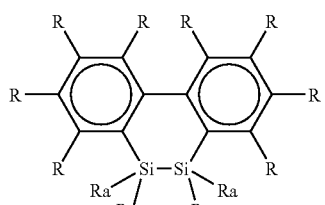
2A-52

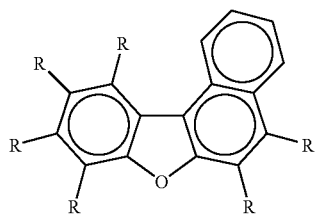
2A-53

In the above formulas 2A-1 to 2A-53, R represents a bond, a group represented by the formula (2), a hydrogen atom or a substituent. Any two of a plurality of R's represent a bond. When there exist a plurality of substituents represented by R, they may be the same or different from each other. Ra represents a hydrogen atom or a group other than the substituent represented by the formula (2). A plurality of Ra's may be the same or different from each other. When two Ra's exist on one atom, they may together form an oxo group or a thioxo group, or may be bonded to each other to form a ring.

Also, the substituent represented by R, when existing on two adjacent atoms, may form a 5- to 7-membered aliphatic ring which contains a hetero atom such as oxygen atom, sulfur atom, nitrogen atom or the like, or a 5- to 7-membered aromatic ring which may contain a hetero atom such as oxygen atom, sulfur atom, nitrogen atom or the like.

When the aromatic polymer of the present invention is used as a polymer LED, there are preferred, for higher device properties in charge transfer property, fluorescent intensity, light emission efficiency, etc., the following groups selected from the above formulas 2A-1 to 2A-53, that is, pyridine-diyl group (formula 2A-1), quinoline-diyl group (formula 2A-6), isoquinoline-diyl group (formula 2A-7), quinoxaline-diyl group (formula 2A-8), phenanthroline-diyl group (2A-18), thiophene-diyl group (formula 2A-22), imidazole-diyl group (formula 2A-24), oxazole-diyl group (formula 2A-26), thiazole-diyl group (2A-27), 5-membered heterocyclic group containing a hetero atom(s) (e.g. nitrogen, sulfur, oxygen), to which benzene ring has fused, (formulas 2A-30 to 2A-32, 2A-34 to 2A-40), and heterocyclic group similar to fluorene skeleton, containing a hetero atom (silicon, nitrogen, oxygen or sulfur), (formulas 2A-41 to 2A-44, 2A-46 to 2A-47), (formulas 2A-48 to 2A-53). More preferred are thiophene-diyl group (formula 2A-22), thiazole-diyl group (formula 2A-27), benzothiazole-diyl group (formula 2A-39), benzoxadiazole-diyl group (2A-40), dibenzosilol-diyl group (formula 2A-41) carbazole-diyl group (formula 2A-42), dibenzofuran-diyl group (formula 2A-43), dibenzothiophene-diyl group (formula 2A-44), azafluorene-diyl group (formula 2A-47) and dibenzopyran-diyl group (formula 2A-49). Further preferred are carbazole-diyl group (formula 2A-42), dibenzofuran-diyl group (formula 2A-43), dibenzothiophene-diyl group (formula 2A-44) and dibenzopyran-diyl group (formula 2A-49).

Preferred as the group represented by $Ar^1$ are an arylene group having a fused ring structure and a divalent heterocyclic compound group having a π-conjugated system, which has a fused ring structure. More preferred is an arylene group having a fused ring structure.

As the substituent represented by R or Ra, other than the group represented by the formula (2), there can be mentioned, for example, alkyl group, aryl group, aralkyl group, monovalent heterocyclic group (each of these is formula R-1), alkenyl group which may be substituted (formula R-2), alkynyl group which may be substituted (formula R-3), formyl groups which may be substituted (formulas R-4 to R-7), thioformyl groups which may be substituted (formulas R-8 to R-11), imine residues which may be substituted (formulas R-12 to R-15 and formula R-28), hydroxy groups which may be substituted (formulas R-16 to R-19), mercapto groups which may be substituted (formulas R-20 to R-23), amino groups which may be substituted (formulas R-24 to R-27 and R-29), halogen atoms (formulas R-30 to R-33), substituted sulfonyl group (formula R-34), silyl group which may be substituted (formula R-35), silanol group which may be substituted (formula R-36), sulfonic acid group (formula R-37), phosphonic acid group (formula R-38), cyano group (formula R-39) and nitro group (formula R-40).

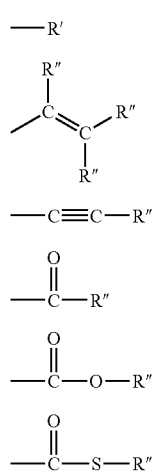
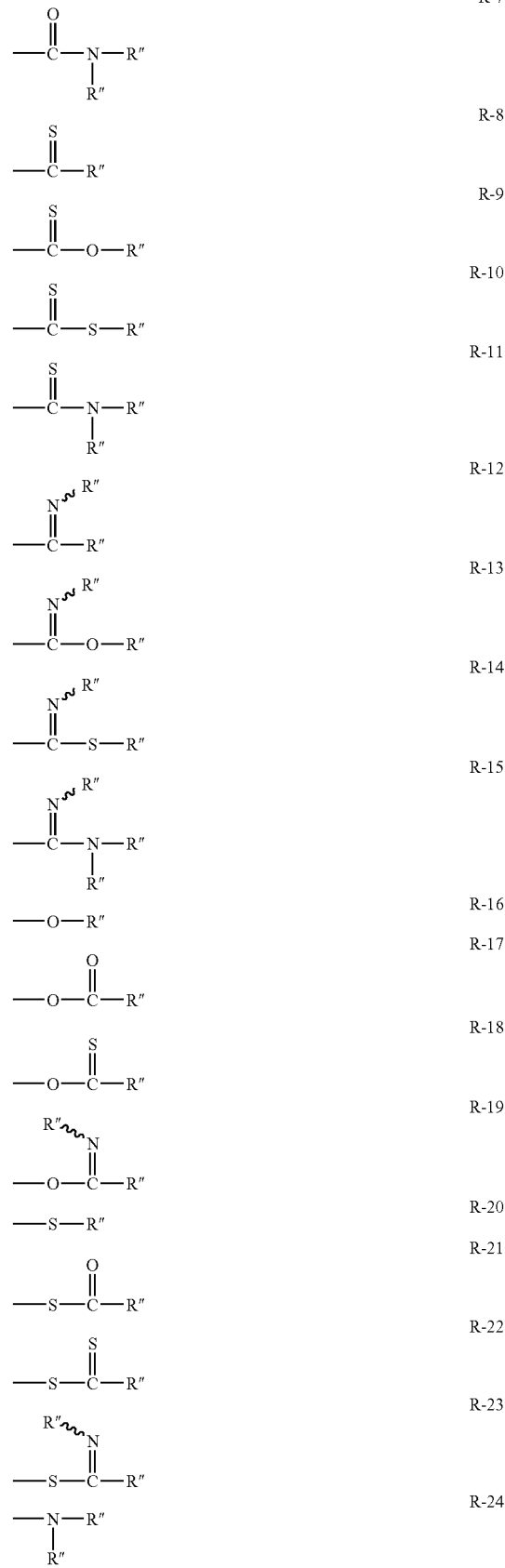

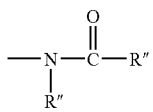
R-25

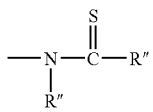
R-26

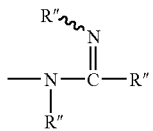
R-27

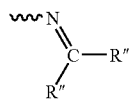
R-28

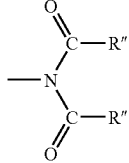
R-29

—F  R-30
—Cl  R-31
—Br  R-32
—I  R-33

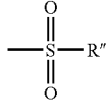
R-34

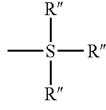
R-35

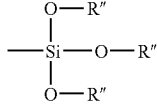
R-36

—SO$_3$H  R-37
—PO$_3$H$_2$  R-38
—C≡N  R-39
—NO$_2$  R-40

[In the above formulas, —R' represents a group selected from the group consisting of alkyl group, aryl group, aralkyl group and monovalent heterocyclic group; and R" represents a group selected from the group consisting of hydrogen atom, alkyl group, aryl group, aralkyl group and monovalent heterocyclic group.]

The alkyl group represented by the formula R-1, —R' or —R" may be any of straight chain, branched chain or cyclic chain, and has ordinarily about 1 to 20 carbon atoms, preferably 3 to 20 carbon atoms. As specific examples thereof, there are mentioned methyl group, ethyl group, propyl group, isopropyl group, n-butyl group, isobutyl group, secondary butyl group, tertiary butyl group, pentyl group, isopentyl group, hexyl group, cyclohexyl group, heptyl group, octyl group, 2-ethylhexyl group, nonyl group, decyl group, 3,7-dimethyloctyl group, dodecyl group and octadecyl group. From the standpoints of solubility in organic solvents, easiness of synthesis, etc., there are preferred methyl group, ethyl group, propyl group, isopropyl group, butyl group, isobutyl group, secondary butyl group, tertiary butyl group, pentyl group, isopentyl group, hexyl group, cyclohexyl group, heptyl group, cyclohexylmethyl group, octyl group, 2-ethylhexyl group, 2-cyclohexylethyl group, nonyl group, decyl group, 3,7-dimethyloctyl group and dodecyl group; more preferred are methyl group, ethyl group, propyl group, isopropyl group, butyl group, isobutyl group, secondary butyl group, tertiary butyl group, pentyl group, isopentyl group, hexyl group, cyclohexyl group, heptyl group, octyl group, 2-ethylhexyl group, nonyl group, decyl group and 3,7-dimethyloctyl group; and further preferred are propyl group, isopropyl group, butyl group, isobutyl group, secondary butyl group, tertiary butyl group, pentyl group, isopentyl group, hexyl group, cyclohexyl group, heptyl group, octyl group, 2-ethylhexyl group, nonyl group, decyl group and 3,7-dimethyloctyl group.

The aryl group represented by the formula R-1, —R' or —R" is an atomic group formed by removing, from an aromatic hydrocarbon, one hydrogen atom on the aromatic ring and includes those having a fused ring. The aryl group has ordinarily about 6 to 60 carbon atoms, preferably 7 to 48 carbon atoms. Specific examples thereof include phenyl group, $C_1$ to $C_{12}$ alkylphenyl group ($C_1$ to $C_{12}$ refers to 1 to 12 carbon atoms. The same applies hereafter), 1-naphtyl group, 2-naphthyl group, 1-anthracenyl group, 2-anthrcenyl group and 9-anthracenyl group.

$C_1$ to $C_{12}$ alkylphenyl group is preferred from the standpoints of solubility in organic solvents, easiness of synthesis, etc. and also from the balance between device property and heat resistance when the aromatic polymer of the present invention has been used in a polymer LED.

As specific examples of the $C_1$ to $C_{12}$ alkylphenyl group, there can be mentioned methylphenyl group, ethylphenyl group, dimethylphenyl group, dimethyl-t-butylphenyl group, propylphenyl group, mesityl group, methylethylphenyl group, isopropylphenyl group, n-butylphenyl group, isobutylphenyl group, s-butylphenyl group, t-butylphenyl group, pentylphenyl group, isopentylphenyl group, hexylphenyl group, heptylphenyl group, octylphenyl group, nonylphenyl group, decylphenyl group, 3,7-dimethyloctylphenyl group and dodecylphenyl group. Preferred are dimethylphenyl group, dimethyl-t-butylphenyl group, propylphenyl group, mesityl group, methylethylphenyl group, isopropylphenyl group, n-butylphenyl group, isobutylphenyl group, s-butylphenyl group, t-butylphenyl group, pentylphenyl group, isopentylphenyl group, hexylphenyl group, heptylphenyl group, octylphenyl group, nonylphenyl group, decylphenyl group, 3,7-dimethyloctylphenyl group and dodecylphenyl group.

The aralkyl group represented by the formula R-1, —R' or —R" has ordinarily about 7 to 60 carbon atoms, preferably 7 to 48 carbon atoms. Specific examples thereof include phenyl-($C_1$ to $C_{12}$) alkyl group, $C_1$ to $C_{12}$ alkylphenyl-($C_1$ to $C_{12}$) alkyl group, 1-naphthyl-($C_1$ to $C_{12}$)alkyl group and 2-naphthyl-($C_1$ to $C_{12}$)alkyl group.

$C_1$ to $C_{12}$ alkylphenyl-($C_1$ to $C_{12}$)alkyl group is preferred from the standpoints of solubility in organic solvents, easiness of synthesis, etc. and also from the balance between device property and heat resistance when the aromatic polymer of the present invention has been used in a polymer LED.

The monovalent heterocyclic group represented by the formula R-1, —R' or —R" is an atomic group formed by removing one hydrogen atom from a heterocyclic compound, and has ordinarily about 4 to 60 carbon atoms, preferably 4 to 20 carbon atoms. Incidentally, the carbon atoms of the heterocyclic group do not include the carbon atoms of the substituent(s). Here, the heterocyclic compound refers to those cyclic organic compounds whose elements constituting the ring are not only carbon atom but also a hetero atom(s) such as oxygen, sulfur, nitrogen, phosphorus, boron or (and) the like. Specific examples thereof include thienyl group, $C_1$ to $C_{12}$ alkylthienyl group, pyrrolyl group, furyl group, pyridyl group, $C_1$ to $C_{12}$ alkylpyridyl group, piperidyl group, quinolyl group and isoquinolyl group.

Thienyl group, $C_1$ to $C_{12}$ alkylthienyl group, pyridyl group and $C_1$ to $C_{12}$ alkylpyridyl group are preferred from the standpoints of solubility in organic solvents, easiness of synthesis, etc. and also from the balance between device property and heat resistance when the aromatic polymer of the present invention has been used in a polymer LED.

The alkenyl group which may be substituted, represented by the formula R-2, includes, for example, terminal vinyl group, alkenyl group and arylalkenyl group. The alkenyl group has ordinarily about 3 to 20 carbon atoms and its specific examples are 1-propenyl group, 2-methyl-1-propenyl group and 1,5-cyclooctadien-1-yl. The arylalkenyl group has ordinarily about 8 to 60 carbon atoms and its specific examples are phenyl-($C_2$ to $C_{12}$)alkenyl group, $C_1$ to $C_{12}$ alkylphenyl-($C_2$ to $C_{12}$) alkenyl group, 1-naphthyl-($C_2$ to $C_{12}$)alkenyl group and 2-naphtyl-($C_2$ to $C_{12}$)alkenyl group.

Arylalkenyl group is preferred from the standpoints of solubility in organic solvents, easiness of synthesis, etc. and also from the balance between device property and heat resistance when the aromatic polymer of the present invention has been used in a polymer LED, and there are preferred phenyl-($C_2$ to $C_{12}$) alkenyl group and $C_1$ to $C_{12}$ alkylphenyl-($C_2$ to $C_{12}$)alkenyl group.

The alkynyl group which may be substituted, represented by the formula R-3 includes, for example, terminal acetylene group, alkynyl group and arylalkynyl group. The alkynyl group has ordinarily about 3 to 20 carbon atoms and its specific examples are 1-hexyn-1-yl group and 3-hexyn-3-yl group. The arylalkynyl group has ordinarily about 8 to 60 carbon atoms and its specific examples are phenyl-($C_2$ to $C_{12}$)alkynyl group, $C_1$ to $C_{12}$ alkylphenyl-($C_2$ to $C_{12}$)alkynyl group, 1-naphthyl-($C_2$ to $C_{12}$)alkynyl group and 2-naphthyl-($C_2$ to $C_{12}$)alkynyl group.

Arylalkynyl group is preferred from the standpoints of solubility in organic solvents, easiness of synthesis, etc. and also from the balance between device property and heat resistance when the aromatic polymer of the present invention has been used in a polymer LED, and there are preferred phenyl-($C_2$ to $C_{12}$)alkynyl group and $C_1$ to $C_{12}$ alkylphenyl-($C_2$ to $C_{12}$)alkynyl group.

The formyl group which may be substituted, represented by the formulas R-4 to R-7 includes, for example, formyl group, substituted carbonyl group (each of them is formula R-4), carboxylic acid group, substituted oxycarbonyl group (each of them is formula R-5), thiocarboxylic acid group, substituted thiocarboxylic acid group (each of them is formula R-6), formamide group and substituted aminocarbonyl group (each of them is formula R-7).

The substituted carbonyl group represented by the formula R-4 includes formyl groups substituted with alkyl group, aryl group, aralkyl group or monovalent heterocyclic group, and has ordinarily about 2 to 60 carbon atoms, preferably 2 to 48 carbon atoms. As its specific examples, there can be mentioned acetyl group, propylcarbonyl group, n-butylcarbonyl group, isobutylcarbonyl group, t-butylcarbonyl group, benzoyl group, benzylcarbonyl group, 2-thiophenecarbonyl group and 3-thiophenecarbonyl group.

From the standpoints of solubility in organic solvents, easiness of synthesis, etc., there are preferred acetyl group, benzoyl group, benzylcarbonyl group, 2-thiophenecarbonyl group and 3-thiophenecarbonyl group.

The substituted oxycarbonyl group represented by the formula R-5 includes carboxylic acid groups substituted with alkyl group, aryl group, aralkyl group or monovalent heterocyclic group. It has ordinarily about 2 to 60 carbon atoms, preferably 2 to 48 carbon atoms. As its specific examples, there can be mentioned methoxycarbonyl group, ethoxycarbonyl group, propoxycarbonyl group, isopropoxycarbonyl group, n-butoxycarbonyl group, isobutoxycarbonyl group, t-butoxycarbonyl group, pentyloxycarbonyl group, hexyloxycarbonyl group, cyclohexyloxycarbonyl group, heptyloxycarbonyl group, octyloxycarbonyl group, 2-ethylhexyloxycarbonyl group, nonyloxycarbonyl group, decyloxycarbonyl group, 3,7-dimethyloctyloxycarbonyl group, dodecyloxycarbonyl group, phenoxycarbonyl group, naphthoxycarbonyl group and pyridyloxycarbonyl group.

There are preferred, from the standpoints of solubility in organic solvents, easiness of synthesis, etc., methoxycarbonyl group, ethoxycarbonyl group, octyloxycarbonyl group, phenoxycarbonyl group, naphthoxycarbonyl group and pyridyloxycarbonyl group.

The substituted thiocarboxylic acid group represented by the formula R-6 includes thiocarboxylic acid groups substituted with alkyl group, aryl group, aralkyl group or monovalent heterocyclic group. It has ordinarily about 2 to 60 carbon atoms, preferably 2 to 48 carbon atoms. As its specific examples, there can be mentioned methylthiocarboxylic acid group, ethylthiocarboxylic acid group, propylthiocarboxylic acid group, isopropylthiocarboxylic acid group, n-butylthiocarboxylic acid group, isobutylthiocarboxylic acid group, t-butylthiocarboxylic acid group, pentylthiocarboxylic acid group, hexylthiocarboxylic acid group, cyclohexylthiocarboxylic acid group, hepthylthiocarboxylic acid group, octylthiocarboxylic acid group, 2-ethylhexylthiocarboxylic acid group, nonylthiocarboxylic acid group, decylthiocarboxylic acid group, 3,7-dimethyloctylthiocarboxylic acid group, dodecylthiocarboxylic acid group, phenylthiocarboxylic acid group, naphthylthiocarboxylic acid group and pyridylthiocarboxylic acid group.

Preferred are methylthiocarboxylic acid group, ethylthiocarboxylic acid group and phenylthiocarboxylic acid group from the standpoints of solubility in organic solvents, easiness of synthesis, etc.

The substituted aminocarbonyl group represented by the formula R-7 includes aminocarbonyl groups substituted with one or two groups selected from alkyl group, aryl group, arylalkyl group and monovalent heterocyclic group, and has ordinarily about 1 to 60 carbon atoms, preferably 2 to 48 carbon atoms.

There can be specifically mentioned methylaminocarbonyl group, dimethylaminocarbonyl group, ethylaminocarbonyl group, diethylaminocarbonyl group, propylaminocarbonyl group, dipropylaminocarbonyl group, isopropylaminocarbonyl group, diisopropylaminocarbonyl group, n-butylaminocarbonyl group, isobutylaminocarbonyl group, t-butylaminocarbonyl group, pentylaminocarbonyl group, hexylaminocarbonyl group, cyclohexylaminocarbonyl group, heptylaminocarbonyl group, octylaminocarbonyl group, 2-ethylhexylaminocarbonyl group, nonylaminocarbonyl group, decylaminocarbonyl group, 3,7-dimethyloctylaminocarbonyl group, dodecylaminocarbonyl group, cyclopentylaminocarbonyl group, dicyclopentylaminocarbonyl group, cyclohexylaminocarbonyl group, dicyclohexylaminocarbonyl group, pyrrolidylcarbonyl group, piperidylcarbonyl group, phenylaminocarbonyl group, diphenylaminocarbonyl group, ($C_1$ to $C_{12}$ alkylphenyl)aminocarbonyl group, di($C_1$ to $C_{12}$ alkylphenyl)aminocarbonyl group, 1-naphthylaminocarbonyl group, 2-naphthylaminocarbonyl group, pyridylaminocarbonyl group, pyridazinylamino group, pyrimidylaminocarbonyl group, pyrazylaminocarbonyl group, triazylaminocarbonyl group, phenyl-($C_1$ to $C_{12}$)alkylaminocarbonyl group, $C_1$ to $C_{12}$ alkylphenyl-($C_1$ to $C_{12}$)alkylaminocarbonyl group, di($C_1$ to $C_{12}$ alkylphenyl-($C_1$ to $C_{12}$)alkyl)aminocarbonyl group, 1-naphthyl-($C_1$ to $C_{12}$)alkylaminocarbonyl group and 2-naphthyl-($C_1$ to $C_{12}$)alkylaminocarbonyl group.

There are preferred, from the standpoints of solubility in organic solvents, easiness of synthesis, etc., methylaminocarbonyl group, dimethylaminocarbonyl group, ethylaminocarbonyl group, diethylaminocarbonyl group, t-butylaminocarbonyl group, piperidylcarbonyl group, phenylaminocarbonyl group, diphenylaminocarbonyl group, ($C_1$ to $C_{12}$ alkylphenyl) aminocarbonyl group and di($C_1$ to $C_{12}$ alkylphenyl)aminocarbonyl group. More preferred are dimethylaminocarbonyl group, diethylaminocarbonyl group, diphenylaminocarbonyl group and di($C_1$ to $C_{12}$ alkylphenyl) aminocarbonyl group.

As the above-mentioned formyl group which may be substituted, there are preferred, from the standpoint of easiness of synthesis, formyl group, substituted carbonyl group, carboxylic acid group, substituted oxycarbonyl group, formamide group and substituted aminocarbonyl group; and there are preferred, from the standpoint of solubility in organic solvents, substituted carbonyl group, substituted oxycarbonyl group and substituted aminocarbonyl group.

The thioformyl group which may be substituted, represented by the formulas R-8 to R-11 includes, for example, thioformyl group, substituted thiocarbonyl group (each of them is formula R-8), substituted oxythiocarbonyl group (formula R-9), dithiocarboxylic acid group, substituted dithiocarboxylic acid group (each of them is formula R-10), aminothiocarbonyl group and substituted aminothiocarbonyl group (each of them is formula R-11).

The substituted thiocarbonyl group represented by the formula R-8 includes thioformyl groups substituted with alkyl group, aryl group, aralkyl group or monovalent heterocyclic group, and has ordinarily about 2 to 60 carbon atoms, preferably 2 to 48 carbon atoms. As specific examples thereof, there can be mentioned methylthiocarbonyl group, ethylthiocarbonyl group and phenylthiocarbonyl group.

The substituted oxythiocarbonyl group represented by the formula R-9 includes hydroxythiocarbonyl groups substituted with alkyl group, aryl group, aralkyl group or monovalent heterocyclic group, and has ordinarily about 2 to 60 carbon atoms, preferably 2 to 48 carbon atoms. As specific examples thereof, there can be mentioned methoxythiocarbonyl group, ethoxythiocarbonyl group and phenoxythiocarbonyl group.

The substituted dithiocarboxylic acid group represented by the formula R-10 includes dithiocarboxylic acid groups substituted with alkyl group, aryl group, aralkyl group or monovalent heterocyclic group, and has ordinarily about 2 to 60 carbon atoms, preferably 2 to 48 carbon atoms. As specific examples thereof, there can be mentioned methyldithiocarboxylic acid group, ethyldithiocarboxylic acid group and phenyldithiocarboxylic acid group.

The substituted aminothiocarbonyl group represented by the formula R-11 includes aminocarbonyl groups substituted with alkyl group, aryl group, aralkyl group or monovalent heterocyclic group, and has ordinarily about 2 to 60 carbon atoms, preferably 2 to 48 carbon atoms. As specific examples thereof, there can be mentioned dimethylaminothiocarbonyl group, diethylaminothiocarbonyl group, phenylaminothiocarbonyl group and diphenylaminothiocarbonyl group.

As the above-mentioned thioformyl group which may be substituted, there are preferred, from the standpoint of easiness of synthesis, thioformyl group, substituted thiocarbonyl group, substituted oxythiocarbonyl group, aminothiocarbonyl group and substituted aminothiocarbonyl group. Preferred from the standpoint of solubility in organic solvents are substituted thiocarbonyl group, substituted oxythiocarbonyl group and substituted aminothiocarbonyl group.

The imine residue which may be substituted, represented by the formulas R-12 to R-15 and R-28 includes residues formed by removing one hydrogen atom from an imine compound (this is an organic compound having —N=C— in the molecule and examples thereof are aldimine, ketimine and compounds formed by replacing the hydrogen atom(s) on the nitrogen of aldimine or ketimine, with alkyl group or the like). The imine residue has ordinarily about 2 to 20 carbon atoms, preferably 2 to 18 carbon atoms. Specific examples thereof include groups shown by the following structural formulas.

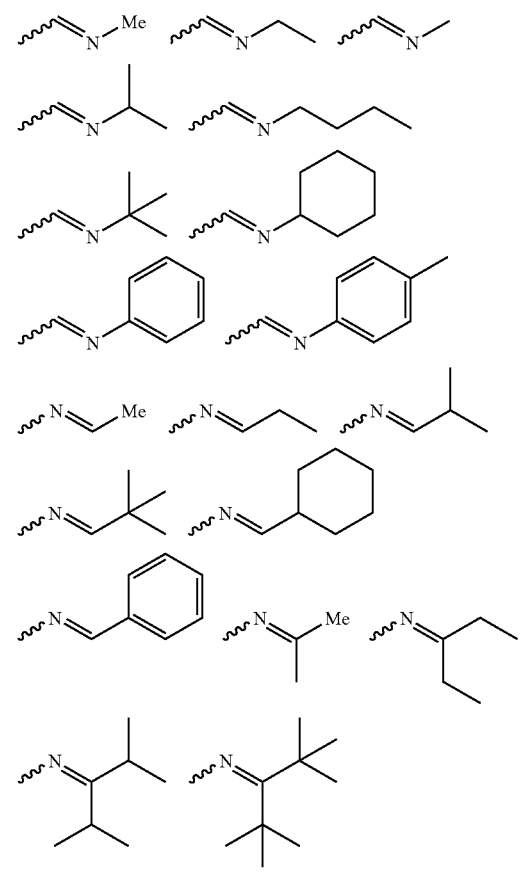

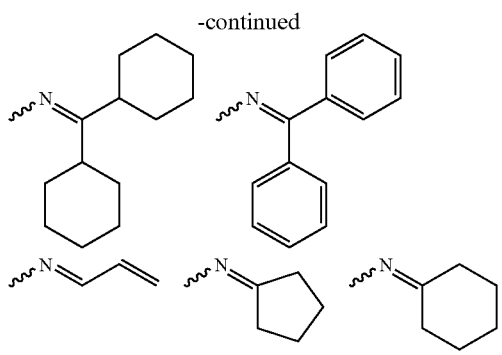

As the hydroxy group which may be substituted, represented by the formulas R-16 to R-19, there can be mentioned, for example, hydroxy group, alkoxy group, aryloxy group, aralkyloxy group (each of them is formula R-16) and substituted carbonyloxy group (formula R-17).

The alkoxy group represented by the formula R-16 may be any of straight chain, branched chain and cyclic chain, and has ordinarily about 1 to 20 carbon atoms, preferably 3 to 20 carbon atoms. As specific examples thereof, there can be mentioned methoxy group, ethoxy group, propyloxy group, isopropyloxy group, n-butoxy group, isobutoxy group, t-butoxy group, pentyloxy group, hexyloxy group, cyclohexyloxy group, hepthyloxy group, octyloxy group, 2-ethylhexyloxy group, nonyloxy group, decyloxy group, 3,7-dimethyloctyloxy group and dodecyloxy group.

From the standpoints of solubility in organic solvents, easiness of synthesis, etc and also from the balance between device property and heat resistance when the aromatic polymer of the present invention has been used in a polymer LED, there are preferred pentyloxy group, hexyloxy group, octyloxy group, 2-ethylhexyloxy group, decyloxy group and 3,7-dimethyloctyloxy group.

The aryloxy group represented by the formula R-16 has ordinarily about 6 to 60 carbon atoms, preferably 7 to 48 carbon atoms. Specific examples thereof are phenoxy group, $C_1$ to $C_{12}$ alkylphenoxy group, 1-naphthyloxy group and 2-naphthyloxy group.

$C_1$ to $C_{12}$ alkylphenoxy group is preferred from the standpoints of solubility in organic solvents, easiness of synthesis, etc and also from the balance between device property and heat resistance when the aromatic polymer of the present invention has been used in a polymer LED.

As specific examples of the $C_1$ to $C_{12}$ alkylphenoxy group, there can be mentioned methylphenoxy group, ethylphenoxy group, dimethylphenoxy group, propylphenoxy group, 1,3,5-trimethylphenoxy group, methylethylphenoxy group, isopropylphenoxy group, n-butylphenoxy group, isobutylphenoxy group, t-butylphenoxy group, pentylphenoxy group, isopentylphenoxy group, hexylphenoxy group, heptylphenoxy group, octylphenoxy group, nonylphenoxy group, decylphenoxy group and dodecylphenoxy group.

The aralkyloxy group represented by the formula R-16 has ordinarily about 7 to 60 carbon atoms, preferably 7 to 48 carbon atoms. As specific examples thereof, there can be mentioned phenyl-($C_1$ to $C_{12}$)alkoxy groups (e.g. phenylmethoxy group, phenylethoxy group, phenyl-n-butoxy group, phenylpentyloxy group, phenylhexyloxy group, phenylheptyloxy group and phenyloctyloxy group), $C_1$ to $C_{12}$ alkylphenyl-($C_1$ to $C_{12}$)alkoxy group, 1-naphthyl-($C_1$ to $C_{12}$) alkoxy group and 2-naphthyl-($C_1$ to $C_{12}$)alkoxy group.

$C_1$ to $C_{12}$ alkylphenyl-($C_1$ to $C_{12}$)alkoxy group is preferred from the standpoints of solubility in organic solvents, easiness of synthesis, etc and also from the balance between device property and heat resistance when the aromatic polymer of the present invention has been used in a polymer LED.

The substituted carbonyloxy group represented by the formula R-17 includes carbonyloxy groups substituted with alkyl group, aryl group, aralkyl group or monovalent heterocyclic group, and has ordinarily about 2 to 60 carbon atoms, preferably 2 to 48 carbon atoms. As specific examples thereof, there can be mentioned acetyloxy group, propylcarbonyloxy group, n-butylcarbonyloxy group, isobutylcarbonyloxy group, t-butylcarbonyloxy group, benzoyloxy group, benzylcarbonyloxy group, 2-thiophenecarbonyloxy group and 3-thiophenecarbonyloxy group.

As the above-mentioned hydroxy group which may be substituted, there are preferred, from the standpoint of easiness of synthesis, hydroxy group, alkoxy group, aryloxy group and aralkyloxy group; and there are preferred, from the solubility in organic solvents or from the balance between device property and heat resistance when the aromatic polymer of the present invention has been used in a polymer LED, alkoxy group, aryloxy group and aralkyloxy group.

The mercapto group which may be substituted, represented by the formulas R-20 to R-23 includes, for example, mercapto group, alkylthio group, arylthio group, aralkylthio group (each of them is formula R-20), and substituted carbonylthio group (formula R-21).

The alkylthio group represented by the formula R-20 may be any of straight chain, branched chain and cyclic chain, and has about 1 to 20 carbon atoms, preferably 3 to 20 carbon atoms. As specific examples thereof, there can be mentioned methylthio group, ethylthio group, propylthio group, isopropylthio group, n-butylthio group, isobutylthio group, t-butylthio group, pentylthio group, hexylthio group, cyclohexylthio group, heptylthio group, octylthio group, 2-ethylhexylthio group, nonylthio group, decylthio group, 3,7-dimethyloctylthio group and dodecylthio group.

From the standpoints of solubility in organic solvents, easiness of synthesis, etc. and also from the balance between device property and heat resistance when the present aromatic polymer has been used in a polymer LED, there are preferred pentylthio group, hexylthio group, octylthio group, 2-ethylhexylthio group, decylthio group and 3,7-dimethyloctylthio group.

The arylthio group represented by the formula R-20 has ordinarily about 3 to 60 carbon atoms. Specific examples thereof include, for example, phenylthio group, $C_1$ to $C_{12}$ alkylphenylthio group, 1-naphthylthio group and 2-naphthylthio group.

$C_1$ to $C_{12}$ alkylphenylthio group is preferred from the standpoints of solubility in organic solvents, easiness of synthesis, etc. and also from the balance between device property and heat resistance when the present aromatic polymer has been used in a polymer LED.

The arylalkylthio group represented by the formula R-20 has ordinarily about 7 to 60 carbon atoms, preferably 7 to 48 carbon atoms. Specific examples thereof include, for example, phenyl-($C_1$ to $C_{12}$)alkylthio group, $C_1$ to $C_{12}$ alkylphenyl-($C_1$ to $C_{12}$)alkylthio group, 1-naphthyl-($C_1$ to $C_{12}$) alkylthio group and 2-naphthyl-($C_1$ to $C_{12}$)alkylthio group.

$C_1$ to $C_{12}$ alkylphenyl-($C_1$ to $C_{12}$)alkylthio group is preferred from the standpoints of solubility in organic solvents, easiness of synthesis, etc. and also from the balance between device property and heat resistance when the present aromatic polymer has been used in a polymer LED.

As the substituted carbonylthio group represented by the formula R-21, there can be mentioned carbonylthio groups substituted with alkyl group, aryl group, aralkyl group or monovalent heterocyclic group. It has ordinarily about 2 to 60 carbon atoms, preferably 2 to 48 carbon atoms. Specific examples thereof are acetylthio group, propylcarbonylthio group, n-butylcarbonylthio group, isobutylcarbonylthio group, t-butylthio group, benzoylthio group and benzylcarbonylthio group.

As the above-mentioned mercapto group which may be substituted, there are preferred mercapto group, alkylthio group, arylthio group and aralkyl thio group, from the standpoint of easiness of synthesis; and there are preferred alkylthio group, arylthio group and aralkylthio group, from the solubility in organic solvents or from the balance between device property and heat resistance when the present aromatic polymer has been used in a polymer LED.

As the amino group which may be substituted, represented by the formulas R-24 to R-27 and R-29, there can be mentioned, for example, amino group, substituted amino group (each of them is formula R-24), amide group (formula R-25) and acid imide group (formula R-29).

As the substituted amino group represented by the formula R-24, there can be mentioned amino groups substituted with one or two groups selected from alkyl group, aryl group, arylalkyl group and monovalent heterocyclic group. It has ordinarily about 1 to 60 carbon atoms, preferably 2 to 48 carbon atoms.

Specific examples thereof are methylamino group, dimethylamino group, ethylamino group, diethylamino group, propylamino group, dipropylamino group, isopropylamino group, diisopropylamino group, n-butylamino group, isobutylamino group, t-butylamino group, pentylamino group, hexylamino group, cyclcohexylamino group, heptylamino group, octylamino group, 2-ethylhexylamino group, nonylamino group, decylamino group, 3,7-dioctylamino group, dodecyamino group, cyclopentylamino group, dicyclopentylamino group, cyclohexylamino group, dicyclohexylamino group, pyrrolidyl group, piperidyl group, diphenylamino group, ($C_1$ to $C_{12}$ alkylphenyl)amino group, di($C_1$ to $C_{12}$ alkylphenyl)amino group, 1-naphtylamino group, 2-naphthylamino group, pyridylamino group, pyridazinylamino group, pyrimidylamino group, pyrazylamino group, triazylamino group, phenyl-($C_1$ to $C_{12}$)alkylamino group, $C_1$ to $C_{12}$ alkylphenyl-($C_1$ to $C_{12}$)alkylamino group, di($C_1$ to $C_{12}$ alkylphenyl-($C_1$ to $C_{12}$)alkyl)amino group, 1-naphthyl-($C_1$ to $C_{12}$) alkylamino group and 2-naphthyl-($C_1$ to $C_{12}$)alkylamino group.

There are preferred, from the standpoints of solubility in organic solvents, easiness of synthesis, etc., methylamino group, dimethylamino group, ethylamino group, diethylamino group, t-butylamino group, piperidyl group, phenylamino group, diphenylamino group, $C_1$-$C_{12}$ alkylphenylamino group and di($C_1$-$C_{12}$ alkylphenyl)amino group.

There are preferred diphenylamino group and di($C_1$-$C_{12}$ alkylphenyl)amino group from the solubility in organic solvents, the easiness of synthesis and the balance between device property and heat resistance when the present aromatic polymer has been used in a polymer LED.

As the amide group represented by the formula R-25, there can be mentioned amide groups substituted with one or two groups selected from alkyl group, aryl group, arylalkyl group and monovalent heterocyclic group. It has ordinarily about 1 to 60 carbon atoms, preferably 2 to 48 carbon atoms. Specific examples thereof are formamide group, acetamide group, propionamide group, butyramide group, benzamide group, trifluoroacetamide group, pentafluorobenzamide group, N-methylformamide group, N-phenylacetamide group and N-phenylbenzamide group.

There are preferred formamide group, acetamide group, N-methylformamide group, N-phenylacetamide group and N-phenylbenzamide group from the standpoints of solubility in organic solvents, easiness of synthesis, etc.

As the acid amide group represented by the formula R-29, there can be mentioned resides obtained by removing, from an acid imide (e.g. succinimide, phthalimide or pyromellitic imide), a hydrogen atom bonding to the nitrogen atom. It has about 4 to 20 carbon atoms. The following groups can be shown as preferable groups.

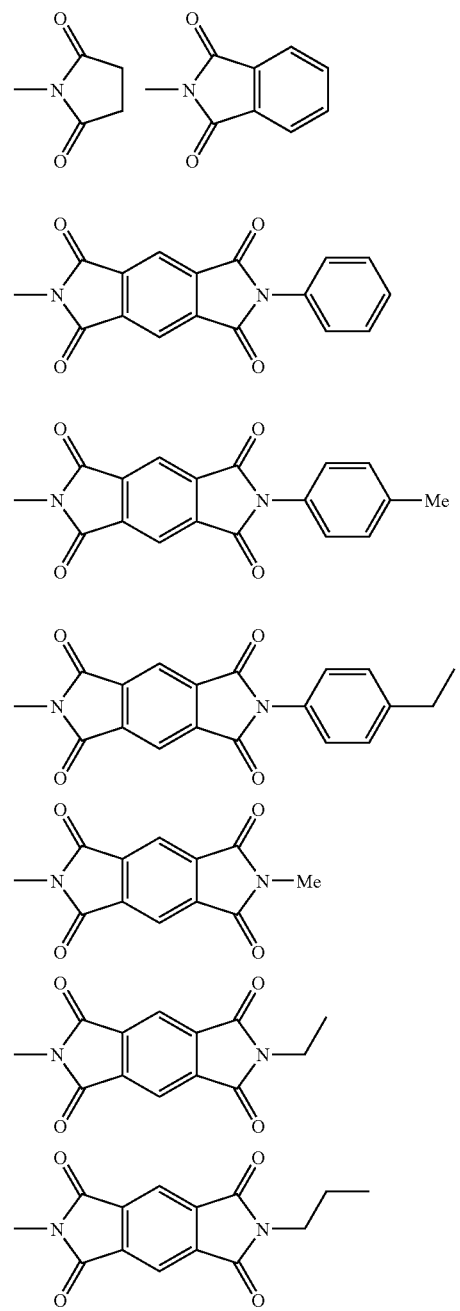

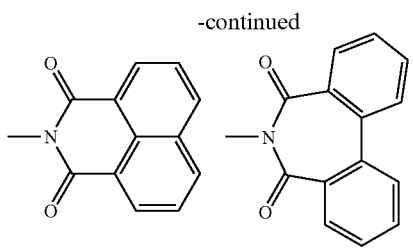

As the above-mentioned amino group which may be substituted, there are preferred amino group, substituted amino group, amide group and acid imide group from the standpoint of easiness of synthesis; and there are preferred substituted amino group and acid imide group from the solubility in organic solvents and also from the balance between device property and heat resistance when the present aromatic polymer has been used in a polymer LED.

As the halogen atom, there can be mentioned, for example, fluorine atom, chlorine atom, bromine atom and iodine atom.

Fluorine atom is preferred from the standpoint of the stability of the present aromatic polymer.

As the substituted sulfonyl group represented by the formula R-34, there can be mentioned sulfonyl groups substituted with alkyl group, aryl group, aralkyl group or monovalent heterocyclic group. It has ordinarily about 2 to 60 carbon atoms, preferably 2 to 48 carbon atoms. Specific examples thereof are $C_1$ to $C_{12}$ alkylsulfonyl group, benzenesulfonyl group, $C_1$ to $C_{12}$ alkoxyphenylsulfonyl group, $C_1$ to $C_{12}$ alkylphenylsulfonyl group, 1-naphthylsulfonyl group, 2-naphthylsulfonyl group, phenyl-($C_1$ to $C_{12}$)alkylsulfonyl group, $C_1$ to $C_{12}$ alkylphenyl-($C_1$ to $C_{12}$)alkylsulfonyl group, 1-naphthyl-($C_1$ to $C_{12}$)alkylsulfonyl group and 2-naphthyl-($C_1$ to $C_{12}$)alkylsulfonyl group.

From the standpoints of heat resistance and solubility in organic solvents, there are preferred benzenesulfonyl group, $C_1$ to $C_{12}$ alkylphenylsulfonyl group, 1-naphthylsulfonyl group, 2-naphthylsulfonyl group and phenyl-($C_1$ to $C_{12}$) alkylsulfonyl group; and from the standpoint of heat resistance, there are preferred benzenesulfonyl group, 1-naphthylsulfonyl group and 2-naphthylsulfonyl group.

As the silyl group which may be substituted, represented by the formula R-35, there can be mentioned silyl groups substituted with one, two or three groups selected from alkyl group, aryl group, arylalkyl group and monovalent heterocyclic group. The substituted silyl groups have ordinarily about 1 to 60 carbon atoms, preferably 3 to 48 carbon atoms.

There can be specifically mentioned trimethylsilyl group, triethylsilyl group, tripropylsilyl group, triisopropylsilyl group, dimethylisopropylsilyl group, diethylisopropylsilyl group, t-butylsilyldimethylsilyl group, pentyldimethylsilyl group, hexyldimethylsilyl group, heptyldimethylsilyl group, octyldimethylsilyl group, 2-ethylhexyl-dimethylsilyl group, nonyldimethylsilyl group, decyldimethylsilyl group, 3,7-dimethyloctyl-dimethylsilyl group, dodecyldimethylsilyl group, phenyl-($C_1$ to $C_{12}$)alkylsilyl group, $C_1$ to $C_{12}$ alkylphenyl-($C_1$ to $C_{12}$)alkylsilyl group, 1-naphthyl-($C_1$ to $C_{12}$)alkylsilyl group, 2-naphthyl-($C_1$ to $C_{12}$)alkylsilyl group, phenyl-($C_1$ to $C_{12}$)alkyldimethylsilyl group, triphenylsilyl group, tri-p-methylphenylsilyl group, tribenzylsilyl group, diphenylmethylsilyl group, t-butyldiphenylsilyl group and dimethylphenylsilyl group.

As the silanol group which may be substituted, represented by the formula R-36, there can be mentioned silanol groups substituted with one, two or three groups selected from alkyl group, aryl group, arylalkyl group and monovalent heterocyclic group. The substituted silanol groups have ordinarily about 1 to 60 carbon atoms, preferably 3 to 48 carbon atoms. Specific examples thereof are trimethoxysilyl group, triethoxysilyl group and triphenoxysilyl group.

In the aromatic polymer of the present invention, the substituent represented by R or Ra is preferred, from the standpoint of higher solubility in organic solvents, to be alkyl group, aryl group, aralkyl group, monovalent heterocyclic group, alkenyl group which may be substituted, alkynyl group which may be substituted, substituted carbonyl group, substituted oxycarbonyl group, substituted oxythiocarbonyl group, substituted aminocarbonyl group, substituted aminothiocarbonyl group, imine group which may be substituted, alkoxy group, aryloxy group, aralkyloxy group, substituted carbonyloxy group, alkylthio group, arylthio group, aralkylthio group, substituted carbonylthio group, substituted amino group, amide group, acid imide group, substituted sulfonyl group and silyl group which may be substituted; is more preferred to be alkyl group, aryl group, aralkyl group, monovalent heterocyclic group, alkoxy group, aryloxy group, aralkyloxy group, alkylthio group, arylthio group and aralkylthio group; and is further preferred to be alkyl group, alkoxy group and alkylthio group.

From the standpoint of higher heat resistance and higher chemical stability, the substituent represented by R or Ra is preferred to be alkyl group, aryl group, aralkyl group, monovalent heterocyclic group, substituted carbonyl group, substituted aminocarbonyl group, alkoxy group, aryloxy group, aralkyloxy group, alkylthio group, arylthio group, aralkylthio group, substituted amino group, amide group, acid imide group, halogen atom and substituted sulfonyl group; is more preferred to be alkyl group, aryl group, aralkyl group, substituted aminocarbonyl group, alkoxy group, aryloxy group, aralkyloxy group, alkylthio group, arylthio group, aralkylthio group, substituted amino group, amide group, acid imide group and fluorine atom; and is further preferred to be alkyl group, aryl group and aralkyl group.

From the balance between the standpoints such as solubility in organic solvents, device property, easiness of synthesis and the like and the heat resistance when the aromatic polymer of the present invention has been used in a polymer LED, the substituent represented by R or Ra is preferred to be alkyl group, aryl group, aralkyl group, monovalent heterocyclic group, alkenyl group which may be substituted, alkynyl group which may be substituted, imine residue which may be substituted, alkoxy group, aryloxy group, aralkyloxy group, alkylthio group, arylthio group, aralkylthio group, substituted amino group, acid imide group, halogen atom, silyl group which may be substituted and cyano group; and is more preferred to be alkyl group, aryl group, aralkyl group, monovalent heterocyclic group, imine residue which may be substituted, alkoxy group, aryloxy group, aralkyloxy group, alkylthio group, arylthio group, aralkylthio group, acid imide group, fluorine atom and cyano group; is further preferred to be alkyl group, aryl group, monovalent heterocyclic group, imine residue which may be substituted, alkoxy group, aryloxy group, alkylthio group, arylthio group, acid imide group, fluorine atom and cyano group.

When the present aromatic polymer is used as a polymer electrolyte (e.g. proton-conductive membrane for fuel cell), the substituent represented by R or Ra is preferred, from the balance of standpoints of easiness of synthesis, solubility in organic solvents, heat resistance and higher ion exchange capacity, to be alkyl group, aryl group, substituted carbonyl group, carboxylic acid group, substituted aminocarbonyl group, hydroxy group, alkoxy group, aryloxy group, amide group, acid imide group, halogen atom, substituted sulfonyl group, sulfonic acid group and phosphonic acid group; and is more preferred to be alkyl group, substituted carbonyl group, fluorine atom, substituted sulfonyl group, sulfonic acid group and phosphonic acid group.

The substituent represented by R' or R" may have its hydrogen atom(s) replaced by halogen atom such as Cl, Br, I or the like. The halogen atom is preferably fluorine atom. As specific examples, there can be mentioned fluorine atom-substituted alkyl groups such as trifluoromethyl group, pentafluoroethyl group, perfluorobutyl group, perfluorohexyl group, perfluorooctyl group and the like; fluorine atom-substituted aryl groups such as pentafluorophenyl group and the like; fluorine atom-substituted carbonyl groups such as trifluoroacetyl group, pentafluorobenzoyl group and the like; fluorine atom-substituted oxycarbonyl groups such as trifluoromethoxycarbonyl group, pentafluoroethoxycarbonyl group, perfluorobutoxycarbonyl group, perfluorohexyloxycarbonyl group, perfluorooctyloxycarbonyl group and the like; fluorine atom-substituted thiocarboxylic acid-groups such as trifluoromethylthiocarboxylic acid group, pentafluoroethylthiocarboxylic acid group, perfluorobutylthiocarboxylic acid group, perfluorohexylthiocarboxylic acid group, perfluorooctylthiocarboxylic acid group and the like; fluorine atom-substituted aminocarbonyl groups such as ditrifluoromethylaminocarbonyl group, pentafluorophenylaminocarbonyl group and the like; fluorine atom-substituted alkoxy groups such as trifluoromethoxy group, petafluoroethoxy group, perfluorobutoxy group, perfluorohexyl group, perfluorooctyl group and the like; fluorine atom-substituted carbonyloxy groups such as trifluoroacetyloxy group, pentafluorobenzoyloxy group and the like; fluorine atom-substituted mercapto groups such as trifluoromethylthio group and the like; fluorine atom-substituted carbonylthio groups such as trifluoroacetylthio group, pentafluorobenzoylthio group and the like; fluorine atom-substituted amino groups such as ditrifluoromethylamino group and the like; and fluorine atom-substituted sulfonyl groups such as pentafluorophenylsulfonyl group and the like.

When the substituent represented by R' or R" contains an aryl group or a monovalent heterocyclic group, the hydrogen atom on the aryl group or the monovalent heterocyclic group may be replaced by alkenyl group which may be substituted with alkyl group, alkynyl group which may be substituted with alkyl group, formyl group which may be substituted with alkyl group, thioformyl group which may be substituted with alkyl group, imine residue which may be substituted with alkyl group, hydroxy group which may be substituted with alkyl group, mercapto group which may be substituted with alkyl group, amino group which may be substituted with alkyl group, halogen atom, sulfonyl group which may be substituted with alkyl group, silyl group which may be substituted with alkyl group, silanol group which may be substituted with alkyl group, sulfonic acid group, phosphonic acid group, cyano group and nitro group. Of these, preferred are alkenyl group which may be substituted with alkyl group, alkynyl group which may be substituted with alkyl group, formyl group which may be substituted with alkyl group, imine residue which may be substituted with alkyl group, hydroxy group which may be substituted with alkyl group, mercapto group which may be substituted with alkyl group, amino group which may be substituted with alkyl group, halogen atom, sulfonic acid group, phosphonic acid group, cyano group and nitro group; more preferred are formyl group which may be substituted with alkyl group, imine residue which may be substituted with alkyl group, hydroxy group which may be substituted with alkyl group, mercapto group which may be substituted with alkyl group, amino group which may be substituted with alkyl group, halogen atom, sulfonic acid group, phosphonic acid group, cyano group and nitro group; and further preferred are alkoxy group and alkylthio group. Specific examples thereof are groups having $C_1$ to $C_{12}$ alkoxy substituents, such as $C_1$ to $C_{12}$ alkoxyphenyl group, $C_1$ to $C_{12}$ alkoxyphenyl-($C_1$ to $C_{12}$)alkyl group, $C_1$ to $C_{12}$ alkoxyphenyl-($C_2$ to $C_{12}$)alkenyl group, $C_1$ to $C_{12}$ alkoxyphenyl-($C_2$ to $C_{12}$)alkynyl group, $C_1$ to $C_{12}$ alkoxyphenylaminocarbonyl group, di($C_1$ to $C_{12}$ alkoxyphenyl)aminocarbonyl group, $C_1$ to $C_{12}$ alkoxyphenyl-($C_1$ to $C_{12}$)alkylaminocarbonyl group, di($C_1$ to $C_{12}$ alkoxyphenyl-($C_1$ to $C_{12}$)alkyl)aminocarbonyl group, $C_1$ to $C_{12}$ alkoxyphenoxy group, $C_1$ to $C_{12}$ alkoxyphenyl-($C_1$ to $C_{12}$)alkoxy group, $C_1$ to $C_{12}$ alkoxyphenylthio group, $C_1$ to $C_{12}$ alkoxyphenyl-($C_1$ to $C_{12}$)alkylthio group, $C_1$ to $C_{12}$ alkoxyphenylamino group, di($C_1$ to $C_{12}$ alkoxyphenyl)amino group, $C_1$ to $C_{12}$ alkoxyphenyl-($C_1$ to $C_{12}$)alkylamino group, di($C_1$ to $C_{12}$ alkoxyphenyl-($C_1$ to $C_{12}$)alkyl)amino group, $C_1$ to $C_{12}$ alkoxyphenyl-($C_1$ to $C_{12}$)alkylsilyl group and the like. Specific examples of the $C_1$ to $C_{12}$ alkoxy are methoxy, ethoxy, propyloxy, isopropyloxy, n-butoxy, isobutoxy, s-butoxy, t-butoxy, pentyloxy, hexyloxy, cyclohexyloxy, heptyloxy, octyloxy, 2-ethylhexyloxy, nonyloxy, decyloxy, 3,7-dimethyloctyloxy and dodecyloxy.

When the substituent represented by R' or R" contains alkylene chain, any —CH$_2$— group in the alkylene chain may be replaced by divalent hetero atom such as oxygen, sulfur, nitrogen or the like, hetero atom-containing divalent group, or divalent group formed by combination of at least two of them. Examples of the divalent hetero atom and the hetero atom-containing divalent group are the following groups represented by formulas X-1 to X-6.

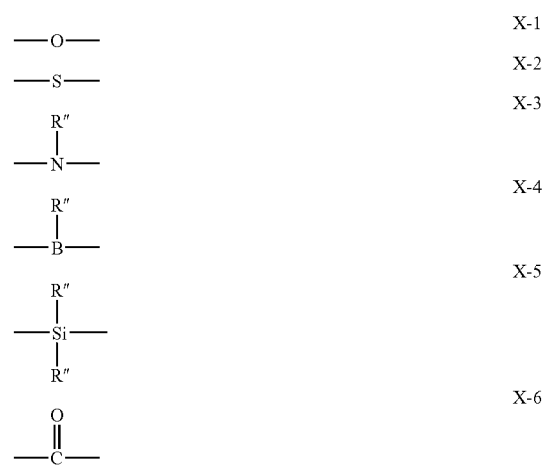

Here, R" has the same definition as given above.

Examples of the divalent group formed by combination of at least two of the divalent hetero atom and the hetero atom-containing divalent group are the following groups represented by formulas X-7 to X-10.

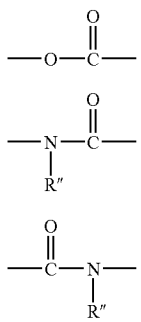

X-8

X-9

X-10

Of the groups represented by the formulas X-1 to X-10, preferred are groups represented by the formulas X-1, X-2, X-3, X-5 and X-6; more preferred are groups represented by the formulas X-1 and X-2; and further preferred is a group represented by the formula X-1. Specific examples thereof are methoxymethyloxy group and 2-methoxyethyloxy group.

In the previously-shown formula (2), $E^1$ represents a hydrogen atom, a halogen atom, or a monovalent organic group. Examples of the halogen atom represented by $E^1$ are fluorine atom, chlorine atom, bromine atom and iodine atom. The halogen atom represented by $E^1$ is preferably fluorine atom from the standpoint of chemical stability.

Examples of the monovalent organic group represented by $E^1$ are alkyl group (preferably $C_1$ to $C_{12}$ alkyl group), alkoxy group (preferably $C_1$ to $C_{12}$ alkoxy group), and alkylthio group (preferably $C_1$ to $C_{12}$ alkylthio group). Their definitions and specific examples are the same as those of the alkyl group, alkoxy group and alkylthio group in the substituent of $Ar^1$.

Preferred as the group represented by $E^1$ are hydrogen atom, fluorine atom, alkyl group (preferably $C_1$ to $C_{12}$ alkyl group) and alkoxy group (preferably $C_1$ to $C_{12}$ alkoxy group); and more preferred are hydrogen atom and alkyl group (preferably $C_1$ to $C_{12}$ alkyl group).

In the formula (2), $Ar^2$ represents a group having a divalent, π-conjugated cyclic compound residue. As the group having a divalent, π-conjugated cyclic compound residue, represented by $Ar^2$, there can be mentioned a divalent, π-conjugated cyclic compound residue and a divalent residue of a metal complex compound having coordinated an organic ligand of π-conjugated cyclic compound structure. Here, the π-conjugated cyclic compound includes an aromatic hydrocarbon compound, an aromatic heterocyclic compound and a compound fused with a ring having a structure π-conjugated with the aromatic hydrocarbon compound or the aromatic heterocyclic compound. The π-conjugated cyclic compound may have a fused ring structure. The divalent, π-conjugated cyclic compound residue is an atomic group formed by removing, from a π-conjugated cyclic compound, two of the hydrogen atoms bonding to the carbon atoms having a sp² hybrid orbital, present in the ring of the π-conjugated cyclic compound, and may have a fused ring structure. The divalent, n-conjugated cyclic compound residue may have a substituent.

As the divalent, π-conjugated cyclic compound residue represented by $Ar^2$, there can be mentioned arylene group and divalent heterocyclic group, and a group having a fused ring is included.

The arylene group is an atomic group formed by removing, from an aromatic hydrocarbon, two of the hydrogen atoms bonding to the carbon atoms having a sp² hybrid orbital, present in the ring of the aromatic hydrocarbon. The arylene group includes one having a fused ring. The arylene group may have a substituent. In the arylene group, the number of the carbon atoms of the moiety excluding the substituent is ordinarily about 6 to 60, preferably 6 to 20. The number of the total carbon atoms of the arylene group including the substituent is ordinarily about 6 to 100. As examples of the arylene group, there can be shown groups represented by the following formula 1A-1 and the previously shown formulas 1A-2 to 1A-14.

1A-1

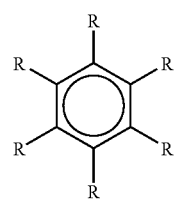

In the above-shown formula 1A-1 and the previously shown formulas 1A-2 to 1A-14, represented by $Ar^2$, R represents a bond, a hydrogen atom or a substituent. Any two of a plurality of R's represent a bond. When there exist a plurality of substituents represented by R, they may be the same or different from each other. Ra represents a hydrogen atom or a substituent. When there exist a plurality of substituents represented by Ra's, they may be the same or different from each other. When two Ra's exist on one atom, they may together form an oxo group or a thioxo group, or may be bonded to each other to form a ring.

Also, the substituent represented by R, when existing on two adjacent atoms, may form a 5- to 7-membered aliphatic ring which may contain a hetero atom such as oxygen atom, sulfur atom, nitrogen atom or the like, or a 5- to 7-membered aromatic ring of carbon atom.

As the arylene group represented by $Ar^2$, there are preferred, of the formulas 1A-2 to 1A-14, phenylene group (1A-1), naphthalene-diyl group (formula 1A-2), anthracene-diyl group (1A-3), fluorene-diyl group (formula 1A-13) and benzofluorene-diyl group (1A-14), from the standpoint of easiness of synthesis. Particularly preferred are phenylene group (1A-1), naphthalene-diyl group (formula 1A-2) and fluorene-diyl group (formula 1A-13).

For the higher device properties in charge transfer, fluorescent intensity, light emission efficiency, etc when the aromatic polymer of the present invention has been used in a polymer LED, there are preferred, as the arylene group represented by $Ar^2$, the following groups selected from the formulas 1A-2 to 1A-14, that is, phenylene group (1A-1), dihydrophenathrene-diyl group (formula 1A-10), fluorene-diyl group (formula 1A-13) and benzofluorene-diyl group (formula 1A-14). Particularly preferred are phenylene group (1A-1), fluorene-diyl group (formula 1A-13) and benzofluorene-diyl group (formula 1A-14).

The definition and specific examples of the divalent heterocyclic group represented by $Ar^2$ are the same as those of the divalent heterocyclic group represented by $Ar^1$, having no side chain represented by the formula (2).

The divalent heterocyclic group represented by $Ar^2$ includes also groups represented by the following formulas 3A-1 to 3A-4.

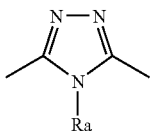

3A-1

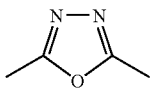

3A-2

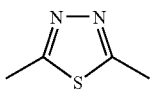

3A-3

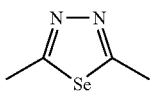

3A-4

In the above formulas, Ra has the same definition as given above.

For higher device properties in charge transfer property, fluorescent intensity, light emission efficiency, etc. when the aromatic polymer of the present invention has been used in a polymer LED, there are preferred the following groups selected from the above formulas 2A-1 to 2A-53 and 3A-1 to 3A-4, that is, pyridine-diyl group (formula 2A-1), quinoline-diyl group (formula 2A-6), isoquinoline-diyl group (formula 2A-7), quinoxaline-diyl group (formula 2A-8), phenanthroline-diyl group (2A-18), thiophene-diyl group (formula 2A-22), imidazole-diyl group (formula 2A-24), oxazole-diyl group (formula 2A-26), thiazole-diyl group (2A-27), 5-membered heterocyclic group containing a hetero atom(s) (e.g. nitrogen, sulfur, oxygen), to which benzene ring has fused, (formulas 2A-30 to 2A-32, 2A-34 to 2A-40, 3A-1 to 3A-3), and heterocyclic group similar to fluorene skeleton, containing a hetero atom (silicon, nitrogen, oxygen or sulfur), (formulas 2A-41 to 2A-44, 2A-46 to 2A-47), (formulas 2A-48 to 2A-53). More preferred are thiophene-diyl group (formula 2A-22), thiazole-diyl group (formula 2A-27), benzothiazole-diyl group (formula 2A-39), dibenzosilol-diyl group (formula 2A-41), carbazole-diyl group (formula 2A-42), dibenzofuran-diyl group (formula 2A-43), dibenzothiophene-diyl group (formula 2A-44), azafluorene-diyl group (formula 2A-47), dibenzopyran-diyl group (formula 2A-49), oxadiazole-diyl group (3A-2) and thiooxadiazole-diyl group (3A-3). Further preferred are thiophene-diyl group (formula 2A-22), thiazole-diyl group (formula 2A-27), benzothiazole-diyl group (formula 2A-39), dibenzosilol-diyl group (formula 2A-41), carbazole-diyl group (formula 2A-42), dibenzofuran-diyl group (formula 2A-43), dibenzothiophene-diyl group (formula 2A-44), dibenzopyran-diyl group (formula 2A-49) and oxadiazole-diyl group (3A-2).

The divalent residue of a metal complex compound having an organic ligand of π-conjugated cyclic compound structure, represented by $Ar^2$ is a divalent group formed by removing, from a metal complex compound having an organic ligand of π-conjugated cyclic compound structure, two of the hydrogen atoms on the carbon atoms contained in the π-conjugated system of the ligand.

The organic ligand has ordinarily about 4 to 60 carbon atoms. As examples thereof, there can be mentioned 8-quinolinol and derivatives thereof, benzoquinolinol and derivatives thereof, 2-phenyl-pyridine and derivatives thereof, 2-phenyl-benzothiazole and derivatives thereof, 2-phenyl-benzoxazole and derivatives thereof and porphyrin and derivatives thereof.

As the central metal of the metal complex, there can be mentioned, for example, aluminum, zinc, beryllium, iridium, platinum, gold, europium and terbium.

As the metal complex compound having an organic ligand of π-conjugated cyclic compound structure, there can be mentioned, for example, low-molecular fluorescent materials, metal complexes known as a phoshorescent material, and triplet-light-emitting complexes.

As specific examples of the divalent residue of a metal complex compound having an organic ligand of π-conjugated cyclic compound structure, there can be shown the following formulas 4A-1 to 4A-7.

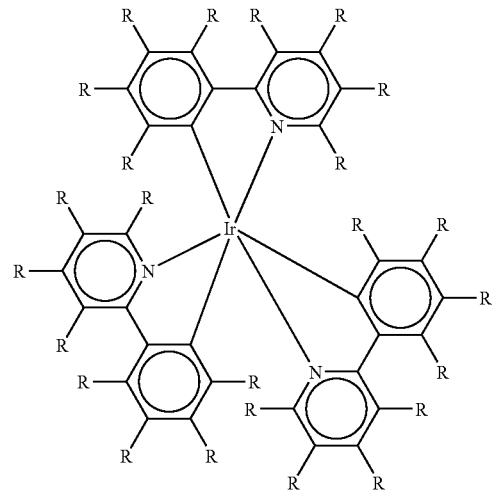

4A-1

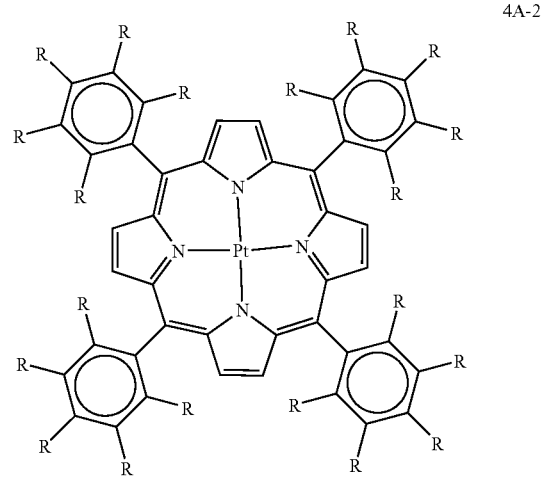

4A-2

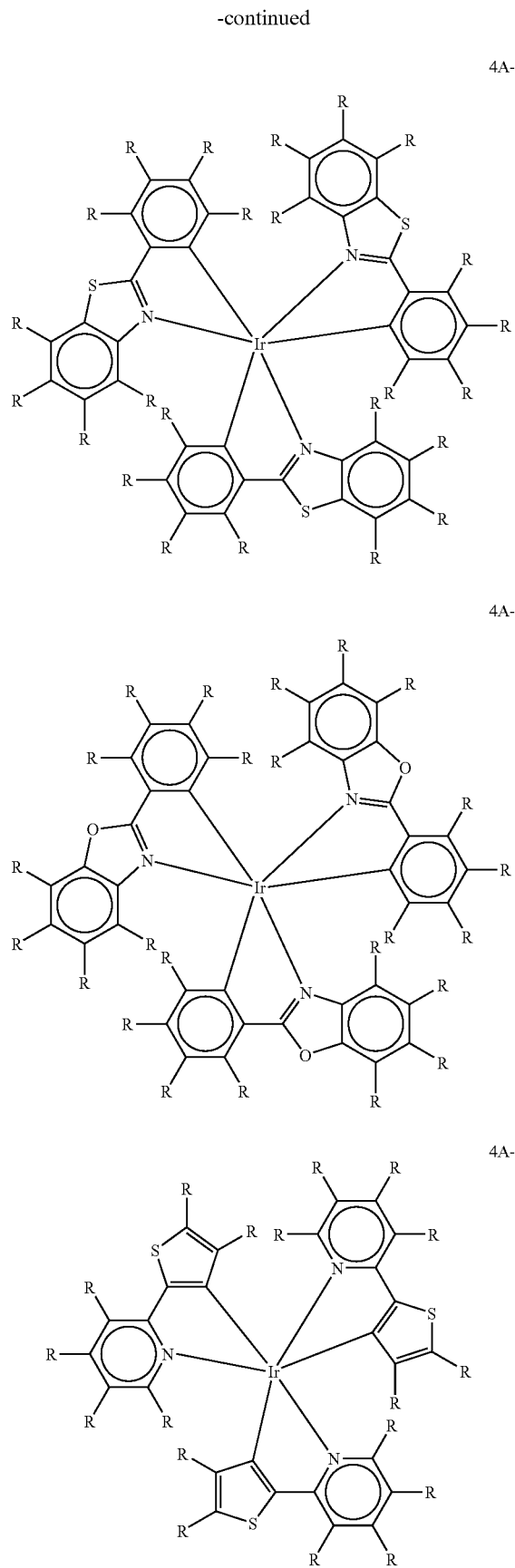

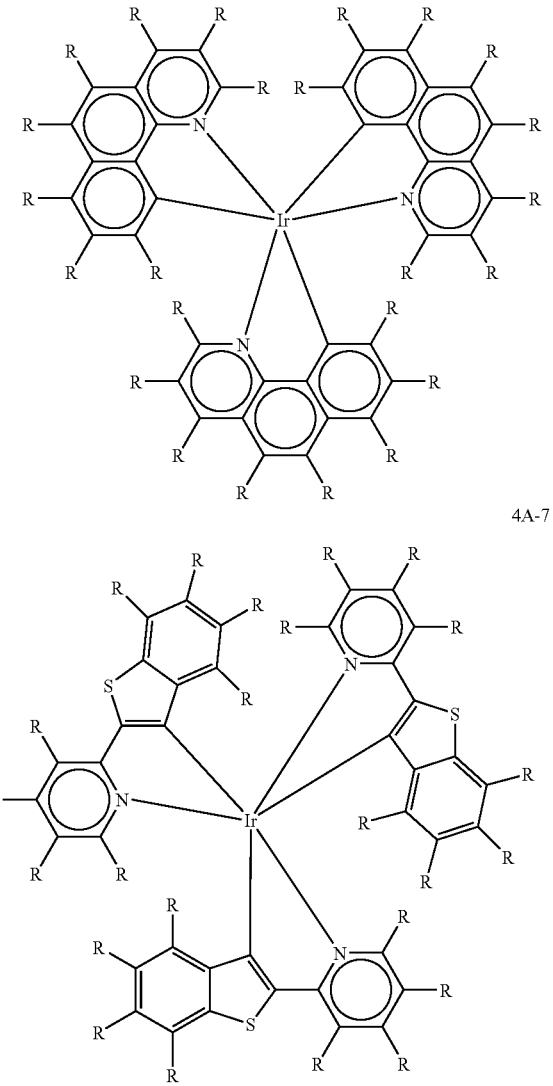

In the above formulas 4A-1 to 4A-7, R represents a bond, a hydrogen atom or a substituent. Any two of a plurality of R's represent a bond. When there exist a plurality of substituents represented by R, they may be the same or different from each other. Examples of the substituent represented by R are the same as shown previously.

The group having a divalent, π-conjugated cyclic compound residue, represented by $Ar^2$ is preferably an arylene group or a divalent heterocyclic group, more preferably an arylene group.

In the formula (2), $X^1$ represents a divalent group selected from the group consisting of $-NQ^1-$, $-PQ^2-$ and $-BQ^3-$. $Q^1$, $Q^2$ and $Q^3$ each represent a substituent. As the substituents represented by $Q^1$ to $Q^3$, there can be mentioned alkyl group, aryl group, aralkyl group and monovalent heterocyclic group. The definitions and specific examples of these groups are the same as those of the alkyl group, aryl group, aralkyl group and monovalent heterocyclic group in the substituent of $Ar^1$. As the substituent represented by $Q^1$, $Q^2$ and $Q^3$, aryl group and monovalent heterocyclic group are particularly preferred. As the divalent group represented by $X^1$, group represented by —NQ$^1$- is particularly preferred from the standpoint of using the aromatic polymer of the present invention in a polymer LED.

In the formula (2), Z represents a direct bond or a divalent linking group. As examples of the divalent linking group represented by Z, there can be shown the groups shown below, phthalimide-N,4-diyl group and pyromellitimide-N,N'-diyl group. There can further be shown a divalent group formed by combination of two or more groups (which may be the same or different from each other) selected from the above-mentioned groups, and a divalent group formed by combination of one or more groups (which may be the same or different from each other) selected from the above-mentioned groups, with one or more groups selected from the above-mentioned divalent groups represented by X$^1$.

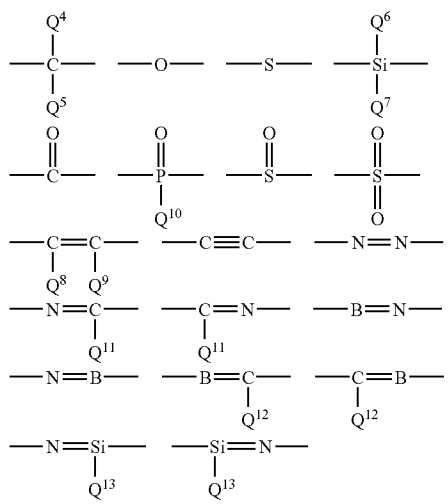

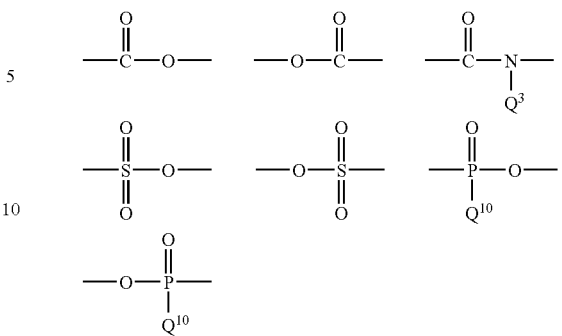

In the above formulas, Q$^4$, Q$^5$, Q$^6$, Q$^7$, Q$^8$, Q$^9$, Q$^{10}$, Q$^{11}$, Q$^{12}$ and Q$^{13}$ each independently represent a group selected from the group consisting of hydrogen atom, alkyl group, aryl group, aralkyl group, monovalent heterocyclic group, formyl group, substituted carbonyl group, halogen atom and cyano group. When each of Q$^4$, Q$^5$, Q$^6$, Q$^7$, Q$^8$, Q$^9$, Q$^{10}$, Q$^{11}$, Q$^{12}$ and Q$^{13}$ exists in a plural number, they may be the same or different from each other. The definitions and specific examples of the alkyl group, aryl group, aralkyl group, monovalent heterocyclic group and substituted carbonyl group, represented by Q$^4$, Q$^5$, Q$^6$, Q$^7$, Q$^8$, Q$^9$, Q$^{10}$, Q$^{11}$, Q$^{12}$ and Q$^{13}$ are the same as those of the alkyl group, aryl group, aralkyl group, monovalent heterocyclic group, substituted carbonyl group and halogen atom, in the substituent of Ar$^1$.

As examples of the divalent group formed by combination of two or more groups (which may be the same or different from each other) selected from the above-mentioned groups and the divalent group formed by combination of one or more groups (which may be the same or different from each other) selected from the above-mentioned groups, with one or more groups selected from the above-mentioned divalent organic groups represented by X$^1$, there can be mentioned, for example, the groups shown below, C$_2$ to C$_{20}$ alkyl chain, and a group formed by replacing any one or more —CH$_2$— groups in C$_2$ to C$_{20}$ alkyl chain, by one or more groups (which may be the same or different from each other) selected from the above-mentioned groups.

In the formula (2), Z is preferred, from the standpoints of heat resistance and solubility in organic solvents, to be a direct bond, a group represented by —NQ$^1$-, —CQ$^4$Q$^5$-, —SiQ$^6$Q$^7$-, —C(=O)— or —SO$_2$—, or a group formed by combination of two or more groups selected from the above groups; is more preferred to be a direct bond, an alkylene chain, or an alkylene group containing a group represented by —NQ$^1$-, —O—, —S—, —SiQ$^6$Q$^7$-, —C(=O)— or —SO$_2$—; and is further preferred to be a direct bond.

From the balance of the standpoints of solubility in organic solvents, device property, easiness of synthesis, etc. and the heat resistance when the aromatic graft polymer of the present invention has been used in a polymer LED, Z is preferably a direct bond or a group represented by —NQ$^1$-, —SiQ$^6$Q$^7$-, —CQ$^8$=CQ$^9$- or —C≡C—; is more preferably a direct bond or a group represented by —NQ$^1$- or —SiQ$^6$Q$^7$-; and further preferably a direct bond or a group containing alkyl chain. When the present aromatic graft polymer is used in a polymer LED and when the side chain represented by the formula (2) is expected to contribute to the charge transfer property and charge injection property of LED, Z is preferably a direct bond.

In the formula (2), each m$_i$ represents 0 or 1. One of two m$_i$ is preferred to be 0.

In the formula (2), two Ar$^2$'s may be the same or different from each other and two Z's may be the same or different from each other. When there exist two X$^1$'s, they may be the same or different from each other. Also, when, in the aromatic polymer of the present invention, the side chain represented by the formula (2) exists in plurality, these side chains may be the same or different from each other.

The aromatic polymer of the present invention is expected to have high functions owing to the group represented by the formula (2). The present aromatic polymer has, for example, charge transfer property or, in a solid state, photoluminescence. Thus, the group represented by the formula (2) is preferred to have functions required in the application of the aromatic polymer. For example, when the compound of the present invention is used in a polymer LED, the group represented by the formula (2) is preferred to be able to impart, to the main chain, charge injection and transfer property (e.g. hole injection and transfer property or electron injection and transfer property), fluorescence- or phosphorescence-emitting property, solubility, heat resistance, etc.

As the group having hole injection and transfer property, represented by the formula (2), there can be mentioned, for example, groups containing, as the skeleton, polyvinylcarbazole or derivative thereof, polysilane or derivative thereof, polysiloxane derivative having aromatic amine in the side chain or the main chain, pyrazoline derivative, arylamine derivative, stilbene derivative, triphenyldiamine derivative, polyaniline or derivative thereof, polythiophene or derivative thereof, polypyrrole or derivative thereof, poly(p-phenylenevinylene) or derivative thereof, poly(2,5-thienylenevinylene) or derivative thereof, or the like.

As more specific examples, there can be mentioned a structure represented by the following formula (2-1).

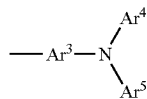

(2-1)

In the above formula, $Ar^3$ represents a divalent π-conjugated cyclic compound residue; and $Ar^4$ and $Ar^5$ each independently represent an aryl group or a monovalent heterocyclic group.

As the group having electron injection and transfer property, represented by the formula (2), there can be mentioned, for example, groups containing, as the skeleton, oxadiazole derivative, anthraquinodimethane or derivative thereof, benzoquinone or derivative thereof, naphthoquinone or derivative thereof, anthraquinone or derivative thereof, tetracyanoanthraquinodimethane or derivative thereof, fluorenone derivative, diphenyldicyanoethylene or derivative thereof, diphenoquinone derivative, metal complex of 8-hydroxyquinoline or derivative thereof, polyquinoline or derivative thereof, polyquinoxaline or derivative thereof, polyfluorene or derivative thereof, or the like.

As more specific examples, there can be mentioned structures represented by the following formulas (2-2) and (2-3), although the examples are not restricted thereto.

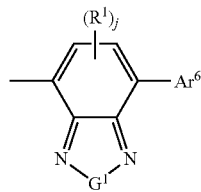

(2-2)

In the formula (2-2), $R^1$ represents alkyl group, alkoxy group, alkylthio group, aryl group, aryloxy group, arylthio group, aralkyl group, aralkyloxy group, aralkylthiothio group, arylalkenyl group, arylalkynyl group, amino group, substituted amino group, silanol group, substituted silyl group, halogen atom, substituted carbonyl group, substituted carbonyloxy group, imine residue, amide group, acid imide group, monovalent heterocyclic group, carboxylic acid group, substituted oxycarbonyl group, cyano group or nitro group; j represents an integer of 0 to 2; $Ar^6$ represents aryl group or monovalent hetero group; $G^1$ represents O, S, SO, $So_2$, Se or Te; when there exist a plurality of $R^1$'s, they may be the same or different from each other.

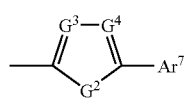

(2-3)

In the above formula, $Ar^6$ represents aryl group or monovalent hetero group; $G^2$ represents O, S, $SO_2$, Se, Te, N—$R^8$ or $SiR^9R^{10}$; $G^3$ and $G^4$ each independently represent N or C—$R^{11}$.

As examples of the 5-membered ring present in the center of the repeating unit represented by the formula (2-3), there can be mentioned thiadiazole, oxadiazole, triazole, thiophene, furan and silol.

Further, as the fluorescence-emitting substituent, there can be used, for example, groups containing, as the skeleton, naphthalene derivative, anthracene or derivative thereof, perylene or derivative thereof, dye of polymethine type, xanthene type, coumarin type, cyanine type or other type, metal complex of 8-hydroxyquinoline or derivative thereof, aromatic amine, tetraphenylcyclopentadiene or derivative thereof, tetraphenylbutadiene or derivative thereof, or the like.

Furthermore, as the phosphorescence-emitting substituent, there can be mentioned groups containing, as the skeleton, a triplet-light-emitting complex such as Ir(ppy)$_3$ or Btp$_2$Ir(acac), each containing iridium as the central metal, PtOEP containing platinum as the central metal, Eu(TTA)$_3$phen containing europium as the central metal, or the like.

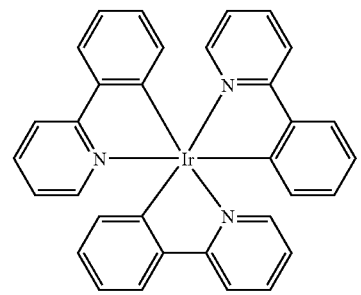

Ir(ppy)$_3$

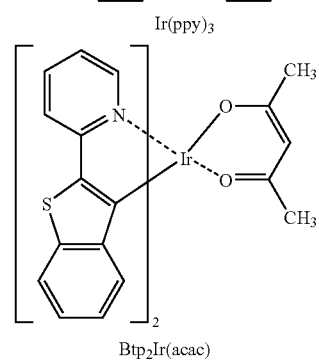

Btp$_2$Ir(acac)

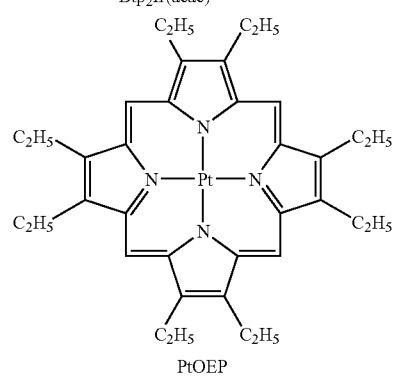

PtOEP

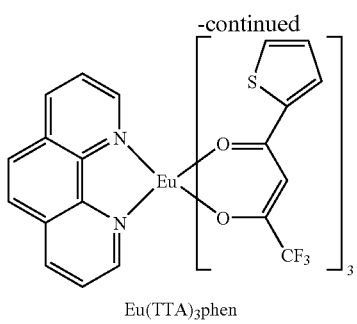

Eu(TTA)₃phen

The aromatic polymer of the present invention may contain other repeating unit in addition to the repeating unit represented by the formula (1). As the other repeating unit, there is preferred a repeating unit selected from the group consisting of the following formulas (3), (4), (5), (6) and (7).

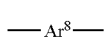 (3)

 (4)

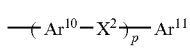 (5)

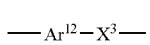 (6)

 (7)

In the above formulas, $Ar^8$ represents a repeating unit formed by replacing the side chain represented by the formula (2) in $Ar^1$ of formula (1), by hydrogen atom; $Ar^8$, $Ar^9$, $Ar^{10}$ and $Ar^{11}$ each independently represent a divalent group having a divalent, π-conjugated cyclic compound residue; $X^2$, $X^3$ and $X^4$ each independently represent a divalent linking group; and p represents 1 or 2.

The definitions and specific examples of the divalent group having a divalent, π-conjugated cyclic compound residue, represented by each of $Ar^8$, $Ar^9$, $Ar^{10}$ and $Ar^{11}$ are the same as those of the divalent group having a divalent, π-conjugated cyclic compound residue, represented by $Ar^2$.

The definitions and specific examples of the divalent linking group represented by each of $X^2$, $X^3$ and $X^4$ are the same as those of the group represented by Z.

The divalent linking group represented by each of $X^2$, $X^3$ and $X^4$ is preferred, from the standpoint of heat resistance, to be a group represented by —$NQ^1$-, —$CQ^4Q^5$-, —$SiQ^6Q^7$-, —C(=O)— or —SO₂—, or a group formed by combination of two or more groups selected therefrom.

The divalent linking group represented by each of $X^2$, $X^3$ and $X^4$ is preferred, from the standpoint of solubility in organic solvents, to be an aralkyl chain, a group represented by —$NQ^1$-, —O—, —S—, —$CQ^4Q^5$-, —$SiQ^6Q^7$-, —C(=O)— or —SO₂—, or an alkyl chain containing such groups.

From the balance of the standpoints of solubility in organic solvents, device property, easiness of synthesis, etc. and the heat resistance when the aromatic polymer of the present invention has been used in a polymer LED, the divalent linking group represented by each of $X^2$, $X^3$ and $X^4$ is preferably a group represented by —$NQ^1$-, —$SiQ^6Q^7$-, —$CQ^8$=$CQ^9$- or —C≡C—, more preferably a group represented by —$NQ^1$- or —$SiQ^6Q^7$-.

When the present aromatic polymer comprises only the repeating units represented by the formulas (1) and (7) or only the repeating units represented by the formulas (1), (3) and (7), the proportion of the repeating unit represented by the formula (7) to the total of the repeating units represented by the formulas (1), (3) and (7) is preferably 40% or less, more preferably 30% or less from the standpoints of heat resistance and chemical stability.

When the present aromatic polymer comprises only the repeating units represented by the formulas (1) and (6) or only the repeating units represented by the formulas (1), (3) and (6), the proportion of the repeating unit represented by the formula (6) to the total of the repeating units represented by the formulas (1), (3) and (6) is preferably 50% or less, more preferably 30% or less from the standpoints of heat resistance and chemical stability.

As the repeating unit in the formula (1), other than the repeating unit represented by $Ar^1$, directly bonding to $Ar^1$, of the repeating units represented by the formulas (3), (4), (5), (6) and (7), the repeating units represented by the formulas (3), (4) and (5) and the repeating unit represented by the formula (6) are preferred, wherein a divalent, π-conjugated cyclic compound residue represented by $Ar^8$ bonds to $Ar^1$; and more preferred are repeating units represented by the formulas (3), (4) and (5).

As the repeating unit contained in the aromatic polymer of the present invention in addition to the repeating unit represented by the formula (1), there are preferred repeating units represented by the formulas (3), (4) and (5) from the standpoints of heat resistance and chemical stability.

The aromatic polymer of the present invention containing a repeating unit represented by the formula (1), when used in electronic material (e.g. polymer LED) field, is preferred to be a conjugated polymer compound.

When the present aromatic polymer is used in a polymer LED, the repeating unit represented by the formula (4) is preferred, for change in emitted light wavelength, higher light emission efficiency, higher heat resistance, etc., to be the following groups selected from the previously-mentioned formulas 1A-1 to 1A-14, 2A-1 to 2A-53 and 3A-1 to 3A-4, that is, phenylene group (formula 1A-1), naphthalene-diyl group (formula 1A-2), dihydrophenanthrene-diyl group (formula 1A-10), fluorene-diyl group (formula 1A-13), benzofluorene-diyl group (formula 1A-14), thiophene-diyl group (formula 2A-22), thiazole-diyl group (formula 2A-27), benzothiazole-diyl group (formula 2A-39), dibenzosilol-diyl group (formula 2A-41), carbazole-diyl group (formula 2A-42), dibenzofuran-diyl group (formula 2A-43), dibenzothiophene-diyl group (formula 2A-44), azafluorene-diyl group (formula 2A-47), dibenzopyran-diyl group (formula 2A-49), oxadiazole-diyl group (3A-2) and thiooxadiazole-diyl group (3A-3). More preferred are phenylene group (formula 1A-1), naphthalene-diyl group (formula 1A-2), fluorene-diyl group (formula 1A-13), benzofluorene-diyl group (formula 1A-14), thiophene-diyl group (formula 2A-22), thiazole-diyl group (formula 2A-27), benzothiazole-diyl group (formula 2A-39), dibenzosilol-diyl group (formula 2A-41), carbazole-diyl group (formula 2A-42), dibenzofuran-diyl group (formula 2A-43), dibenzothiophene-diyl group (formula 2A-44), dibenzopyran-diyl group (formula 2A-49) and oxadiazole-diyl group (3A-2). Further preferred are phenylene group (formula 1A-1), naphthalene-diyl group (formula 1A-2), fluorene-diyl group (formula 1A-13) and benzofluorene-diyl group (formula 1A-14).

When the present aromatic polymer is used in a polymer LED, the repeating unit represented by the formula (7) is preferred, for change in emitted light wavelength, higher light emission efficiency, higher heat resistance, etc., to be repeating units represented by the following formulas (8) and (9).

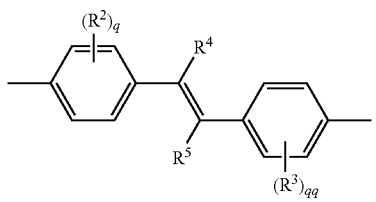
(8)

In the above formula, $R^2$ and $R^3$ each independently represent alkyl group, alkoxy group, alkylthio group, aryl group, aryloxy group, arylthio group, aralkyl group, aralkyloxy group, aralkylthiothio group, arylalkenyl group, arylalkynyl group, amino group, substituted amino group, silanol group, substituted silyl group, halogen atom, substituted carbonyl group, substituted carbonyloxy group, imine residue, amide group, acid imide group, monovalent heterocyclic group, carboxylic acid group, substituted oxycarbonyl group, cyano group or nitro group; q and qq each independently represent an integer of 0 to 4; $R^4$ and $R^5$ each independently represent hydrogen atom, alkyl group, aryl group, monovalent heterocyclic group, carboxylic acid group, substituted oxycarbonyl group or cyano group; when each of $R^2$ and $R^3$ is present in plurality, a plurality of $R^2$'s or $R^3$'s may be the same or different from each other.

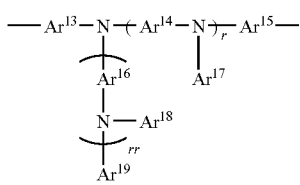
(9)

In the above formula, $Ar^{13}$, $Ar^{14}$, $Ar^{15}$ and $Ar^{16}$ each independently represent a divalent, π-conjugated cyclic compound residue; $Ar^{17}$, $Ar^{18}$ and $Ar^{19}$ each independently represent an aryl group or a monovalent heterocyclic group; $Ar^{13}$, $Ar^{14}$, $Ar^{15}$ $Ar^{16}$, $Ar^{17}$, $Ar^{18}$ and $Ar^{19}$ may each have a substituent; and r and rr each independently represent 0 or 1.

Of the repeating units represented by the formulas (8) and (9), the repeating unit represented by the formula (8) is more preferred from the standpoint of heat resistance.

When the present aromatic polymer is used in a polymer LED, there are preferred, for change in emitted light wavelength, higher light emission efficiency, higher heat resistance, etc., repeating units represented by the following formulas (10), (11), (12) and (13), obtained by combination of the above-shown repeating units represented by formulas (4) to (7).

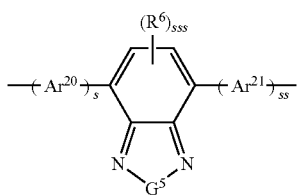
(10)

In the above formula, $R^6$ represents alkyl group, alkoxy group, alkylthio group, aryl group, aryloxy group, arylthio group, aralkyl group, aralkyloxy group, aralkylthiothio group, arylalkenyl group, arylalkynyl group, amino group, substituted amino group, silanol group, substituted silyl group, halogen atom, substituted carbonyl group, substituted carbonyloxy group, imine residue, amide group, acid imide group, monovalent heterocyclic group, carboxylic acid group, substituted oxycarbonyl group, cyano group or nitro group; sss represents an integer of 0 to 2; $Ar^{20}$ and $Ar^{21}$ each independently represent a divalent group having a divalent, π-conjugated cyclic compound residue; s and ss each independently represent 0 or 1; $G^5$ represents O, S, SO, $SO_2$, Se or Te; when a plurality of $R^6$'s is present, they may be the same or different from each other.

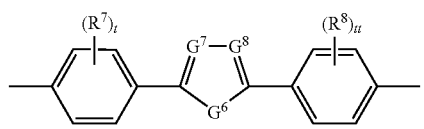
(11)

In the above formula, $R^7$ and $R^8$ each independently represent alkyl group, alkoxy group, alkylthio group, aryl group, aryloxy group, arylthio group, aralkyl group, aralkyloxy group, aralkylthiothio group, arylalkenyl group, arylalkynyl group, amino group, substituted amino group, silanol group, substituted silyl group, halogen atom, substituted carbonyl group, substituted carbonyloxy group, imine residue, amide group, acid imide group, monovalent heterocyclic group, carboxylic acid group, substituted oxycarbonyl group, cyano group or nitro group; t and tt each independently represent an integer of 0 to 4; $G^6$ represents O, S, $SO_2$, Se, Te, $NR^9$ or $SiR^{10}R^{11}$; $G^7$ and $G^8$ each independently represent N or $CR^{12}$; $R^9$, $R^{10}$, $R^{11}$ and $R^{12}$ each independently represent hydrogen atom, alkyl group, aryl group, arylalkyl group or monovalent heterocyclic group; when each of $R^7$, $R^8$ and $R^{12}$ is present in plurality, a plurality of $R^7$'s, $R^8$'s or $R^{12}$'s may be the same or different from each other.

As examples of the central 5-membered ring of the repeating unit represented by the formula (11), there can be mentioned thiadiazole, oxadiazole, triazole, thiophene, furan and silol.

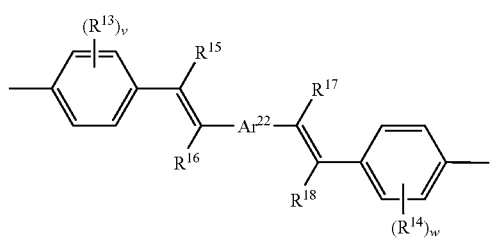
(12)

In the above formula, $R^{13}$ and $R^{14}$ each independently represent alkyl group, alkoxy group, alkylthio group, aryl group, aryloxy group, arylthio group, aralkyl group, aralkyloxy group, aralkylthiothio group, arylalkenyl group, arylalkynyl group, amino group, substituted amino group, silanol group, substituted silyl group, halogen atom, substituted carbonyl group, substituted carbonyloxy group, imine residue, amide group, acid imide group, monovalent heterocyclic group, carboxylic acid group, substituted oxycarbonyl group, cyano group or nitro group; v and w each independently represent an integer of 0 to 4; $R^{15}$, $R^{16}$, $R^{17}$ and $R^{18}$ each independently represent hydrogen atom, alkyl group, aryl group, monovalent heterocyclic group, carboxylic acid group, substituted oxycarbonyl group or cyano group; $Ar^{22}$ represents a divalent group having a divalent, π-conjugated cyclic compound residue; when each of $R^{13}$ and $R^{14}$ is present in plurality, a plurality of $R^{13}$'s or $R^{14}$'s may be the same or different from each other.

(13)

In the above formula, $Ar^{23}$ and $Ar^{24}$ each independently represent a divalent group having a divalent, π-conjugated cyclic compound residue; and x represent 1 or 2.

When the aromatic polymer of the present invention is used in a polymer LED, more preferred as the repeating unit contained in the aromatic polymer in addition to the repeating unit represented by the formula (1), are repeating units represented by the formulas (3), (4), (5), (8), (9), (10), (11), (12) and (13) for change in emitted light wavelength, higher light emission efficiency, higher heat resistance, etc.; further preferred are repeating units represented by the formulas (3), (4), (9), (10), (11) and (13).

The aromatic polymer of the present invention is preferably an aromatic polymer containing only one kind of the repeating units represented by the formula (1), an aromatic polymer containing only two or more kinds of the repeating units represented by the formula (1), an aromatic polymer containing only one kind of the repeating units represented by the formula (1) and the repeating unit represented by the formula (3), an aromatic polymer containing only two or more kinds of the repeating units represented by the formula (1) and the repeating unit represented by the formula (3), or an aromatic polymer containing substantially one or more kinds of the repeating units represented by the formula (1) and one or more kinds of the repeating units represented by the formulas (3) to (13).

In the aromatic polymer of the present invention, the main chain structure thereof may be a random, block or graft copolymer; or, may be a copolymer which is intermediate between the above copolymers, for example, a random or graft copolymer containing block copolymer moieties.

When the present aromatic polymer is used in a polymer LED, the main chain structure is preferred to be, rather than a completely random copolymer, a random copolymer containing block copolymer moieties, a block copolymer or a graft copolymer from the standpoint of higher light emission efficiency.

In the aromatic polymer of the present invention, the repeating unit represented by the formula (1) may be positioned at the end of main chain and thereby the group represented by the formula (2) may be present substantially at the main chain end.

When the aromatic polymer of the present invention is used in a polymer LED, the active group used in polymerization, if remaining as it is in the aromatic polymer, may be protected with a stable group because the remaining active group may reduce the light emission property or life of a LED produced from the aromatic polymer.

In the aromatic polymer of the present invention, the group represented by the formula (2) is expected to control or improve the function of main chain or to impart a new function to the main chain without impairing the function of main chain. Therefore, it is preferred that the structure of the group represented by the formula (2) and the structure of main chain show different properties; more specifically, it is preferred that the group represented by the formula (2) and the repeating unit in main chain have substantially different structures, or the structure combination in group represented by the formula (2) and the combination of repeating units in main chain are substantially different.

In the aromatic polymer of the present invention, the proportion of the total of the repeating units represented by the formula (1) to the total of the whole repeating units possessed by the main chain of the present aromatic polymer is not particularly restricted as long as the properties of the side chain represented by the formula (2) possessed by the repeating unit represented by the formula (1) are exhibited in the aromatic polymer. However, from the standpoint of easiness of synthesis, the proportion is ordinarily 0.1 mole % to 100 mole %, preferably 1.0 mole % or more, more preferably 5 mole % or more, further preferably 10 mole % or more, particularly preferably 20 mole % or more. In the present invention, the main chain is defined as a polymer chain containing the repeating unit represented by the formula (1), in the largest amount; and, when the repeating unit represented by the formula (1) is positioned at the end of polymer chain, the total of the whole repeating units possessed by the main chain of the present aromatic polymer does not contain the repeating units in the group represented by the formula (2) possessed by the repeating unit of formula (1) positioned at the polymer chain end.

In the aromatic polymer of the present invention, the proportion of the total of the repeating units represented by the formula (1) to the total of the repeating units represented by the formula (1) and the formulas (5) to (9), contained in the main chain of the present aromatic polymer is ordinarily 0.1 mole % to 100 mole %, preferably 1 mole % to 100 mole %.

Particularly when the present aromatic graft polymer is used in a polymer LED and when the group represented by the formula (2) is a side chain for imparting charge injection and transfer property, the above proportion is preferably 11 mole % or more, more preferably 16 mole % or more, further preferably 20 mole % or more for more effective exhibition of the above property. When the above-mentioned side chain is a group containing a fluorescence- or phosphorescence-emitting dye and is introduced for control of emitted light wavelength, the above proportion is preferably 0.3 mole % or more, more preferably 1 mole % or more.

Meanwhile, the upper limit of the proportion is preferably 80 mole % or less, more preferably 60 mole % or less, further preferably 40 mole % or less, from the standpoint of easiness of synthesis. Particularly when the group represented by the formula (2) is a group containing a fluorescence- or phosphorescence-emitting dye and is introduced for control of emitted light wavelength, the upper limit of the proportion is preferably 30 mole % or less, more preferably 20 mole % or less, further preferably 15 mole % or less, from the standpoint of efficiency.

The aromatic polymer of the present invention is not particularly restricted as to its polystyrene-reduced number-average molecular weight. However, from the standpoints of solubility, film formability, etc., the polystyrene-reduced number-average molecular weight is preferably about $10^3$ to $10^8$, more preferably $3 \times 10^3$ to $10^6$, further preferably $5 \times 10^3$ to $5 \times 10^5$. The polystyrene-reduced weight-average molecular weight is preferred to be ordinarily about $10^3$ to $10^8$ and, from the standpoint of film formability, is more preferred to be $3 \times 10^3$ to $1 \times 10^7$ and further preferred to be $5 \times 10^3$ to $5 \times 10^6$.

The aromatic polymer of the present invention is not particularly restricted as to the degree of dispersion (weight-average molecular weight/number-average molecular weight). However, when the aromatic polymer is used as an additive for other polymer, the degree of dispersion is preferred to be low and more preferred to be 12 or less.

When the aromatic polymer of the present invention contains only the repeating unit represented by the formula (1) and when the aromatic polymer contains only the repeating unit represented by the formula (1) and the repeating unit represented by the formula (5), it is preferred that the dissolution curve of GPC has substantially one peak and the degree of dispersion is 1.0 to 12, preferably 1.0 to 7.

The dissolution curve of GPC is measured generally by GPC (gel permeation chromatography). In the present invention, the measurement of dissolution curve of GPC was conducted by using a differential refractive index detector and standard polystyrene reduction. Incidentally, GPC is called SEC (size-exclusion chromatography) in some cases.

As the good solvent for the present aromatic polymer, there can be mentioned, for example, chlorine-containing solvents such as chloroform, methylene chloride, dichloroethane, o-dichlorobenzene and the like; ether type solvents such as tetrahydrofuran, anisole and the like; and hydrocarbon type solvents such as toluene, xylene, mesitylene, n-butylbenzene, tetralin, decalin and the like. The aromatic polymer can be dissolved in these solvents in an amount of generally 0.1% by weight or more although the amount differs depending upon the structure and molecular weight of the aromatic polymer.

As the method for synthesis of the aromatic polymer of the present invention, there can be mentioned, for example, (a) a method of individually synthesizing a main chain and side chain (both having a characteristic group reactive with each other to form a bond) and then reacting the main chain with the side chain to bond them to obtain an aromatic polymer, and (b) a method of synthesizing a side chain-containing macromonomer and then polymerizing the macromonomer to synthesize a side chain-containing main chain to obtain an aromatic polymer.

As the method for synthesis of main chain, used in the above synthesis methods (a) and (b), there can be mentioned, for example, a method of subjecting, to condensation and polymerization, a corresponding monomer or a macromonomer (each having a characteristic group taking part in the condensation and polymerization), using a known condensation reaction, dissolving, as necessary, the monomer or the macromonomer in an organic solvent, and using, for example, an alkali or an appropriate catalyst.

As the method for condensation and polymerization, there can be used known methods described, for example, in "Organic Reactions", Vol. 14, pages 270 to 490, John Wiley & Sons, Inc., 1965; "Organic Synthesis", Collective Volume VI, pages 407 to 411, John Wiley & Sons, Inc., 1988; Chem. Rev, Vol. 95, page 2457, 1995; J. Organomet. Chem., Vol. 576, page 147, 1999; and Makromol. Chem., Macromol. Symp., Vol. 12, page 229, 1987.

When a double bond is formed in the condensation polymerization, there can be mentioned, for example, a method described in JP-A-5-202355. That is, there can be mentioned, for example, polymerization by Wittig reaction, between a formyl group-containing compound and phosphonium methyl group-containing compound, or of a compound having formyl group and phosphonium methyl group; polymerization by Heck reaction between a vinyl group-containing compound and a halogen atom-containing compound; polycondensation by dehydrohalogenation of a compound having two or more mono-halogenized methyl groups; polycondensation by sulfonium salt decomposition of a compound having two or more sulfonium methyl groups; polymerization by Knoevenagel reaction between a formyl group-containing compound and a cyanomethyl group-containing compound; and polymerization by McMurry reaction of a compound having two or more formyl groups.

When the aromatic polymer of the present invention has, in the main chain, a triple bond formed by condensation polymerization, there can be used, for example, polymerization by Stille acetylene coupling reaction between a compound having acetylide group (of tin or the like) and a halogen atom-containing compound, and polymerization by Sonogashira reaction between an acetylene group-containing compound and a halogen atom-containing compound.

When there is formed neither double bond nor triple bond, there can be used, for example, polymerization by Suzuki coupling reaction between a compound having boric acid group or boric acid ester group and a compound having halogen atom or sulfonate group (e.g. trifluoromethanesulfonate group); polymerization by Grignard reaction between a compound having magnesium halide group and a halogen atom-containing compound; polymerization using a nickel zero-valent complex, between compounds each having halogen atom or sulfonate group (e.g. trifluoromethanesulfonate group); polymerization using an oxidizing agent (e.g. $FeCl_3$); electrochemical oxidation polymerization; and decomposition of an intermediate polymer compound having an appropriate eliminatable group.

Of these polymerizations, there are preferred, for easier control of structure, the polymerization by Heck reaction, the polymerization by Knoevenage reaction, the polymerization by Suzuki coupling reaction, the polymerization by Grignard reaction and the polymerization using a nickel zero-valent complex.

Explaining in more detail, for the synthesis of main chain in the above synthesis method (a), there can be mentioned, for example, (c) a method of synthesizing a main chain by the above method and then introducing thereinto a characteristic group reactive with a side chain or a monomer to become a side chain to form a bond, by, for example, an electrophilic substitution reaction [e.g. halogenation by a halogenating agent (e.g. bromine or N-halogenosuccinimide) or lithiation by a lithiating agent (e.g. an alkyllithium)] and a further functional group replacement reaction, to synthesize a main chain having a characteristic group; (d) a method of, in synthesis of main chain by the above method, using a monomer having a characteristic group reactive with a side chain or a monomer to become a side chain to form a bond and synthesizing a main chain having a characteristic group; and (e) a method of, in synthesis of main chain by the above method, using a monomer having a functional group changeable into a characteristic group, to synthesize a main chain and then changing the functional group into a characteristic group by one of known, functional group-changing reactions, to synthesize a main chain having a characteristic group.

For the synthesis of side chain in the above synthesis method (a), there can be mentioned the above-mentioned method by condensation reaction. Explaining in more detail, there can be mentioned, for example, (f) a method of synthesizing a side chain by the above method and then introducing thereinto a characteristic group reactive with a main chain to form a bond, by, for example, an electrophilic substitution reaction [e.g. halogenation by a halogenating agent (e.g. bromine or N-halogenosuccinimide) or lithiation by a lithiating agent (e.g. an alkyllithium)] and a further functional group replacement reaction, to synthesize a side chain having a characteristic group; (g) a method of, in synthesis of side chain by the above method, using a monomer having a characteristic group reactive with a main chain to form a bond and synthesizing a side chain having a characteristic group; and (h) a method of, in synthesis of side chain by the above method, using a monomer having a functional group changeable into a characteristic group, to synthesize a side chain and then changing the functional group into a characteristic group by one of known, functional group-changing reactions, to synthesize a side chain having a characteristic group.

In the above method (a), for coupling of main chain with side chain to form a carbon-carbon conjugated bond, there can be mentioned, for example, coupling by Suzuki coupling reaction, coupling by Grignard reaction and coupling by nickel zero-valent complex. From the standpoints of suppression of crosslinking reaction and easy control of reaction, there are preferred the coupling by Suzuki coupling reaction and the coupling by Grignard reaction.

Next, description is made on the polymer, light-emitting device of the present invention.

The polymer, light-emitting device of the present invention is characterized in that it has an organic layer between electrodes which are an anode and a cathode and the organic layer contain the aromatic polymer of the present invention.

The organic layer may be any of a light-emitting layer, a hole transport layer, a hole injection layer, an electron transfer layer, an electron injection layer, an interlayer, etc. The organic layer is preferably a light-emitting layer.

Here, the light-emitting layer refers to a layer having a light-emitting function; the hole transfer layer refers to a layer having a hole-transferring function; and the electron transfer layer refers to a layer having an electron-transferring function. The interlayer refers to a layer which is between a light-emitting layer and an anode but is adjacent to the light-emitting layer and has a role of separating the light-emitting layer from the anode, or the light-emitting layer from a hole injection layer or a hole transfer layer.

Incidentally, the electron transfer layer and the hole transfer layer are generically called charge transfer layer. Also, the electron injection layer and the hole injection layer are generically called charge injection layer. The light-emitting layer, the hole transfer layer, the hole injection layer, the electron transfer layer and the electron injection layer may each be used in two or more layers.

When the organic layer is a light-emitting layer, the light-emitting layer (which is an organic layer) may further contain a hole-transferring material, an electron-transferring material or a light-emitting material. Here, the light-emitting material is a fluorescence- or phosphorescence-emitting material.

When the aromatic polymer of the present invention is mixed with a hole-transferring material, the proportion of the hole-transferring material to the resulting mixture is 1% by weight to 80% by weight, preferably 5% by weight to 60% by weight. When the polymer material of the present invention is mixed with an electron-transferring material, the proportion of the electron-transferring material to the resulting mixture is 1% by weight to 80% by weight, preferably 5% by weight to 60% by weight. When the aromatic polymer of the present invention is mixed with a light-emitting material, the proportion of the light-emitting material to the resulting mixture is 1% by weight to 80% by weight, preferably 5% by weight to 60% by weight. When the aromatic polymer of the present invention is mixed with a light-emitting material and a hole-transferring material and/or an electron-transferring material, the proportion of the light-emitting material to the resulting mixture is 1% by weight to 50% by weight, preferably 5% by weight to 40% by weight; and the total of the hole-transferring material and the electron-transferring material is 1% by weight to 50% by weight, preferably 5% by weight to 40% by weight. Therefore, the content of the aromatic copolymer of the present invention is 98% by weight to 1% by weight, preferably 90% by weight to 20% by weight.

As the hole-transferring material, electron-transferring material and light-emitting material, mixed with the present aromatic polymer, there are preferably used a known low-molecular compound, a known triplet-light-emitting complex or a known polymer compound. Use of a known polymer compound is preferred. As the hole-transferring material, electron-transferring material and light-emitting material (each being a polymer compound), there can be mentioned, for example, polyfluorene, derivative thereof or copolymer thereof, polyarylene, derivative thereof or copolymer thereof, polyarylenevinylene, derivative thereof or copolymer thereof, and (co)polymer of aromatic amine or derivative thereof, which are disclosed in WO 99/13692, WO 99/48160, GB 2340304A, WO 00/53656, WO 01/19834, WO 00/55927, GB 2348316, WO 00/46321, WO 00/06665, WO 99/54943, WO 99/54385, U.S. Pat. No. 5,777,070, WO 98/06773, WO 97/05184, WO 00/35987, WO 00/53655, WO 01/34722, WO 99/24526, WO 00/22027, WO 00/22026, WO 98/27136, U.S. Pat. No. 573,636, WO 98/21262, U.S. Pat. No. 5,741,921, WO 97/09394, WO 96/29356, WO 96/10617, EP 0707020, WO 95/07955, JP-A-2001-181618, JP-A-2001-123156, JP-A-2001-3045, JP-A-2000-351967, JP-A-2000-303066, JP-A-2000-299189, JP-A-2000-252065, JP-A-2000-136379, JP-A-2000-104057, JP-A-2000-80167, JP-A-10-324870, JP-A-10-114891, JP-A-9-111233, JP-A-9-45478, etc.

As the low-molecular, fluorescence-emitting material, there can be used, for example, naphthalene derivative, anthracene or derivative thereof, perylene or derivative thereof, dye of polymethine type, xanthene type, coumarin type, cyanine type or other type, metal complex of 8-hydroxyquinoline or derivative thereof, aromatic amine, tetraphenylcyclopentadiene or derivative thereof, and tetraphenylbutadiene or derivative thereof.

Specifically, there can be used known compounds described in, for example, JP-A-57-51781 and JP-A-59-194393.

As the triplet-light-emitting complex, there can be mentioned, for example, Ir(ppy)$_3$ and Btp$_2$Ir(acac) containing iridium as the central metal, PtOEP containing platinum as the central metal and Eu(TTA)$_3$phen containing europium as the central metal.

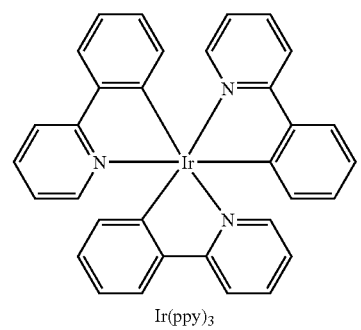

Ir(ppy)$_3$

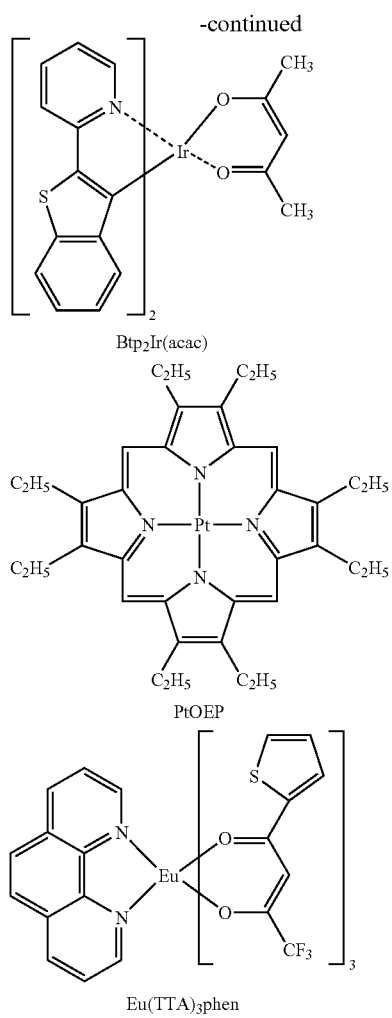

Btp₂Ir(acac)

PtOEP

Eu(TTA)₃phen

Specific examples of the triplet-light-emitting complex are described in, for example, Nature, (1988), 395, 151, Appl. Phys. Lett. (1999), 75(1), 4, Proc. SPIE-Int. Soc. Opt. Eng. (2001), 4105 (Organic Light-Emitting Materials and Devices IV), 119, J. Am. Chem. Soc., (2001), 123, 4304, Appl. Phys. Lett., (1997), 71 (18), 2596, Syn. Met., (1998), 94 (1), 103, Syn. Met., (1999), 99 (2), 1361, Adv. Mater., (1999), 11 (10), 852, and Jpn. J. Appl. Phys., 34, 1883 (1995).

The composition of the present invention contains at least one kind of material selected from a hole transfer material, an electron transfer material and a light-emitting material and the aromatic polymer of the present invention, and can be used as a light-emitting material or a charge transfer material. The proportions of at least one kind of material selected from a hole transfer material, an electron transfer material and a light-emitting material and the aromatic polymer of the present invention can be determined depending upon the application of the present composition. However, when the present composition is used as a light-emitting material, the proportions are preferably the same as in the light-emitting layer.

The polystyrene-reduced, number-average molecular weight of the present polymer composition is ordinarily about $10^3$ to $10^8$, preferably $10^4$ to $10^6$. The polystyrene-reduced, weight-average molecular weight is ordinarily about $10^3$ to $10^8$ and, from the standpoint of film formability and efficiency when used in device, is preferred to be $1\times10^4$ to $5\times10^6$. Here, the average molecular weight of polymer composition refers to a value determined by GPC analysis of a composition obtained by mixing two or more kinds of polymer compounds.

In the present polymer light-emitting device, the film thickness of the light-emitting layer differs in optimum level depending upon the material used. The film thickness is selected so that the driving voltage and the light emission efficiency become appropriate levels, and is, for example, 1 nm to 1 μm, preferably 2 nm to 500 nm, further preferably 5 nm to 200 nm.

Formation of the light-emitting layer is conducted by, for example, film formation from solution. In the film formation from solution, there can be used coating methods such as spin coating, casting, micro gravure coating, gravure coating, bar coating, roll coating, wire bar coating, dip coating, spray coating, screen printing, flexography, offset printing, ink jet printing and the like. There are preferred printing methods such as screen printing, flexography, offset printing, ink jet printing and the like, because pattern formation and coating in multicolor are easy with such printings.

The ink composition used in printing method, etc. contains at least one kind of the present aromatic polymer. Besides, the ink composition may contain, besides the present aromatic polymer, additives such as hole transfer material, electron transfer material, light-emitting material, solvent, stabilizer and the like.

In the ink composition, the proportion of the present aromatic polymer is ordinarily 20% by weight to 100% by weight, preferably 40% by weight to 100% by weight, relative to the total weight of the composition excluding the solvent.

When the ink composition contains a solvent, the proportion of the solvent is 1% by weight to 99.9% by weight, preferably 60% by weight to 99.5% by weight, further preferably 80% by weight to 99.0% by weight, relative to the total weight of the composition.

The viscosity of the ink composition differs depending upon the printing method used. However, when the ink composition is allowed to pass through an injection apparatus as in ink jet printing, etc., the viscosity at 25° C. is preferably in a range of 1 to 20 mPa·s in order to prevent the plugging during injection or the bending of fight.

The solution of the present invention may contain, besides the present aromatic polymer, additives for controlling the viscosity and/or surface tension. As the additives, there are used, in appropriate combination, a polymer compound (thickening agent) or poor solvent for higher viscosity, a low-molecular compound for lower viscosity, a surfactant for lower surface tension, etc.

The polymer compound may be such that is soluble in the same solvent as used in the present aromatic polymer and that does not impair light emission and charge transfer. There can be used, for example, a polymer polystyrene, polymethyl methacrylate, and a present aromatic polymer of large molecular weight. The polymer compound has a weight-average molecular weight of preferably 500,000 or more, more preferably 1,000,000 or more.

A poor solvent may be used as a thickening agent. That is, the viscosity of the solution can be increased by adding a small amount of a poor solvent (poor to solid content in solution). When a poor solvent is added for this purpose, the kind and addition amount of solvent are selected in such a range that the solid content in solution causes no settling-out. The amount of poor solvent, when even stability during storage is considered, is preferably 50% by weight or less, more preferably 30% by weight or less relative to the total solution.

The solution of the present invention may contain, besides the aromatic polymer of the present invention, an anti-oxidant in order to improve the storage stability. The anti-oxidant may be such that is soluble in the same solvent as used in the present aromatic polymer and that does not impair light emission and charge transfer. There can be mentioned, for example, a phenol type anti-oxidant and a phosphorus-based anti-oxidant.

As to the solvent used for the ink composition, there is no particular restriction. However, there is preferred a solvent capable of dissolving or uniformly dispersing materials (other than solvent) constituting the ink composition. As examples of such a solvent, there can be mentioned chlorine-containing solvents such as chloroform, methylene chloride, 1,2-dichloroethane, 1,1,2-trichloroethane, chlorobenzene, o-dichlorobenzene and the like; ether type solvents such as tetrahydrofuran, dioxane, anisole and the like; aromatic hydrocarbon type solvents such as toluene, xylene and the like; aliphatic hydrocarbon type solvents such as cyclohexane, methylcyclohexane, n-pentane, n-hexane, n-heptane, n-octane, n-nonane, n-decane and the lie; ketone type solvents such as acetone, methyl ethyl ketone, cyclohexanone, benzophenone, acetophenone and the like; ester type solvents such as ethyl acetate, butyl acetate, ethyl cellosolve acetate, methyl benzoate, phenyl acetate and the like; polyhydric alcohols and their derivatives, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerine, 1,2-hexanediol and the like; alcohol type solvents such as methanol, ethanol, propanol, isopropanol, cyclohexanol and the like; sulfoxide type solvents such as dimethyl sulfoxide and the like; N-methyl-2-pyrrolidone; and amide type solvents such as N,N-dimethylformamide and the like. These organic solvents may be used singly or in combination of plural solvents.

Of the above solvents, there are preferred, from the standpoints of solubility for polymer compound, etc., uniform film formation, viscosity characteristic, etc., aromatic hydrocarbon type solvents, ether type solvents, aliphatic hydrocarbon type solvents, ester type solvents and ketone type solvents. There are preferred toluene, xylene, ethylbenzene, diethylbenzene, trimethylbenzene, n-propylbenzene, isopropylbenzene, n-butylbenzene, isobutylbenzene, s-butylbenzene, n-hexylbenzene, cyclohexylbenzene, 1-methylnaphthalene, tetralin, anisole, ethoxybenzene, cyclohexane, bicyclohexyl, cyclohexenylcyclohexanone, n-heptylcyclohexane, n-hexylcyclohexane, decalin, methyl benzoate, cyclohexanone, 2-propylcyclohexanone, 2-heptanone, 3-heptanone, 4-heptanone, 2-octanone, 2-nonanone, 2-decanone, dicyclohexyl ketone, acetophenone and benzophenone.

The kind of the solvent used in the solution is preferably 2 kinds or more, more preferably 2 to 3 kinds, further preferably 2 kinds from the standpoints of film formability, device property, etc.

When two kinds of solvents are contained in the solution, one of the two kinds may be a solid at 25° C. From the standpoint of film formability, one kind has a boiling point of preferably 180° C. or more, more preferably 200° C. or more. From the standpoint of viscosity, both kinds are preferred to be able to dissolve the aromatic polymer in an amount of 1% by weight or more at 60° C., and one of the two kinds is preferred to be able to dissolve the aromatic polymer in an amount of 1% by weight or more at 25° C.

When two kinds or more of solvents are contained in the solution, the solvent having the highest boiling point occupies preferably 40 to 90% by weight, more preferably 50 to 90% by weight, further preferably 65 to 85% by weight of the weight of total solvents in solution, from the standpoints of viscosity and film formability.

The kind of the present aromatic polymer contained in the solution may be one kind or two kinds or more. The solution may contain a polymer compound other than the present aromatic polymer as long as the device property, etc. are not impaired.

The solution of the present invention may contain water, a metal and a salt thereof in an amount of 1 to 1,000 ppm. As the metal, there can be specifically mentioned lithium, sodium, calcium, potassium, iron, copper, nickel, aluminum, zinc, chromium, manganese, cobalt, platinum, iridium, etc. The solution may also contain silicon, phosphorus, fluorine, chlorine and bromine in an amount of 1 to 1,000 ppm.

Using the solution of the present invention, a thin film can be produced by spin coating, casting, micro gravure coating, gravure coating, bar coating, roll coating, wire bar coating, dip coating, spray coating, screen printing, flexography, offset printing, ink jet printing, or the like. Film formation using the present solution is conducted preferably by screen printing, flexography, offset printing or ink jet printing, more preferably by ink jet printing.

Of the printing methods, ink jet printing is preferred when a thin film of 1 μm or less is formed in pattern or by multi-color coating; and, when a thin film of 1 μm or more is formed in pattern or by multi-color coating, there is preferred screen printing, flexography, offset printing or gravure printing, for productivity and cost.

As the thin film which can be produced using the solution of the present invention, there can be mentioned, for example, a light-emitting thin film, a conductive thin film and an organic semiconductor thin film.

The conductive thin film of the present invention preferably has a surface resistance of 1 KΩ/□ or less. The conductivity of the thin film can be increased by doping the thin film with a Lewis acid, an ionic compound or the like. The surface resistance is more preferably 100Ω/□ or less, more preferably 10Ω/□ or less.

The organic semiconductor thin film has either (larger one) of an electron mobility and a hole mobility, of preferably $10^{-5}$ $cm^2$/V/sec or more, more preferably $10^{-3}$ $cm^2$/V/sec or more, further preferably $10^{-1}$ $cm^2$/V/sec or more.

The organic semiconductor thin film is formed on a Si substrate on which an insulating film (made of, for example, $SiO_2$) and a gate electrode have been formed, and then a source electrode and a drain electrode are formed with Au or the like; thereby, an organic transistor can be obtained.

In the polymer, light-emitting device of the present invention, the maximum external quantum yield when a voltage of 3.5 V or higher has been applied between the anode and the cathode, is preferably 1% or more, more preferably 1.5% or more from the standpoints of the luminance of device, etc.

As the polymer, light-emitting device of the present invention, there can be mentioned a polymer, light-emitting device in which an electron transfer layer has been provided between the cathode and the light-emitting layer; a polymer, light-emitting device in which a hole transfer layer has been provided between the anode and the light-emitting layer; a polymer, light-emitting device in which an electron transfer layer has been provided between the cathode and the light-emitting layer and a hole transfer layer has been provided between the anode and the light-emitting layer; etc.

Specifically, for example, the following structures a) to d) can be mentioned.

a) anode/light-emitting layer/cathode
b) anode/hole transfer layer/light-emitting layer/cathode.
c) anode/light-emitting layer/electron transfer layer/cathode
d) anode/hole transfer layer/light-emitting layer/electron transfer layer/cathode Here, / means that each two neighboring layers are adjacent to each other. The same applies hereinafter.

In each of the above structures, an interlayer may be provided between the light-emitting layer and the anode with the interlayer being adjacent to the light-emitting layer. Therefore, specifically, for example, the following structures a') to d') can be mentioned.

a') anode/interlayer/light-emitting layer/cathode
b') anode/hole transfer layer/interlayer/light-emitting layer/cathode
c') anode/interlayer/light-emitting layer/electron transfer layer/cathode
d') anode/hole transfer layer/interlayer/light-emitting layer/electron transfer layer/cathode When the polymer, light-emitting device of the present invention has a hole transfer layer, there can be mentioned, as the hole transfer material used, for example, polyvinylcarbazole or derivative thereof, polysilane or derivative thereof, polysiloxane derivative having an aromatic amine in the side chain or the main chain, pyrazoline derivative, arylamine derivative, stilbene derivative, triphenyldiamine derivative, polyaniline or derivative thereof, polythiophene or derivative thereof, polypyrrole or derivative thereof, poly(p-phenylenevinylene) or derivative thereof and poly(2,5-thienylenevinylene) or derivative thereof.

As the hole transfer material, there can be mentioned specifically, for example, those described in JP-A-63-70257, JP-A-63-175860, JP-A-2-135359, JP-A-2-135361, JP-A-2-209988, JP-A-3-37992 and JP-A-3-152184.

Of these hole transfer materials, there are preferred polymer, hole transfer materials such as polyvinylcarbazole or derivative thereof, polysilane or derivative thereof, polysiloxane derivative having an aromatic amine compound group in the side chain or the main chain, polyaniline or derivative thereof, polythiophene or derivative thereof, poly(p-phenylenevinylene) or derivative thereof, poly(2,5-thienylenevinylene) or derivative thereof and the like; there are more preferred polyvinylcarbazole or derivative thereof, polysilane or derivative thereof and polysiloxane derivative having an aromatic amine in the side chain or the main chain.

As the low-molecular, hole transfer material, there can be mentioned, for example, pyrazoline derivative, arylamine derivative, stilbene derivative and triphenyldiamine derivative. The low-molecular, hole transfer material is used preferably by being dispersed in a polymer binder.

The polymer binder mixed with the low-molecular, heat transfer material is preferred to cause extreme hindrance to charge transfer and also is preferred to show no strong absorption to visible light. As examples of the polymer binder, there can be mentioned poly(N-vinylcarbazole), polyaniline or derivative thereof, polythiophene or derivative thereof, poly(p-phenylenevinylene) or derivative thereof, poly(2,5-thienylenevinylene) or derivative thereof, polycarbonate, polyacrylate, polymethyl acrylate, polymethyl methacrylate, polystyrene, polyvinyl chloride and polysiloxane.

The polyvinylcarbazole or derivative thereof can be obtained, for example, by cationic or radical polymerization of vinyl monomer.

As examples of the polysilane or derivative thereof, there can be mentioned compounds described in Chem. Rev. Vol. 89, page 1359 (1989) and GB 2300196. For synthesis, the methods described therein can be used and the Kipping (ok ?) method can be used preferably.

The polysiloxane or derivative thereof has substantially no hole transfer ability in the siloxane structure; therefore, there are preferably used those compounds having, in the side chain or the main chain, the structure of the above-mentioned, low-molecular, hole transfer material. There is mentioned, in particular, a compound having, in the side chain or the main chain, an aromatic amine of hole transfer property.

As to the method for film formation of hole transfer layer, there is no particular restriction. However, with a low-molecular, hole transfer material, there can be mentioned, for example, a method for film formation using a mixed solution of the material and a polymer binder. With a polymer, hole transfer material, there can be mentioned, for example, a method for film formation using a solution.

As the solvent used for film formation using a solution, there is preferred a solvent capable of dissolving or uniformly dispersing a hole transfer material. As such a solvent, there can be mentioned, for example, chlorine-containing solvents such as chloroform, methylene chloride, 1,2-dichloroethane, 1,1,2-trichloroethane, chlorobenzene, o-dichlorobenzene and the like; ether type solvents such as tetrahydrofuran, dioxane, anisole and the like; aromatic hydrocarbon type solvents such as toluene, xylene and the like; aliphatic hydrocarbon type solvents such as cyclohexane, methylcyclohexane, n-pentane, n-hexane, n-heptane, n-octane, n-nonane, n-decane and the lie; ketone type solvents such as acetone, methyl ethyl ketone, cyclohexanone, benzophenone, acetophenone and the like; ester type solvents such as ethyl acetate, butyl acetate, ethyl cellosolve acetate, methyl benzoate, phenyl acetate and the like; polyhydric alcohols and their derivatives, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerine, 1,2-hexanediol and the like; alcohol type solvents such as methanol, ethanol, propanol, isopropanol, cyclohexanol and the like; sulfoxide type solvents such as dimethyl sulfoxide and the like; N-methyl-2-pyrrolidone; and amide type solvents such as N,N-dimethylformamide and the like. These organic solvents may be used singly or in combination of plural solvents.

As the method for film formation using a solution, there can be used solution-coating methods such as spin coating, casting, micro gravure coating, gravure coating, bar coating, roll coating, wire bar coating, dip coating, spray coating, screen printing, flexography, offset printing, ink jet printing and the like.

The film thickness of the hole transfer layer differs in optimum level depending upon the material used, and is selected so that the driving voltage and the light-emitting efficiency become appropriate. However, there is required such a thickness as at least generates no pin hole, and too large a thickness is not preferred because the driving voltage of device becomes high. Therefore, the thickness of the hole transfer layer is, for example, 1 nm to 1 μm, preferably 2 nm to 500 nm, further preferably 5 nm to 200 nm.

When the polymer, light-emitting device of the present invention has an electron transfer layer, the electron transfer material used may be a known material. There can be mentioned, for example, oxadiazole derivative, anthraquinodimethane or derivative thereof, benzoquinone or derivative thereof, naphthoquinone or derivative thereof, anthraquinone or derivative thereof, tetracyanoanthraquinodimethane or derivative thereof, fluorenone derivative, diphenyldicyanoethylene or derivative thereof, diphenoquinone derivative, metal complex of 8-hydroxyquinoline or derivative thereof, polyquinoline or derivative thereof, polyquinoxaline or derivative thereof and polyfluorene or derivative thereof.

Specifically, there can be mentioned, for example, those described in JP-A-63-70257, JP-A-63-175860, JP-A-2-135359, JP-A-2-135361, JP-A-2-209988, JP-A-3-37992 and JP-A-3-152184.

Of these compounds, there are preferred oxadiazole derivative, benzoquinone or derivative thereof, anthraquinone or derivative thereof, metal complex of 8-hydroxyquinoline or derivative thereof, polyquinoline or derivative thereof, polyquinoxaline or derivative thereof and polyfluorene or derivative thereof; and there are more preferred 2-(4-biphenyl)-5-(4-t-butylphenyl)-1,3,4-oxadiazole, benzoquinone, anthraquinone, tris(8-quinolinol) aluminum and polyquinoline.

As to the method for film formation of the electron transfer layer, there is no particular restriction. However, with a low-molecular, electron transfer material, there are be mentioned, for example, vacuum evaporation and film formation from a solution or a molten state; and with a polymer, electron transfer material, there is mentioned, for example, film formation from a solution or a molten state. In the film formation from a solution or a molten state, the above-mentioned polymer binder may be used in combination.

The solvent used in film formation from a solution is preferably a solvent capable of dissolving or uniformly dispersing an electron transfer material and/or a polymer binder. As such a solvent, there can be mentioned, for example, chlorine-containing solvents such as chloroform, methylene chloride, 1,2-dichloroethane, 1,1,2-trichloroethane, chlorobenzene, o-dichlorobenzene and the like; ether type solvents such as tetrahydrofuran, dioxane, anisole and the like; aromatic hydrocarbon type solvents such as toluene, xylene and the like; aliphatic hydrocarbon type solvents such as cyclohexane, methylcyclohexane, n-pentane, n-hexane, n-heptane, n-octane, n-nonane, n-decane and the lie; ketone type solvents such as acetone, methyl ethyl ketone, cyclohexanone, benzophenone, acetophenone and the like; ester type solvents such as ethyl acetate, butyl acetate, ethyl cellosolve acetate, methyl benzoate, phenyl acetate and the like; polyhydric alcohols and their derivatives, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerine, 1,2-hexanediol and the like; alcohol type solvents such as methanol, ethanol, propanol, isopropanol, cyclohexanol and the like; sulfoxide type solvents such as dimethyl sulfoxide and the like; N-methyl-2-pyrrolidone; and amide type solvents such as N,N-dimethylformamide and the like. These organic solvents may be used singly or in combination of plural solvents.

As the method for film formation from a solution or a molten state, there can be used coating methods such as spin coating, casting, micro gravure coating, gravure coating, bar coating, roll coating, wire bar coating, dip coating, spray coating, screen printing, flexography, offset printing, ink jet printing and the like.

The film thickness of the electron transfer layer differs in optimum level depending upon the material used, and is selected so that the driving voltage and the light-emitting efficiency become appropriate. However, there is required such a thickness as at least generates no pin hole, and too large a thickness is not preferred because the driving voltage of device becomes high. Therefore, the thickness of the electron transfer layer is, for example, 1 nm to 1 μm, preferably 2 nm to 500 nm, further preferably 5 nm to 200 nm.

Of the charge transfer layers provided adjacent to electrodes, those capable of improving the efficiency of charge injection from electrode and lowering the driving voltage of device are generically called, in particular, charge injection layer (hole injection layer, electron injection layer), in some cases.

Further, for improvement of adhesion with electrode or for improvement of charge injection from electrode, there may be provided the above-mentioned charge injection layer or an insulating layer of 2 nm or less in thickness, both adjacently to electrode. Also, for improvement of adhesion at interface, prevention of mixing, etc., there may be inserted a thin buffer layer at the interface of charge transfer layer or light-emitting layer.

The order or number of layers piled up and the thickness of each layer can be determined appropriately in consideration of light emission efficiency and device life.

In the present invention, as the polymer, light-emitting device provided with a charge injection layer (an electron injection layer or a hole injection layer), there can be mentioned a polymer, light-emitting device provided with a charge injection layer adjacently to the cathode, and a polymer, light-emitting device provided with a charge injection layer adjacently to the anode.

Specifically, there can be mentioned, for example, the following structures e) to p).

e) anode/charge injection layer/light-emitting layer/cathode
f) anode/light-emitting layer/charge injection layer/cathode
g) anode/charge injection layer/light-emitting layer/charge injection layer/cathode
h) anode/charge injection layer/hole transfer layer/light-emitting layer/cathode
i) anode/hole transfer layer/light-emitting layer/charge injection layer/cathode
j) anode/charge injection layer/hole transfer layer/light-emitting layer/charge injection layer/cathode
k) anode/charge injection layer/light-emitting layer/electron transfer layer/cathode
l) anode/light-emitting layer/electron transfer layer/charge injection layer/cathode
m) anode/charge injection layer/light-emitting layer/electron transfer layer/charge injection layer/cathode
n) anode/charge injection layer/hole transfer layer/light-emitting layer/electron transfer layer/cathode
o) anode/hole transfer layer/light-emitting layer/electron transfer layer/charge injection layer/cathode
p) anode/charge injection layer/hole transfer layer/light-emitting layer/electron transfer layer/charge injection layer/cathode In each of the above structures, there is a case (a structure) in which an interlayer is provided between the light-emitting layer and the anode adjacently to the light-emitting layer. In this case, the interlayer may have a function of a hole injection layer and/or a hole transfer layer.

As specific examples of the charge injection layer, there can be mentioned a layer containing a conductive polymer compound; a layer which is provided between an anode and a hole transfer layer and which contains a material having an ionization potential intermediate between that of anode material and that of hole transfer material contained in hole transfer layer; and a layer which is provided between a cathode and an electron transfer layer and which contains a material having an electron affinity intermediate between that of cathode material and that of electron transfer material contained in electron transfer layer.

When the charge injection layer contains a conductive polymer compound, the conductivity of the conductive polymer compound is preferably $10^{-5}$ S/cm to $10^3$ and, in order to make small the leakage current between light-emitting elements, more preferably $10^{-5}$ S/cm to $10^2$, further preferably $10^{-5}$ S/cm to $10^1$.

When the charge injection layer contains a conductive polymer compound, the conductivity of the conductive polymer compound is preferably $10^{-5}$ S/cm to $10^3$ and, in order to make small the leakage current between light-emitting elements, more preferably $10^{-5}$ S/cm to $10^2$, further preferably $10^{-5}$ S/cm to $10^1$.

In order to allow the conductive polymer compound to have a conductivity of $10^{-5}$ S/cm to $10^3$, the conductive polymer compound is ordinarily doped with an appropriate amount of an ion.

The kind of the ion doped is an anion when the charge injection layer is a hole injection transfer, and is a cation when the charge injection layer is an electron injection layer. As examples of the anion, there can be mentioned polystyrenesulfonic acid ion, alkylbenzenesulfonic acid ion and camphorsulfonic acid ion. As examples of the cation, there can be mentioned lithium ion, sodium ion, potassium ion and tetrabutylammonium ion.

The film thickness of the charge injection layer is, for example, 1 nm to 100 nm, preferably 2 nm to 50 nm.

The material used for the charge injection layer is appropriately selected in consideration of the materials used for electrodes and adjacent layers. There can be mentioned, for example, conductive polymer compounds such as polyaniline and derivative thereof, polythiophene and derivative thereof, polypyrrole and derivative thereof, polyphenylenevinylene and derivative thereof, polythienylenevinylene and derivative thereof, polyquinoline and derivative thereof, polyquinoxaline and derivative thereof, polymer having an aromatic amine structure in the main chain or the side chain, and the like; metal phthalocyanine (e.g. copper phthalocyanine); and carbon.

The insulating layer having a film thickness of 2 nm or less has a function of making charge injection easy. As the material for the insulating layer, there can be mentioned metal fluorides, metal oxides, organic insulating materials, etc. As the polymer, light-emitting device provided with an insulating layer having a film thickness of 2 nm or less, there can be mentioned a polymer, light-emitting device provided with an insulating layer having a film thickness of 2 nm or less, adjacently to the cathode; and a polymer LED provided with an insulating layer having a film thickness of 2 nm or less, adjacently to the anode.

Specifically, there can be mentioned, for example, the following structures q) to ab).

q) anode/insulating layer of 2 nm or less in thickness/light-emitting layer/cathode r) anode/light-emitting layer/insulating layer of 2 nm or less in thickness/cathode s) anode/insulating layer of 2 nm or less in thickness/light-emitting layer/insulating layer of 2 nm or less in thickness/cathode t) anode/insulating layer of 2 nm or less in thickness/hole transfer layer/light-emitting layer/cathode u) anode/hole transfer layer/light-emitting layer/insulating layer of 2 nm or less in thickness/cathode v) anode/insulating layer of 2 nm or less in thickness/hole transfer layer/light-emitting layer/insulating layer of 2 nm or less in thickness/cathode w) anode/insulating layer of 2 nm or less in thickness/light-emitting layer/electron transfer layer/cathode x) anode/light-emitting layer/electron transfer layer/insulating layer of 2 nm or less in thickness/cathode y) anode/insulating layer of 2 nm or less in thickness/light-emitting layer/electron transfer layer/insulating layer of 2 nm or less in thickness/cathode z) anode/insulating layer of 2 nm or less in thickness/hole transfer layer/light-emitting layer/electron transfer layer/cathode aa) anode/hole transfer layer/light-emitting layer/electron transfer layer/insulating layer of 2 nm or less in thickness/cathode ab) anode/insulating layer of 2 nm or less in thickness/hole transfer layer/light-emitting layer/electron transfer layer/insulating layer of 2 nm or less in thickness/cathode In each of the above structures, there is a case (a structure) in which an interlayer is provided between the light-emitting layer and the anode adjacently to the light-emitting layer. In this case, the interlayer may have a function of a hole injection layer and/or a hole transfer layer.

In the structure obtained by providing an interlayer in each of the above-mentioned structures a) to ab), it is preferred that the interlayer is provided between the anode and the light-emitting layer and that the interlayer is constituted by a material having an ionization potential intermediate between that of the anode, the hole injection layer or the hole transfer layer and that of the polymer compound constituting the light-emitting layer.

As the material used for the interlayer, there can be mentioned, for example, aromatic amine-containing polymers such as polyvinylcarbazole or derivative thereof, polyarylene derivative having an aromatic amine in the side chain or the main chain, arylamine derivative, triphenyldiamine derivative and the like.

As to the method for film formation of interlayer, there is no restriction. However, for example, when a polymer material is used, there can be mentioned a method of film formation from a solution.

As the solvent used in the film formation from a solution, there is preferred a solvent capable of dissolving or uniformly dispersing a material used in the interlayer. As such a solvent, there can be mentioned, for example, chlorine-containing solvents such as chloroform, methylene chloride, 1,2-dichloroethane, 1,1,2-trichloroethane, chlorobenzene, o-dichlorobenzene and the like; ether type solvents such as tetrahydrofuran, dioxane, anisole and the like; aromatic hydrocarbon type solvents such as toluene, xylene and the like; aliphatic hydrocarbon type solvents such as cyclohexane, methylcyclohexane, n-pentane, n-hexane, n-heptane, n-octane, n-nonane, n-decane and the lie; ketone type solvents such as acetone, methyl ethyl ketone, cyclohexanone, benzophenone, acetophenone and the like; ester type solvents such as ethyl acetate, butyl acetate, ethyl cellosolve acetate, methyl benzoate, phenyl acetate and the like; polyhydric alcohols and their derivatives, such as ethylene glycol, ethylene glycol monobutyl ether, ethylene glycol monoethyl ether, ethylene glycol monomethyl ether, dimethoxyethane, propylene glycol, diethoxymethane, triethylene glycol monoethyl ether, glycerine, 1,2-hexanediol and the like; alcohol type solvents such as methanol, ethanol, propanol, isopropanol, cyclohexanol and the like; sulfoxide type solvents such as dimethyl sulfoxide and the like; N-methyl-2-pyrrolidone; and amide type solvents such as N,N-dimethylformamide and the like. These organic solvents may be used singly or in combination of plural solvents.

As the method for film formation from a solution, there can be used coating methods such as spin coating, casting, micro gravure coating, gravure coating, bar coating, roll coating, wire bar coating, dip coating, spray coating, screen printing, flexography, offset printing, ink jet printing and the like.

The film thickness of the interlayer differs in optimum level depending upon the material used, and is selected so that the driving voltage and the light-emitting efficiency become appropriate. The thickness of the interlayer is, for example, 1 nm to 1 μm, preferably 2 nm to 500 nm, further preferably 5 nm to 200 nm.

When the interlayer is provided adjacently to the light-emitting layer and, in particular, these two layers are formed by a coating method, there is a case that the two layers are mixed and the mixing has an undesirable influence on the property of device, etc. When an interlayer is formed by a coating method and then a light-emitting layer is formed by a coating method, there can be mentioned, as the method for minimizing the mixing of the materials of the two layers, a method of forming an interlayer by a coating method, then heating the interlayer to make the layer insoluble in the organic solvent used in formation of light-emitting layer, and forming a light-emitting layer. The temperature used in the heating is ordinarily about 150° C. to 300° C., and the time is ordinarily about 1 minute to 1 hour. In this case, the component(s) which did not become insoluble in the solvent during the heating can be removed by, after the heating but before formation of the light-emitting layer, rinsing the interlayer with the solvent to be used in formation of light-emitting layer. When the interlayer has been made sufficiently insoluble in the solvent by heating, the rinsing by solvent can be omitted. In order for the interlayer to be made sufficiently insoluble in the solvent by heating, it is preferred to use, as the polymer compound for interlayer, a compound having at least one polymerizable group in the molecule. It is further preferred that the number of polymerizable groups is 5% or more relative to the number of repeating units in the molecule.

The substrate constituting the polymer, light-emitting device of the present invention may be a substrate causing no change when electrodes and organic material layers are formed thereon. There can be mentioned, for example, glass, plastic, polymer film and silicon substrate. When the substrate is opaque, an electrode at the opposed position is preferably transparent or translucent.

Ordinarily, at least one of the anode and the cathode of the polymer, light-emitting device of the present invention is transparent or translucent. Preferably, the anode is transparent or translucent.

As the material for anode, there are used a conductive metal oxide film, a translucent metal oxide film, etc. Specifically, there are used indium oxide, zinc oxide, tin oxide, a composite thereof, i.e. indium-tin-oxide (ITO), a film (e.g. NESA) produced with a conductive glass composed of indium-zinc-oxide or the like, gold, platinum, silver, copper, etc. with ITO, indium-zinc-oxide and tin oxide being preferred. For production of anode, there can be mentioned vacuum evaporation, sputtering, ion plating, plating, etc. As the anode, there may also be used an organic, transparent, conductive film of polyaniline or derivative thereof, polythiophene or derivative thereof, or the like.

The film thickness of the anode can be selected appropriately in consideration of light transmittance therethrough and conductivity. However, the thickness is, for example, 10 nm to 10 μm, preferably 20 nm to 1 μm, further preferably 50 nm to 500 nm.

There may be formed, on the anode, for easy charge injection, a layer made of a phthalocyanine derivative, a conductive polymer compound, carbon or the like; or a layer having an average film thickness of 2 nm or less, made of a metal oxide or fluoride, an organic insulating material, or the like.

The material for cathode, used in the polymer, light-emitting device of the present invention is preferred to have a small work function. There can be used, for example, metals such as lithium, sodium potassium, rubidium, cesium, beryllium, magnesium, calcium, strontium, barium, aluminum, scandium, vanadium, zinc, yttrium, indium, cerium, samarium, europium, terbium, ytterbium and the like; alloys of two or more of these metals; alloys between one or more of these metals and one or more of gold, silver, platinum, copper, manganese, titanium, cobalt, nickel, tungsten and tin; graphite; and graphite intercalation compounds. As examples of the alloys, there can be mentioned magnesium-silver alloy, magnesium-indium alloy, magnesium-aluminum alloy, indium-silver alloy, lithium-aluminum alloy, lithium-magnesium alloy, lithium-indium alloy and calcium-aluminum alloy. The cathode may have a layered structure consisting of two or more layers.

The film thickness of the cathode can be selected appropriately in consideration of the conductivity and durability. However, the thickness is, for example, 10 nm to 10 μm, preferably 20 nm to 1 μm, further preferably 50 nm to 500 nm.

For production of the cathode, there can be used, for example, vacuum evaporation, sputtering, and lamination by thermocompression bonding of thin metal film. Also, there may be provided, between the cathode and an organic compound layer, a layer made of a conductive polymer compound, or a layer of 2 nm or less in average film thickness, made of a metal oxide or fluoride, an organic insulating material, or the like; further, there may be provided, after production of the cathode, a protective layer which protects the polymer, light-emitting device. In order to use the polymer, light-emitting device stably over a long period of time, it is preferred to provide a protective layer and/or a protective cover in order to protect the device from outside.

As the protective layer, there can be used a polymer compound, a metal oxide, a metal fluoride, a metal boride, etc. As the protective cover, there can be used, for example, a metal plate, a glass plate and a plastic plate whose surface has been treated for low water permeability. It is preferably conducted to laminate the cover onto the substrate of device with a thermosetting resin or a photo-setting resin for tight sealing. By using a spacer to maintain a space, the damaging of the device can be easily protected. By sealing an inert gas (e.g. nitrogen or argon) in the space, the cathode can be protected from oxidation and, by providing a desiccant (e.g. barium oxide) in the space, there can be easily prevented the damaging of device caused by the water adsorbed by the device during production step or by a very small amount of the water penetrating into the device through the cured resin. It is preferred to take at least one of these measures.

The polymer, light-emitting device of the present invention can be used as a planar light source, a segment display unit, a dot matrix display unit and a backlight of liquid crystal display unit.

In order to obtain planar light emission using the polymer, light-emitting device of the present invention, a planar anode and a planar cathode are arranged so as to pile up. In order to obtain pattern-shaped light emission, there are employed a method of providing a mask having a pattern-shaped window, on the above-mentioned planar, light-emitting device; a method of forming a non-light-emitting organic compound layer, in an extremely large thickness to make the layer substantially non-light-emitting; and a method of forming either or both of an anode and a cathode in a pattern shape. By forming a pattern by any of these methods and arranging a plurality of electrodes so that they can independently effect an ON/OFF operation, there can be obtained a segment type display device capable of displaying numbers, letters, simple symbols, etc. In order to obtain a dot matrix device, an anode and a cathode are both formed in a stripe shape and are arranged so as to intersect perpendicularly. By using a method of coating plural kinds of polymer, fluorescent materials emitting different colors or a method of using a color filter or a fluorescence conversion filter, partial color display and multi-color display become possible. The dot matrix device may be produced so as to allow passive driving or, by combining with TFT or the like, active driving. These display devices can be used as a display unit for computer, TV, portable terminal, potable telephone, car navigation, view finder of video camera, etc.

Further, the above-mentioned planar, light-emitting device, being self light-emitting and thin in thickness, can be preferably used as a planar light source for the backlight of liquid crystal display unit, or as a planar light source for illumination. It can also be used as a curved surface light source or display unit by using a flexible substrate.

EXAMPLES

Examples are shown below in order to describe the present invention in more detail. However, the present invention is in no way restricted thereto.

(Number-average Molecular Weight and Weight-average Molecular Weight)

Here, with respect to number-average molecular weight (Mn), weight-average molecular weight (Mw) and peak top molecular weight (Mp), there were measured, by GPC, polystyrene-reduced number-average molecular weight (Mn), polystyrene-reduced weight-average molecular weight (Mw) and polystyrene-reduced peak top molecular weight (Mp).

<GPC Measurement Method A>

Measurement was made by using GPC LC-10 Avp (a product of Shimadzu Corporation), a column obtained by connecting, in series, two columns of TSKgel Super HM-H (a product of Tosoh Corporation) and one column of TSKgel Super H2000 (a product of Tosoh Corporation), and tetrahydrofuran as a developing solvent, at a flow rate of 0.6 ml/min at 40° C. As the detector, there was used a differential refractive index detector (RID-10A, a product of Shimadzu Corporation).

<GPC Measurement Method B>

Measurement was made by using PL-GPC 210 System (a product of Polymer Laboratory) (RI detection), three columns of PLgel 10 μm MIXED-B, and o-dichlorobenzene (containing 0.01% by w/v of 2,6-di-t-butyl-4-methylphenol) as a developing solvent, at 70° C.

<GPC Measurement Method C>

Measurement was made by using HLC-8220 GPC System (a product of Tosoh Corporation) (RI detection), a column obtained by connecting, in series, three columns of TSKgel Super HM-H (a product of Tosoh Corporation), and tetrahydrofuran as a developing solvent, at a flow rate of 0.5 ml/min at 40° C. As the detector, there was used a differential refractive index detector.

(HPLC Measurement)
Testing equipment: Shimadzu LC-10 AVp
Testing conditions: L-Column ODS, 5 μm, 2.1 mm×150 mm;
Solution A: acetonitrile, Solution B: THF Gradient
Solution B: 0%→(60 min.) 0%→(10 min.)→100%→(10 min.)→100%
Sample concentration: 5.0 mg/ml (THF solution),
Amount injected: 1 μl
Detection wavelength: 254 nm (NMR Measurement)
NMR measurement was conducted at room temperature by using a polymer in the form of a deuterated tetrahydrofuran solution and by using an NMR apparatus (INOVA 300, a product of Varian Inc.).

Synthesis Example 1

Synthesis of N-(4-(4,4,5,5-tetramethyl)-[1,3,2]dioxaboran-2-yl)phenyl)-N-(4-t-butyl-2,6-dimethylphenyl)-N-phenylamine and N,N-bis(4-bromophenyl)-N-(4-t-butyl-2,6-dimethylphenyl)-amine>(Synthesis of 4-t-butyl-2,6-dimethylbromobenzene)

225 g of acetic acid was placed in a 500-ml, three-necked flask in an inert atmosphere, after which 24.3 g of 5-t-butyl-m-xylene was added. Successively, 31.2 g of bromine was added. Then, the mixture was subjected to a reaction at 15 to 20° C. for 3 hours.

The reaction mixture was pored into 500 ml of water.

The resulting precipitate was collected by filtration and washed with 250 ml of water twice to obtain 34.2 g of a white solid.

$^1$H-NMR (300 MHz/CDCl$_3$): δ (ppm)
1.3 [s, 9H], 2.4 [s, 6H], 7.1 [s, 2H]
MS (FD$^+$) M$^+$ 241

Synthesis of N,N-diphenyl-N-(4-t-butyl-2,6-dimethylphenyl)-amine)

100 ml of degassed, dehydrated toluene was placed in a 300-ml, three-necked flask in an inert atmosphere, followed by addition of 16.9 g of diphenylamine and 25.3 g of 4-t-butyl-2,6-dimethylbromobenzene. Successively, there were added 0.92 g of tris(dibenzylideneacetone) dipalladium and 12.0 g of t-butoxy sodium, followed by addition of 1.01 g of tri(t-butyl)phosphine. Then, the mixture was subjected to a reaction at 100° C. for 7 hours.

The reaction mixture was pored into a saturated aqueous sodium chloride solution and extraction with 100 ml of toluene was conducted. The resulting toluene layer was washed with diluted hydrochloric acid and a saturated aqueous sodium chloride solution. The solvent in the layer was removed by distillation to obtain a black solid. The solid was subjected to separation and purification by silica gel column chromatography (hexane/chloroform 9/1) to obtain 30.1 g of a white solid.

$^1$H-NMR (300 MHz/CDCl$_3$): δ (ppm)
1.3 [s, 9H], 2.0 [s, 6H], 6.8-7.3 [m, 10H]

Synthesis of N-(4-bromophenyl)-N-(4-t-butyl-2,6-dimethylphenyl)-N-phenylamine

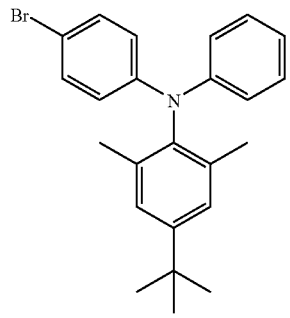

Into a dried, three-necked flask was fed 3.0 g (9.1 mmol) of N,N-diphenyl-N-(4-t-butyl-2,6-dimethylphenyl)amine synthesized as above. The flask inside was purged with argon gas. Thereto was added 105 ml of dehydrated dimethylformamide using a syringe. The flask contents were made homogeneous. The reaction mixture was cooled to 0 to 5° C. in an ice bath. Thereto was dropwise added, in 30 minutes, a solution comprising 1.5 g (0.9 equivalent) of N-bromosuccinimide and 5.2 ml of dehydrated dimethylformamide, followed by stirring for 30 minutes. Then, the ice bath was removed and the reaction mixture was returned to room temperature, followed by stirring for 5 hours. Then, to the reaction mixture were added 130 ml of distilled water and 150 ml of chloroform, followed by sufficient stirring. The organic layer was separated from the aqueous layer, dried over anhydrous magnesium sulfate, and concentrated to dryness. Then, the concentrate was dissolved in 200 ml of toluene, and the solution was passed through a silica gel column and then concentrated do dryness. The concentrate was purified by silica gel column chromatography using chloroform and cyclohexane as a developing solvent, followed by concentration to dryness, to obtain 2.0 g of N-(4-bromophenyl)-N-(4-t-butyl-2,6-dimethylphenyl)-N-phenylamine as a white solid (LC surface percentage: 99.7%, yield: 53.3%).

$^1$H-NMR (300 MHz/CDCl$_3$): δ
1.32 (s, 9H), 2.00 (s, 6H), 6.81-6.98 (m, 5H), 7.09 (s, 2H), 7.16-7.27 (m, 4H)
LC/MS (APPI (+)): M$^+$ 407

Synthesis of N-(4-(4,4,5,5-tetramethyl-[1,3,2]dioxaborolan-2-yl)phenyl)-N-(4-t-butyl-2,6-dimethylphenyl)-N-phenylamine)

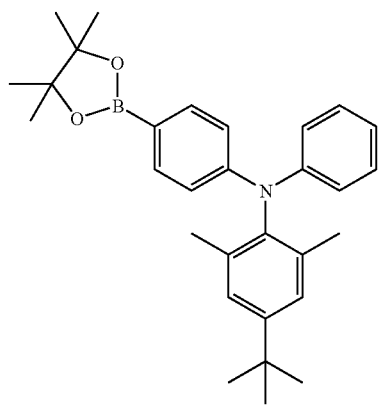

Into a dried, three-necked flask was fed 7.78 g (19.1 mmol) of N-(4-bromophenyl)-N-(4-t-butyl-2,6-dimethylphenyl)-N-phenylamine synthesized as above. The flask inside was purged with argon gas. Thereto were added 76 ml of dehydrated tetrahydrofuran and 191 ml of dehydrated diethyl ether. The mixture was stirred for dissolution. The reaction mixture was cooled to –76° C. Thereto was dropwise added, in 30 minutes, 13.61 ml of a n-hexane solution containing 1.54 mol/l (21.0 mmol) of n-butyllithium, followed by stirring for 0.5 hour. Then, there was dropwise added, at –76° C. in 20 minutes, 5.83 ml (28.6 mmol) of 2-isopropyloxy-4,4,5,5-tetramethyl-[1,3,2]dioxaborolane, followed by stirring for 1 hour. Then, the mixture was heated to room temperature and stirred for 2 hours. The reaction mixture was cooled to 0° C. and dropped into 200 ml of 0.2 N hydrochloric acid in 15 minutes, followed by stirring at room temperature for 15 minutes. The organic layer was separated from the aqueous layer. The aqueous layer was extracted with diethyl ether. Two organic layers were combined and washed with distilled water, a 5% aqueous sodium hydrogen carbonate solution and distilled water in this order. The resulting organic layer was dried over anhydrous sodium sulfate and concentrated to dryness to obtain 9.0 g of a crude product as a light pink solid. 8.6 g of the crude product was dissolved in 17.1 g of tetrahydrofuran at 50° C. Thereto was slowly added 85.6 g of methanol to give rise to crystallization. The crystals were collected by filtration and dried under reduced pressure to 7.6 g of N-(4-(4,4,5,5-tetramethyl-[1,3,2]dioxabolan-2-yl)phenyl)-N-(4-t-butyl-2,6-dimethylphenyl)-N-phenylamine as a white solid. (LC surface percentage: 98.5%, yield: 86.7%) There was contained, as an impurity, N,N-diphenyl-N-(4-t-butyl-2,6-dimethylphenyl)amine in an amount of 1.5% in terms of LC surface percentage.

$^1$H-NMR (300 MHz/CDCl$_3$): δ
1.32 (s, 9H), 1.32 (s, 12H), 2.00 (s, 6H), 6.81-6.98 (m, 3H), 7.01 (d, 2H), 7.09 (s, 2H), 7.15-7.27 (m, 2H), 7.62 (d, 2H)
LC/MS (APPI (+)): [M+H]$^+$ 456

Synthesis of N,N-bis(4-bromophenyl)-N-(4-t-butyl)-2,6-dimethylphenyl)amine

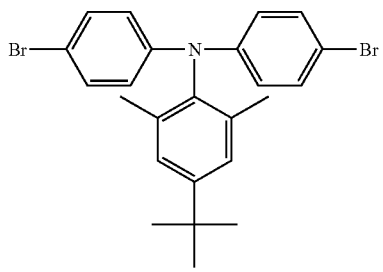

In a 1000-ml, three-necked flask were placed, in an inert atmosphere, 333 ml of dehydrated N,N-dimethylformamide and 166 ml of hexane. Therein was dissolved 29.7 g of N,N-diphenyl-N-(4-t-butyl-2,6-dimethylphenyl)amine synthesized as above. Thereto was dropwise under light shielding and with ice cooling, 100 ml of an N,N-dimethylformamide solution containing 33.6 g of N-bromosuccinimide. A reaction was allowed to take place for 24 hours.

The reaction mixture was concentrated to 200 ml under reduced pressure. 1,000 ml of water was added. The resulting precipitate was collected by filtration. The crystals obtained were recrystallized twice using DMF/ethanol to obtain 23.4 g of a white solid.

$^1$H-NMR (300 MHz/CDCl$_3$): δ (ppm)
1.3 [s, 9H], 2.0 [s, 6H], 6.8 [d, 2H], 7.1 [s, 2H], 7.3 [d, 2H]
MS (APCI (+)): M$^+$ 488

Synthesis Example 2

Synthesis of Compound E, Compound F and Compound G (Synthesis of Compound A)

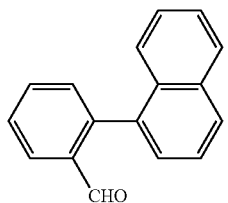

Compound A

In a 300-ml, three-necked flask were placed, in an inert atmosphere, 5.00 g (29 mmol) of 1-naphthaleneboronic acid, 6.46 g (35 mmol) of 2-bromobenzaldehyde, 10.0 g (73 mmol) of potassium carbonate, 36 ml of toluene and 36 ml of deionized water. The mixture was subjected to argon bubbling for 20 minutes at room temperature with stirring. Successively, 16.8 mg (0.15 mmol) of tetrakis(triphenylphosphine) palladium was added. The mixture was subjected to argon bubbling for 10 minutes at room temperature with stirring. The mixture was heated to 100° C. to give rise to a reaction for 25 hours. The reaction mixture was cooled to room temperature and extracted with toluene. The organic layer was dried over sodium sulfate and subjected to distillation to remove the solvent. The residue was purified by silica gel column chromatography using, as a developing solvent, a toluene-cyclohexane (1:2) mixed solvent to obtain 5.18 g (yield: 86%) of a compound A as white crystals.

$^1$H-NMR (300 MHz/CDCl$_3$): δ
7.39-7.62 (m, 5H), 7.70 (m, 2H), 7.94 (d, 2H), 8.12 (dd, 2H), 9.63 (s, 1H)
MS (APCI (+)): (M+H)$^+$ 233

(Synthesis of Compound B)

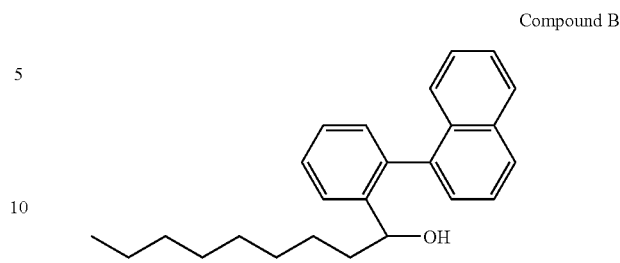

Compound B

In a 300-ml, three-necked flask were placed, in an inert atmosphere, 8.00 g (34.4 mmol) of a compound A synthesized as above and 46 ml of dehydrated THF. They were cooled to −78° C. Successively, 52 ml of n-octyl magnesium bromide (1.0 mol/liter THF solution) was dropwise added in 30 minutes. After the completion of the dropwise addition, the mixture was heated to 0° C., followed by stirring for 1 hour. The resulting mixture was heated to room temperature and stirring was conducted for 45 minutes. The mixture was ice-cooled and 20 ml of 1 N hydrochloric acid was added to complete the reaction. Ethyl acetate was added for extraction and the organic layer was dried over sodium sulfate, followed by distillation to remove the solvent. The residue was purified by silica gel column chromatography using, as the developing solvent, a toluene-hexane (10:1) mixed solvent, to obtain 7.64 g (yield: 64%) of a compound B as a light yellow oil. Two peaks were seen in HPLC measurement but they had the same mass number in LC-MS measurement; therefore, the compound was judged to be a mixture of isomers.

(Synthesis of Compound C)

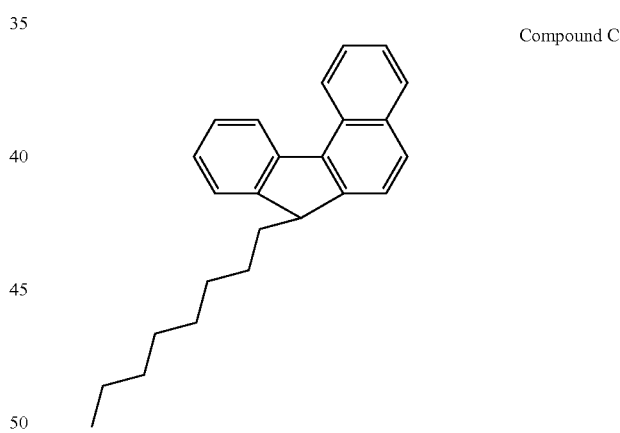

Compound C

In a 500-ml, three-necked flask were placed, in an inert atmosphere, 5.00 g (14.4 mmol) of a compound B (a mixture of isomers) and 74 ml of dehydrated dichloromethane. They were stirred at room temperature for dissolution. Successively, etherate complex of boron trifluoride was dropwise added thereto at room temperature in 1 hour. After the completion of the dropwise addition, stirring was conducted at room temperature for 4 hours. 125 ml of ethanol was added slowly with stirring. When heat generation was over, extraction with chloroform was conducted. The organic layer was washed with water twice and dried over magnesium sulfate. The organic layer was subjected to distillation to remove the solvent. The residue was purified by silica gel column chromatography using hexane as the developing solvent, to obtain 3.22 g (yield: 68%) of a compound C as a colorless oil.

$^1$H-NMR (300 MHz/CDCl$_3$): δ

0.90 (t, 3H), 1.03-1.26 (m, 14H), 2.13 (m, 2H), 4.05 (t, 1H), 7.35 (dd, 1H), 7.46-7.50 (m, 2H), 7.59-7.65 (m, 3H), 7.82 (d, 1H), 7.94 (d, 1H), 8.35 (d, 1H), 8.75 (d, 1H)

MS (APCI (+)): (M+H)$^+$ 329

(Synthesis of Compound D)

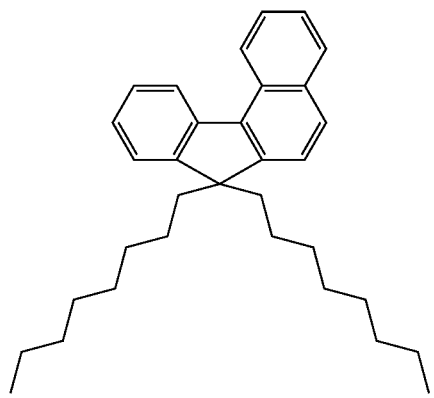

Compound D 20 ml of deionized water was placed in a 200-ml, three-necked flask in an inert atmosphere. 18.9 g (0.47 mol) of sodium hydroxide was added in small portions with stirring. When the aqueous solution reached (dropped to)) room temperature, there were added 20 ml of toluene, 5.17 g (15.7 mmol) of a compound C synthesized as above, and 1.52 g (4.72 mmol) of tributylammonium bromide. The mixture was heated to 50° C. n-Octyl bromide was added dropwise. After the completion of the dropwise addition, a reaction was allowed to take place at 50° C. for 9 hours. After the completion of the reaction, extraction with toluene was conducted. The organic layer was washed with water twice and dried over sodium sulfate. The layer was purified by silica gel column chromatography using hexane as the developing solvent, to obtain 5.13 g (yield: 74%) of a compound D as a yellow oil.

$^1$H-NMR (300 MHz/CDCl$_3$): δ

0.52 (m, 2H), 0.79 (t, 6H), 1.00-1.20 (m, 22H), 2.05 (t, 4H), 7.34 (d, 1H), 7.40-7.53 (m, 2H), 7.63 (m, 3H), 7.83 (d, 1H), 7.94 (d, 1H), 8.31 (d, 1H), 8.75 (d, 1H)

MS (APCI (+)): (M+H)$^+$ 441

(Synthesis of Compound E)

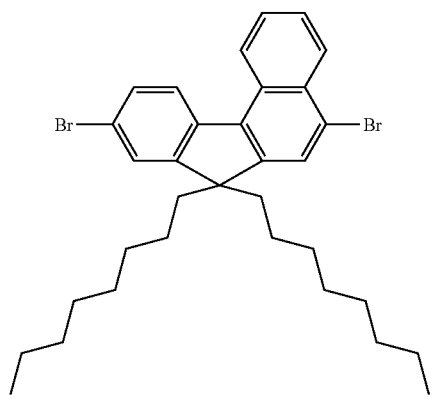

Compound E

In a 50-ml, three-necked flask were placed, in an air atmosphere, 4.00 g (9.08 mmol) of a compound D and 57 ml of a acetic acid:dichloromethane (1:1) mixed solvent. They were stirred at room temperature for dissolution. Successively, 7.79 g (20.0 mmol) of benzyltrimethylammonium tribromide was added. Zinc chloride was added with stirring, until the benzyltrimethylammonium tribromide had been dissolved completely. Stirring was conducted at room temperature for 20 hours, after which 10 ml of a 5% aqueous sodium hydrogen sulfite solution was added for termination of reaction. Extraction with chloroform was conducted. The organic layer was washed with an aqueous potassium carbonate solution twice and dried over sodium sulfate. The layer was purified using a flush column using hexane as the developing solvent, followed by recrystallization from an ethanol-hexane (1:1) mixed solvent and then from an ethanol-hexane (10:1) mixed solvent, to obtain 4.13 g ((yield: 76%) of a compound E as white crystals.

$^1$H-NMR (300 MHz/CDCl$_3$): δ

0.60 (m, 4H), 0.91 (t, 6H), 1.01-1.38 (m, 20H), 2.09 (t, 4H), 7.62-7.75 (m, 4H), 7.89 (s, 1H), 8.20 (d, 1H), 8.47 (d, 1H), 8.72 (d, 1H)

MS (APPI (+)): M$^+$ 596

(Synthesis of Compound F)

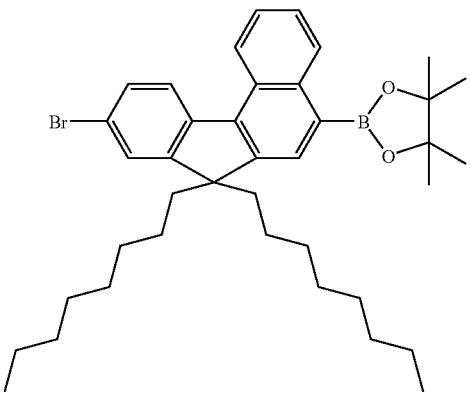

Compound F

Into a 500-ml, three-necked flask were fed, in an argon atmosphere, 11.97 g (20.0 mmol) of a compound E synthesized as above, 200 ml of commercial dehydrated tetrahydrofuran and 200 ml of commercial dehydrated diethyl ether. They were stirred at room temperature for dissolution. The solution was cooled to −78° C. Thereto was dropwise added slowly in 30 minutes 12.99 ml (20.0 mmol) of a hexane solution containing 1.54 mol/l of n-butyllithium. The mixture was stirred at −78° C. for 50 minutes. Thereto was dropwise added in 15 minutes 4.90 ml (24.0 mmol) of 2-isopropoxy-4,4,5,5-tetramethyl-[1,3,2]dioxaborolane. Stirring was conducted at −78° C. for 1 hour. Then, the mixture was heated to room temperature in 1.5 hours. The reaction mass was dropwise added to 200 ml of 2 N hydrochloric acid at room temperature. Stirring was conducted at room temperature for 30 minutes. Then, the oil layer was separated. The aqueous layer was subjected to extraction with 40 ml of diethyl ether and the oil layer was separated. Two oil layers were combined, washed with distilled water, a 5% aqueous sodium hydrogen carbonate solution and distilled water in this order, dried over anhydrous sodium sulfate, and concentrated, to obtain 15.3 g of a crude product as a light yellow oily matter. The oily matter was dissolved in tetrahydrofuran. Into the solution was dropped methanol for crystallization. The dissolution and crystallization was repeated three times to obtain 11.0 g (yield: 85%) of a compound F as white crystals.

$^1$H-NMR (270 MHz/CDCl$_3$): δ

0.40-0.60 (m, 4H), 0.80 (t, 6H), 0.90-1.20 (m, 20H), 1.45 (s, 12H), 1.94-2.17 (m, 4H), 7.54-7.64 (m, 4H), 8.03 (s, 1H), 8.19 (d, 1H), 8.66 (d, 1H), 8.92 (d, 1H)

MS (APPI (+)): M+ 644

(Synthesis of Compound G)

Compound G

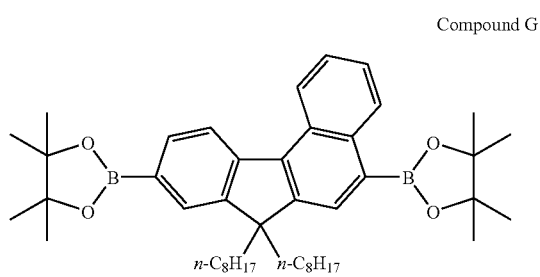

A 100-ml, four-necked round bottom flask was purged with argon gas. Thereinto were fed 3.2 g (5.3 mmol) of a compound E synthesized as above, 3.8 g (14.8 mmol) of bispinacolate diboron, 0.39 g (0.45 mmol) of PdCl$_2$ (dppf), 0.27 g (0.45 mmol) of bis(diphenylphosphino)ferrocene and 3.1 g (32 mmol) of potassium acetate. 45 ml of dehydrated dioxane was added. In an argon atmosphere, the mixture was heated to 100° C. to give rise to a reaction for 36 hours. After natural cooling, filtration was conducted using a filter precoated with 2 g of Celite. The filtrate was concentrated to obtain a black liquid. The black liquid was dissolved in 50 g of hexane and filtered through active carbon to remove color components, to obtain 37 g of a light yellow liquid [during filtration, 5 g of Radiolite (a product of Showa Kagaku Kogyo K.K.) was precoated]. There were added 6 g of ethyl acetate, 12 g of dehydrated methanol and 2 g of hexane. The mixture was immersed in a dry ice-methanol bath to obtain 2.1 g of a compound G as colorless crystals.

Synthesis Example 3

Synthesis of Polymer 1

In a one-liter, three-necked flask connected with a Dimroth condenser were placed, in an argon atmosphere, 10.0 g (15.5 mmol) of a compound F synthesized as above, 173.9 mg of palladium acetate and 435.1 mg of tricyclohexylphosphine. The, the flask inside was purged with argon gas. Thereto were added 620 ml of toluene and 8.6 g of n-octylbenzene (internal standard substance). The mixture was stirred at 110° C. for 10 minutes. Into this monomer solution was poured 80 ml of a 20 wt. % aqueous tetraethylammonium hydroxide solution, followed by stirring at 110° C. for 16 hours. After the disappearance of compound F was confirmed by liquid chromatography, the mixture was cooled to room temperature. The organic layer was separated from the aqueous layer and concentrated to about 200 ml. To the concentrate was added 1.8 liters of ethanol to precipitate a polymer. The precipitate was collected by filtration and vacuum-dried to obtain a powder. The powder was dissolved in toluene. The solution was passed through a silica gel column and an alumina column and then dried to obtain a powder. The powder was dissolved in 130 ml of chloroform. The solution was dropwise added to 1.5 liters of ethanol to precipitate a polymer. The precipitate was collected by filtration and dried to obtain 6.4 g (yield: 94.1%) of a polymer (hereinafter referred to as polymer 1). The polystyrene-reduced, number-average molecular weight and weight-average molecular weight thereof were Mn=1.5×10$^4$ and Mw=3.1×10$^4$, respectively (GPC measurement method B).

$^1$H-NMR (300 MHz/CDCl$_3$): δ

0.83 (bs), 1.16 (bs), 2.19 (bs), 7.3-9.1 (m) Integral ratio was (proton derived from alkyl group)/(proton derived from aryl group)=4.19.

The polymer 1 comprises a repeating unit (formula P-1).

(P-1)

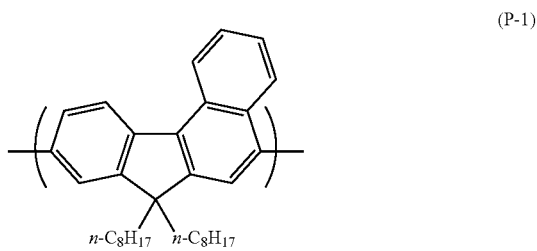

Synthesis Example 4

Synthesis of Polymer 2

Bromination of Polymer 1

Into a 50-ml flask were fed, in an argon atmosphere, 400 mg (0.912 mmol in terms of benzofluorene repeating unit) and 20 ml of chloroform. Stirring was conducted at room temperature for dissolution. Then, there were fed 1.40 ml of trifluoroacetic acid and 19.6 µl (0.38 mmol, 42 mol % relative to benzofluorene unit) in this order. Stirring was conducted for 16 hours under light shielding. The reaction mass was dropwise added to 200 ml of methanol with stirring, to give rise to precipitation. The precipitate was collected by filtration, washed with methanol, and vacuum-dried to obtain 405 mg of a polymer. The polymer is called polymer 2. The number-average molecular weight Mn, weight-average molecular weight Mw, peak top molecular weight Mp (all reduced to polystyrene) and dispersion degree Mw/Mn of the polymer 2 were 1.5×10$^4$, 3.2×10$^4$, 3.3×10$^4$ and 2.1, respectively (GPC measurement method B).

From the result of elemental analysis, the ratio of Br group-containing repeating unit (formula P-2) and Br group-free repeating unit (formula P-1) corresponds to (P-1)/(P-2)=62/38 and corresponds to (total benzofluorene repeating units)/Br group=73/27.

Elemental analysis (measured): C 84.33%, H 8.82%, N<0.3%, Br 6.49%

Elemental analysis (calculated): C 84.55%, H 8.96%, N 0%, Br 6.49% [calculated at (P-1)/(P-2)=62/38)

From the result of $^1$H-NMR measurement, there was no change in the peak derived from proton of alkyl group of higher magnetic field side; there was change in the peak derived from proton of aryl group of low magnetic field side; there was a reduction in integral ratio of aryl group proton to alkyl group proton; Br group was introduced into the aromatic ring portion of benzofluorene.

$^1$H-NMR (300 MHz, CDCl$_3$): δ

0.83 (bs), 1.16 (bs), 2.19 (bs), 7.3-9.3 (m) Integral ratio was (proton derived from alkyl group)/(proton derived from aryl group)=4.40.

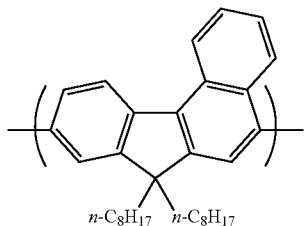

(P-1)

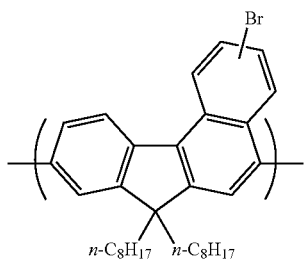

(P-2)

Example 1

Synthesis of Aromatic Polymer 1

Into a 50-ml flask were fed a polymer 2 (150 mg, 0.322 mmol in terms of benzofluorene repeating unit), N-(4-(4,4,5,5-tetramethyl-[1,3,2]dioxoborolan-2-yl)phenyl)-N-(4-t-butyl-2,6-dimethylphenyl)-N-phenylamine (100 mg, 0.22 mmol), palladium (II) acetate (1.23 mg, 0.005 mmol) and tricyclohexylphosphine (3.07 mg, 0.011 mmol). The flask inside was purged with argon gas. 18.6 ml of commercial dehydrated toluene was fed thereinto. The mixture was stirred at room temperature for dissolution. The solution was heated to 110° C. and an aqueous tetraethylammonium hydroxide solution (1.4 mol/l, 0.49 ml, 0.68 mmol) was fed thereinto. The mixture was stirred at 110° C. for 2.5 hours. The reaction mixture was cooled to room temperature. 7.5 ml of distilled water was added for washing. The organic layer was concentrated. The concentrate was dissolved in chloroform. The solution was dropped into acetone for precipitation. The precipitate was collected by filtration, washed with acetone, and dried under reduced pressure to obtain 160 mg of a crude polymer. The number-average molecular weight Mn, weight-average molecular weight Mw, peak top molecular weight Mp (all reduced to polystyrene), and dispersion degree Mw/Mn of the crude polymer were $2.2 \times 10^4$, $3.8 \times 10^4$, $3.7 \times 10^4$ and 1.8, respectively (GPC measurement method B).

146 mg of the crude polymer was dissolved in 30 ml of toluene at room temperature. The solution was passed through a silica gel column and an alumina column (toluene had been passed through these columns); the two columns were washed with toluene; the resulting solution and the washing were combined and concentrated. The concentrate was dissolved in chloroform. The solution was dropped into methanol for precipitation. The precipitate was collected by filtration, washed with methanol, and dried under reduced pressure to obtain 145 mg of a polymer. The polymer is called aromatic polymer 1. The number-average molecular weight Mn, weight-average molecular weight Mw, peak top molecular weight Mp (all reduced to polystyrene), and dispersion degree Mw/Mn of the aromatic polymer 1 were $2.0 \times 10^4$, $3.7 \times 10^4$, $3.5 \times 10^4$ and 1.8, respectively (GPC measurement method B).

From the result of elemental analysis, the ratio of repeating unit (formula P-1), Br group-containing repeating unit (formula P-2) and substituent group-containing repeating unit (formula P-3) corresponds to (P-1)/(P-2)/(P-3)=75/0/25 and the ratio of benzofluorene repeating unit and substituent group corresponds to benzofluorene/substituent group=80/20.

Elemental analysis (measured): C 89.86%, H 9.22%, N 0.68%, Br<0.1%

Elemental analysis (calculated): C 89.97%, H 9.35%, N 0.68%, Br 0% [calculated at (P-1)/(P-2)/(P-3)=75/0/25]

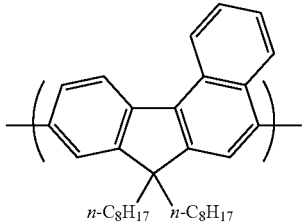

(P-1)

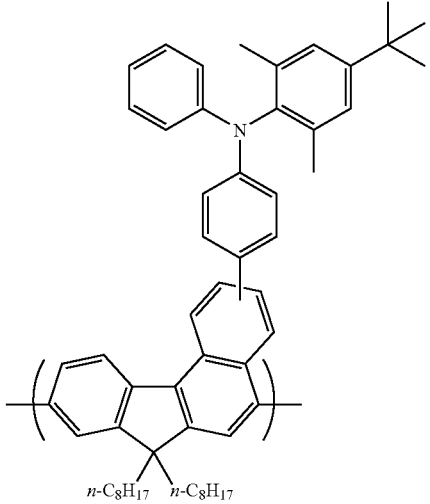

(P-3)

Synthesis Example 5

Synthesis of Polymer 3

In a 200-ml flask connected with a Dimroth condenser were placed, in an argon atmosphere, 37.7 g (63 mmol) of a compound E synthesized in the same manner as in Synthesis Example 2 and 43.6 g (63 mmol) of a compound G. 70 mL of toluene was added for dissolution. Argon gas was bubbled for degassing. Thereto were added 42 mg of palladium acetate and 266 mg of tris(o-methoxyphenyl)phosphine. 283.4 ml of an aqueous bis(tetraethylammonium)carbonate solution (33 wt. %) was dropwise added with heating and refluxing was conducted for 24 hours. 10.8 g of bromobenzene was added and refluxing was conducted for 1 hour. Then, 8.9 g of phenylboronic acid was added and refluxing was conducted for 1 hour. The oily layer was washed with a 2 N aqueous hydrochloric acid solution (twice), a 10% aqueous acetic acid solution (twice) and water (six times), filtered through Celite, and concentrated under reduced pressure. The concentrate was dropwise added to methanol for precipitation. The solid obtained was collected by filtration and dried under reduced pressure. Then, there were conducted dissolution in toluene, dropwise addition to methanol for precipitation, and drying under reduced pressure; this operation was conducted twice to obtain 22.4 g of a polymer (hereinafter called polymer 3). The number-average molecular weight Mn and weight-average molecular weight (both reduced to polystyrene) of the polymer 3 were $7.3 \times 10^4$ and $1.8 \times 10^5$, respectively (GPC measurement method C).

The polymer 3 comprises a repeating unit (formula P-1)

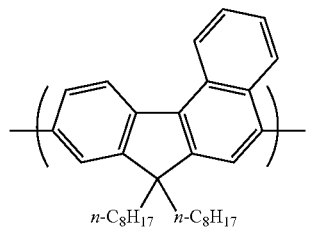

(P-1)

Synthesis Example 6

Synthesis of Polymer 4

Bromination of Polymer 3

Into a 500-ml flask were fed, in an argon atmosphere, a polymer 3 (5.00 g, 11.4 mmol in terms of benzofluorene repeating unit) and 150 ml of chloroform. They were stirred at room temperature for dissolution. Then, there were fed 17.6 ml of trifluoroacetic acid and 236 µl (4.6 mmol, 40 mol % relative to benzofluorene unit) of bromine in this order. Stirring was conducted for 24 hours under light shielding. The reaction mass was dropwise added to 1,250 ml of methanol for precipitation. The precipitate was collected by filtration, washed with methanol and dried under reduced pressure, to obtain 5.29 g f a polymer. The polymer is called polymer 4. The number-average molecular weight Mn, weight-average molecular weight Mw, peak top molecular weight Mp (all reduced to polystyrene) and dispersion degree Mw/Mn of the polymer 4 were $7.5 \times 10^4$, $1.6 \times 10^5$, $1.2 \times 10^5$ and 2.1, respectively (GPC measurement method C).

From the result of elemental analysis, the ratio of Br group-containing repeating unit (formula P-2) and Br group-free repeating unit (formula P-1) corresponds to (P-1)/(P-2)=61/39 and corresponds to (total benzofluorene repeating units)/Br group=72/28.

Elemental analysis (measured): C 84.93%, H 9.06%, N<0.3%, Br 6.57%

Elemental analysis (calculated): C 84.48%, H 8.94%, N 0%, Br 6.57% [calculated at (P-1)/(P-2)=61/39)

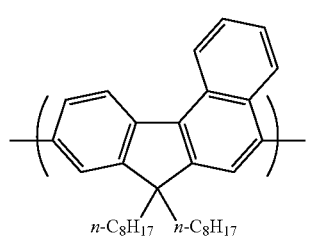

(P-1)

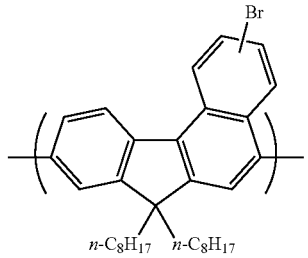

(P-2)

Example 2

Synthesis of Aromatic Polymer 2

Into a 100-ml flask were fed 600 mg of a polymer 4, 147 mg of N-(4-(4,4,5,5-tetramethyl-[1,3,2]dioxaborolan-2-yl)phenyl)-N-(4-t-butyl-2,6-dimethylphenyl)-N-phenylamine, 0.96 mg of palladium (II) acetate and 2.40 mg of tricyclohexylphosphine. The flask inside was purged with argon gas. Then, 72 ml of commercial dehydrated toluene was added. The mixture was stirred at room temperature for dissolution. The solution was heated to 110° C. and 1.55 ml of an aqueous tetraethylammonium hydroxide (1.4 M) solution was added, followed by stirring at 110° C. for 3 hours. The heating was terminated once and there were fed 336 mg of 4-(4,4,5,5-tetramethyl-[1,3,2]dioxaborolan-2-yl)butylbenzene, 1.00 mg of palladium (II) acetate, 2.43 mg of tricyclohexylphosphine and 1.55 ml of an aqueous tetraethylammonium hydroxide (1.4 M) solution. The mixture was heated to 110° C., followed by stirring for 3 hours. The reaction mixture was returned to room temperature and diluted with 30 ml of toluene for phase separation. The organic layer was washed with 36 ml of a 15% aqueous sodium chloride solution twice and then passed through a filter precoated with 6 g of Radiolite (a product of Showa Kagaku Kogyo K.K.). The filter was washed with 36 ml of toluene. The filtrate and the washing were combined and concentrated. The concentrate was dropwise added to acetone for precipitation. The precipitate was collected by filtration, washed with acetone and dried under reduced pressure to obtain 630 mg of a crude polymer.

630 mg of the crude polymer was dissolved in 130 ml of toluene at room temperature. The solution was passed through a silica gel column and an alumina column (toluene had been passed through these columns). The two columns were washed with toluene. The resulting solution and the washing were combined, washed with 3% ammonia water and distilled water (twice), and concentrated under reduced pressure. The concentrate was dropwise added to methanol for precipitation. The precipitate was collected by filtration, washed with methanol, and dried under reduced pressure to obtain 627 mg of a polymer.

The polymer is called aromatic polymer 2. The number-average molecular weight Mn, weight-average molecular weight Mw, peak top molecular weight Mp (all reduced to polystyrene), and dispersion degree Mw/Mn of the aromatic polymer 2 were $8.3 \times 10^4$, $1.6 \times 10^5$, $1.3 \times 10^5$ and 1.9, respectively (GPC measurement method C).

From the result of elemental analysis, the ratio of repeating unit (formula P-1), Br group-containing repeating unit (formula P-2) and substituent group-containing repeating unit (P-3) corresponds to (P-1)/(P-2)/(P-3)=82/0/18 and the ratio of benzofluorene repeating unit and substituent group corresponds to benzofluorene/side chain=85/15.

Elemental analysis (measured): C 90.46%, H 9.18%, N 0.49%, Br<0.1%

Elemental analysis (calculated): C 90.08%, H 9.43%, N 0.49%, Br 0% [calculated at (P-1)/(P-2)/(P-3)=82/0/18]

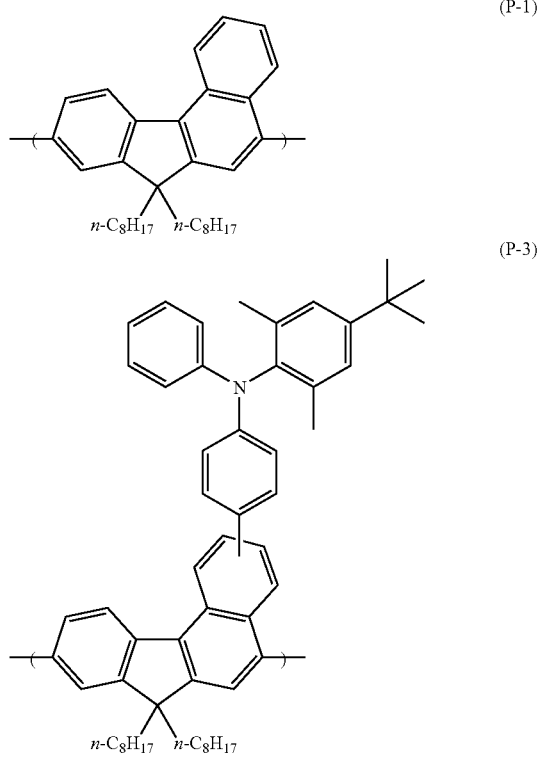

Synthesis Example 7

Synthesis of Polymer 5

Bromination of Polymer 3

Into a 100-ml flask were fed, in an argon atmosphere, a polymer 3 (1.0 g, 2.28 mmol in terms of benzofluorene repeating unit) and 50 ml of chloroform. They were stirred at room temperature for dissolution. Then, there were fed 3.5 ml of trifluoroacetic acid and 91 µl (1.78 mmol, 78 mole % relative to benzofluorene unit) of bromine in this order, followed by stirring for 6 hours under light shielding. The reaction mass was dropwise added to 250 ml of methanol with stirring, for precipitation. The precipitate was collected by filtration, washed with methanol, and dried under reduced pressure to obtain 1.09 g of a polymer. The polymer was fed into a 100-ml flask in an argon atmosphere. Thereinto was fed 50 ml of chloroform, followed by stirring at room temperature for dissolution. Then, there were fed 3.4 ml of trifluoroacetic acid and 41 µl (0.80 mmol, 36 mole % relative to benzofluorene unit) of bromine in this order, followed by stirring for 17 hours under light shielding. The reaction mass was dropwise added to 250 ml of methanol with stirring, for precipitation. The precipitate was collected by filtration, washed with methanol, and dried under reduced pressure to obtain 1.08 g of a polymer. The polymer is called polymer 5. The number-average molecular weight Mn, weight-average molecular weight Mw, peak top molecular weight Mp (all reduced to polystyrene) and dispersion degree Mw/Mn of the polymer 5 were $7.4 \times 10^4$, $1.6 \times 10^5$, $1.3 \times 10^5$ and 2.2, respectively.

From the result of elemental analysis, the ratio of Br group-containing repeating unit (formula P-2) and Br group-free repeating unit (formula P-1) corresponds to (P-1)/(P-2)=35/65 and corresponds to (total benzofluorene repeating units)/Br group=61/39.

Elemental analysis (measured): C 80.20%, H 8.40%, N<0.3%, Br 10.56%

Elemental analysis (calculated): C 80.92%, H 8.51%, N 0%, Br 10.56% [calculated at (P-1)/(P-2)=35/65)

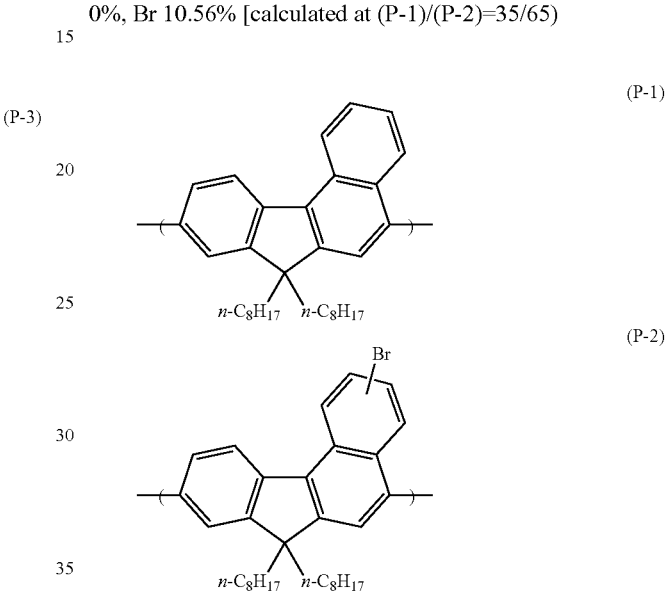

Example 3

Synthesis of Aromatic Polymer 3

Into a 100-ml flask were fed 200 mg of a polymer 5, 180 mg of N-(4-(4,4,5,5-tetramethyl-[1,3,2]dioxaborolan-2-yl)phenyl)-N-(4-t-butyl-2,6-dimethylphenyl)-N-phenylamine, 0.89 mg of palladium (II) acetate and 2.22 mg of tricyclohexylphosphine. The flask inside was purged with argon gas. 24 ml of commercial dehydrated toluene was fed thereinto. The mixture was stirred at room temperature for dissolution. The solution was heated to 110° C., after which 1.41 ml of an aqueous tetraethylammonium hydroxide (1.4 M) solution was fed thereinto. Stirring was conducted at 110° C. for 3 hours. The heating was stopped once and there were fed 106 mg of 4-(4,4,5,5-tetramethyl-[1,3,2]dioxaborolan-2-yl)butylbenzene, 0.89 mg of palladium (II) acetate, 2.22 mg of tricyclohexylphosphine and 1.41 ml of an aqueous tetraethylammonium hydroxide (1.4 M) solution. The mixture was heated to 110° C., followed by stirring for 3 hours. The reaction mixture was cooled to room temperature and then diluted with 10 ml of toluene for phase separation. The organic layer was washed with 12 ml of a 15% aqueous sodium chloride solution twice and passed through a filter precoated with 2 g of Radiolite (a product of Showa Kagaku Kogyo K.K.). The filter was washed with 12 ml of toluene. The filtrate and the washing were combined and concentrated. The concentrate was poured into acetone for precipitation. The precipitate was collected by filtration, washed with acetone and dried under reduced pressure to obtain 251 mg of a crude polymer.

250 mg of the crude polymer was dissolved in 60 ml of toluene at room temperature. The solution was passed through a silica gel column and an alumina column (toluene had been passed through these columns). The two columns were washed with toluene. The resulting solution and the washing were combined, washed with 3% ammonia water and distilled water (twice), and concentrated under reduced pressure. The concentrate was dropwise added to methanol for precipitation. The precipitate was collected by filtration, washed with methanol, and dried under reduced pressure to obtain 213 mg of a polymer.

The polymer is called aromatic polymer 3. The number-average molecular weight Mn, weight-average molecular weight Mw, peak top molecular weight Mp (all reduced to polystyrene), and dispersion degree Mw/Mn of the aromatic polymer 3 were $8.7 \times 10^4$, $1.6 \times 10^5$, $1.3 \times 10^5$ and 1.9, respectively (GPC measurement method C).

From the result of elemental analysis, the ratio of repeating unit (formula P-1), Br group-containing repeating unit (formula P-2) and substituent group-containing repeating unit (P-3) corresponds to (P-1)/(P-2)/(P-3)=49/0/51 and the ratio of benzofluorene repeating unit and substituent group corresponds to benzofluorene/side chain=66/34.

Elemental analysis (measured): C 89.56%, H 8.95%, N 1.17%, Br<0.1%

Elemental analysis (calculated): C 89.71%, H 9.12%, N 1.17%, Br 0% [calculated at (P-1)/(P-2)/(P-3)=49/0/51]

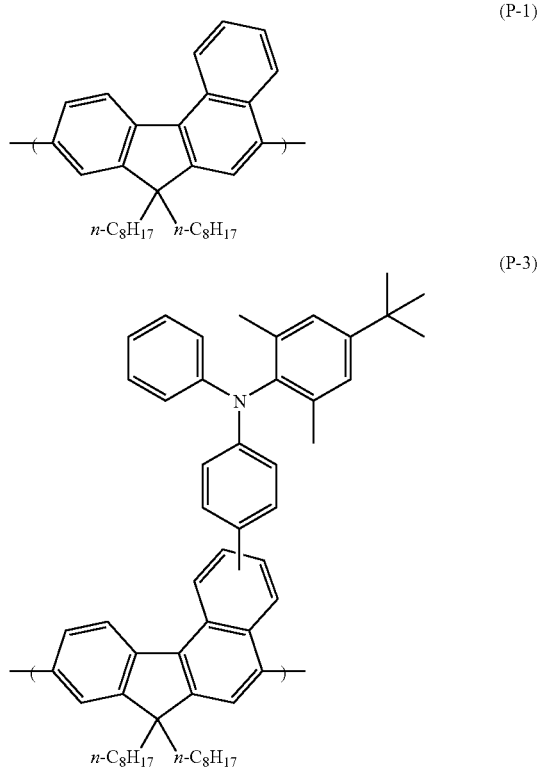

Synthesis Example 8

Synthesis of Compound I (Synthesis of Compound H)

There were fed, in an argon atmosphere, 6.63 g (40.0 mmol) of 9H-carbazole, 0.09 g (0.4 mmol) of palladium (II) acetate, 16.5 g (119 mmol) of potassium carbonate and 10.0 g (43.6 mmol) of 4-trimethylsilylbromobenzene. They were heated to 120° C., followed by stirring for 12 hours. In the middle of stirring and at the 3rd, 6th and 9th hours, each 1.0 g of 4-trimethylsilylbromobenzene was added additionally. The reaction mass was diluted with xylene. The resulting mixture was washed with distilled water, dried over anhydrous magnesium sulfate, and concentrated under reduced pressure. The concentrate was subjected to recrystallization from chloroform-methanol and then from ethyl acetate-methanol to obtain 5.25 g (yield: 41%) of a compound H as light gray crystals.

$^1$H-NMR (300 MHz, CDCl$_3$) δ (ppm)

0.35 (s, 9H), 7.23-7.29 (m, 2H), 7.35-7.45 (m, 4H), 7.53 (d, J=8.0 Hz, 2H), 7.72 (d, J=8.0 Hz, 2H), 8.12 (d, J=7.7 Hz, 2H)

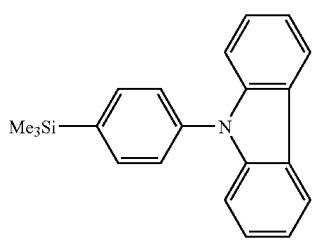

Compound H (Synthesis of Compound I)

In an argon atmosphere, a solution obtained by dissolving 5.00 g (15.9 mmol) of a compound H in 100 ml of dichloromethane was cooled to 0° C. Thereto was dropwise added, in 20 minutes, 32.0 ml of a dichloromethane solution containing 1.0 M of boron tribromide. The mixture was stirred at 0° C. for 3.5 hours. The mixture was subjected to distillation under reduced pressure to remove the solvent. To the residue were added 160 ml of ethyl acetate and 6.74 g of pinacol. The mixture was stirred at room temperature for 1 hour, then washed with distilled water, a 5% aqueous sodium hydrogen carbonate solution and distilled water in this order, dried over anhydrous magnesium sulfate, and concentrated under reduced pressure. To the concentrate was added methanol to precipitate a solid. The solid was collected by filtration and dried under reduced pressure to obtain 5.0 g of a compound I.

$^1$H-NMR (300 MHz, CDCl$_3$) δ (ppm)

1.39 (s, 12H), 7.24-7.30 (m, 2H), 7.36-7.46 (m, 4H), 7.58 (d, J=8.2 Hz, 2H), 8.05 (d, J=8.2 Hz, 2H), 8.12 (d, J=7.8 Hz, 2H)

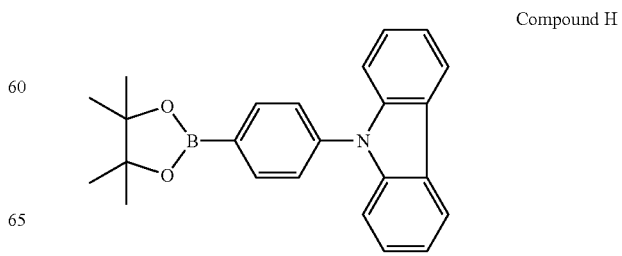

Compound H

Example 4

Synthesis of Aromatic Polymer 4

Into a 100-ml flask were fed 300 mg of a compound 4, 55.5 mg of a compound I, 0.55 mg of palladium (II) acetate and 1.38 mg of tricyclohexylphosphine. The flask inside was purged with argon gas. Then, 36 ml of commercial dehydrated toluene was fed thereinto. The mixture was stirred at room temperature for dissolution. The solution was heated to 110° C. and then there was fed 0.88 ml of an aqueous tetraethylammonium hydroxide (1.4 M) solution, followed by stirring at 110° C. for 3 hours. The heating was stopped once, and there were fed 167 mg of 4-(4,4,5,5-tetramethyl-[1,3,2] dioxaborolan-2-yl)butylbenzene, 0.55 mg of palladium (II) acetate, 1.40 mg of tricyclohexylphosphine and 0.88 ml of an aqueous tetraethylammonium hydroxide (1.4 M) solution. The mixture was heated to 110° C., followed by stirring for 3 hours. The reaction mixture was returned to room temperature and diluted with 15 ml of toluene for phase separation. The organic layer was washed with 20 ml of a 15% aqueous sodium chloride solution twice and then passed through a filter precoated with 3 g of Radiolite (a product of Showa Kagaku Kogyo K.K.). The filter was washed with 20 ml of toluene. The filtrate and the washing were combined and concentrated. The concentrate was dropwise added to acetone for precipitation. The precipitate was collected by filtration, washed with acetone and dried under reduced pressure to obtain 309 mg of a crude polymer.

309 mg of the crude polymer was dissolved in 60 ml of toluene at room temperature. The solution was passed through a silica gel column and an alumina column (toluene had been passed through these columns). The two columns were washed with toluene. The resulting solution and the washing were combined, washed with 3% ammonia water and distilled water (twice), and concentrated under reduced pressure. The concentrate was dropwise added to methanol for precipitation. The precipitate was collected by filtration, washed with methanol, and dried under reduced pressure to obtain 293 mg of a polymer.

The polymer is called aromatic polymer 4. The number-average molecular weight Mn, weight-average molecular weight Mw, peak top molecular weight Mp (all reduced to polystyrene), and dispersion degree Mw/Mn of the aromatic polymer 4 were $8.7 \times 10^4$, $1.8 \times 10^5$, $1.4 \times 10^5$ and 2.1, respectively (GPC measurement method C).

From the result of elemental analysis, the ratio of repeating unit (formula P-1), Br group-containing repeating unit (formula P-2) and substituent group-containing repeating unit (P-4) corresponds to (P-1)/(P-2)/(P-4)=83/0/17 and the ratio of benzofluorene repeating unit and substituent group corresponds to benzofluorene/substituent group=86/14.

Elemental analysis (measured): C 89.49%, H 9.00%, N 0.50%, Br<0.1%

Elemental analysis (calculated): C 90.28%, H 9.22%, N 0.50%, Br 0% [calculated at (P-1)/(P-2)/(P-4)=83/0/17]

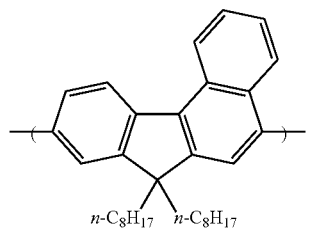

(P-1)

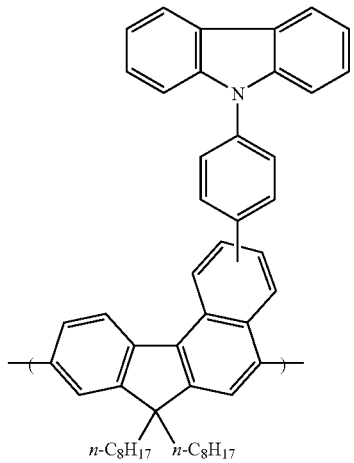

(P-4)

Synthesis Example 9

Synthesis of polymer 6

Condensation polymerization of 2,7-dibromo-9,9-n-octylfluorene and 2,7-dibromo-9,9-bis(3-methylbutyl)fluorene>

In 1,600 ml of dehydrated tetrahydrofuran were dissolved 26.3 g of 2,7-dibromo-9,9-di-n-octylfluorene, 5.6 g of 2,7-dibromo-9,9-bis(3-methylbutyl)fluorene and 22 g of 2,2'-bipyridyl. Nitrogen bubbling was conducted to purge the system inside with nitrogen. To the resulting solution was added, in a nitrogen atmosphere, 40.66 g of bis(1,5-cyclooctadiene)nickel(0) {Ni(COD)$_2$}. The mixture was heated to 60° C. and a reaction was allowed to take place for 8 hours with stirring. After the completion of the reaction, the reaction mixture was cooled to room temperature (about 25° C.) and was dropwise added to a mixed solution comprising 1,200 ml of 25% ammonia water, 1,200 ml of methanol and 1,200 ml of deionized water. Stirring was conducted for 0.5 hour. Then, the resulting precipitate was collected by filtration, dried under reduced pressure for 2 hours, and dissolved in 1,110 ml of toluene. The solution was filtered. To the filtrate was added toluene to obtain a solution of about 2,800 ml. The solution was washed with 2,000 ml of a 1 N aqueous hydrochloric acid solution for 1 hour, with 2,200 ml of 4% ammonia water for 1 hour, with 1,000 ml of deionized water for 10 minutes, and further with 1,000 ml of deionized water for 10 minutes. The resulting solution was concentrated into 592 g under reduced pressure at 50° C. The concentrate was dropwise added to 3,330 ml of methanol, followed by stirring for 0.5 hour. The resulting precipitate was collected by filtration, washed with 500 ml of methanol twice, and dried under reduced pressure at 50° C. for 5 hours to obtain a copolymer. The yield of the copolymer was 12.6 g. This copolymer is called polymer 6. The number-average molecular weight Mn and weight-average molecular weight Mw (both reduced to polystyrene) were $8.4 \times 10^4$ and $1.6 \times 10^5$, respectively (GPC analytical method C). The polymer 5 comprises a combination of repeating units (formula P-6) and the ratio of 9,9-di-n-octylfluorene repeating unit and 9,9-bis(3-methylbutyl)fluorene repeating unit, estimated from the ratio of raw materials fed is 80:20.

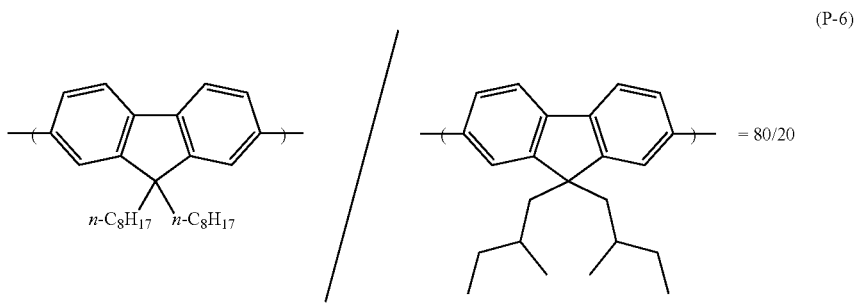

Synthesis Example 10

Synthesis of Polymer 7

Bromination of Polymer 6

Into a 200-ml flask were fed, in an argon atmosphere, a polymer 5 (2.00 g, 5.38 mmol in terms of fluorene repeating unit) and 100 ml of chloroform. They were stirred at room temperature for dissolution. Into the solution were fed 8.3 ml of trifluoroacetic acid and 104 μl (2.05 mmol, 38 mol % relative to fluorene repeating unit) in this order, followed by stirring for 20 hours under light shielding. The reaction mass was dropwise added to 500 ml of methanol with stirring, for precipitation. The precipitate was collected by filtration, washed with methanol, and dried under reduced pressure to obtain 2.17 g of a polymer. The polymer is called polymer 7. The number-average molecular weight Mn, weight-average molecular weight Mw, peak top molecular weight Mp (all reduced to polystyrene), and dispersion degree Mw/Mn of the polymer 7 were $9.2 \times 10^4$, $1.7 \times 10^5$, $1.4 \times 10^5$ and 1.90, respectively (GPC measurement method C).

From the result of elemental analysis, the of combination of Br group-containing repeating units (formula P-7) and combination of Br group-free repeating units (formula P-6) corresponds to (P-6)/(P-7)=63/37 and corresponds to (total fluorene repeating unit)/Br group=73/27.

Elemental analysis (measured): C 82.48%, H 9.25%, N<0.3% Br 7.44%

Elemental analysis (calculated): C 83.21%, H 9.35%, N 0%, Br 7.44% [calculated at (P-6)/(P-7=63/37]

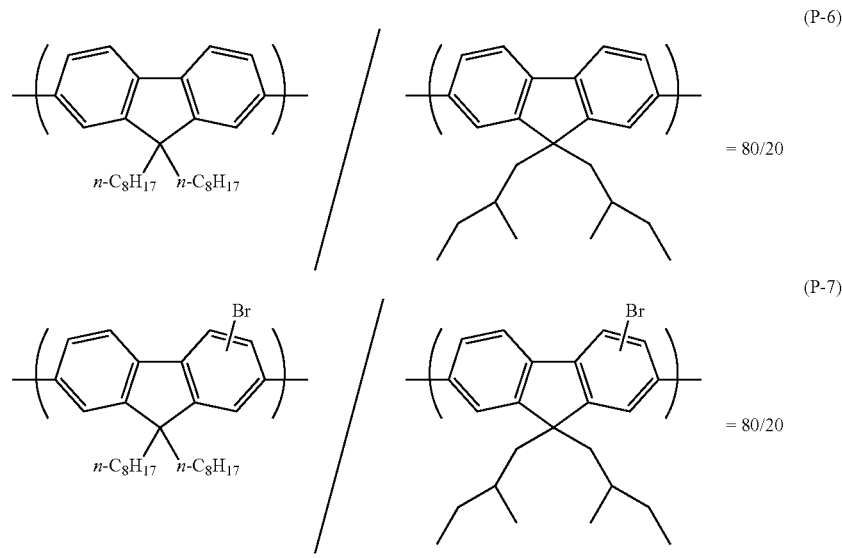

Example 5

Synthesis of Aromatic Polymer 5

Into a 100-ml flask were fed 300 mg of a polymer 7, 62.0 mg of N-(4-(4,4,5,5-tetramethyl-[1,3,2]dioxaborolan-2-yl)phenyl)-N-(4-t-butyl-2,6-dimethylphenyl)-N-phenylamine, 0.65 mg of palladium (II) acetate and 1.58 mg of tricyclohexylphosphine. The flask inside was purged with argon gas. Thereinto was fed 72 ml of commercial dehydrated toluene, followed by stirring at room temperature for dissolution. To the solution was added 1.00 ml of an aqueous tetraethylammonium hydroxide (1.4 M) solution. The mixture was heated to 110° C. and stirring was conducted at 110° C. for 3 hours. The heating was stopped once and there were fed 196.3 mg of 4-(4,4,5,5-tetramethyl-[1,3,2]dioxaborolan-2-yl)butyltoluene, 0.63 mg of palladium (II) acetate, tricyclohexylphosphine and 1.00 ml of an aqueous tetraethylammonium hydroxide (1.4 M) solution. The mixture was heated to 110° C. and stirring was conducted for 3 hours. The reaction mixture was cooled to room temperature and then diluted with 15 ml of toluene for phase separation. The resulting organic layer was washed with 20 ml of a 15% aqueous sodium chloride solution twice and passed through a filter precoated with 3 g of Radiolite (a product of Showa Kagaku Kogyo K.K.). The filter was washed with 20 ml of toluene. The resulting solution and the washing were combined and concentrated. The concentrate was dropwise added to acetone for precipitation. The precipitate was collected by filtration, washed with acetone, and dried under reduced pressure to obtain 278 mg of a crude polymer.

277 mg of the crude polymer was dissolved in 60 ml of toluene at room temperature. The solution was passed through a silica gel column and an alumina column (toluene had been passed through these two columns). The two columns were washed with toluene. The resulting solution and the washing were combined and washed with 3% ammonia water and distilled water (twice), and concentrated under reduced pressure. The concentrate was dropwise added to methanol for precipitation. The precipitate was collected by filtration, washed with methanol, and dried under reduced pressure to obtain 259 mg of a polymer.

The polymer is called aromatic polymer 5. The number-average molecular weight Mn, weight-average molecular weight Mw, peak top molecular weight Mp (all reduced to polystyrene), and dispersion degree Mw/Mn of the aromatic polymer 5 were $9.2 \times 10^4$, $1.7 \times 10^5$, $1.4 \times 10^5$ and 1.9, respectively (GPC measurement method C).

The aromatic polymer 4 comprises a combination of repeating units represented by formula (P-6) and a combination of repeating units represented by formula (P-8), and, from the result of elemental analysis, the ratio thereof corresponds to (P-6)/(P-8)=94/6.

Elemental analysis (measured): C 89.36%, H 9.92%, N 0.24%, Br<0.1%

Elemental analysis (calculated): C 88.71%, H 11.05%, N 0.24%, Br 0% (calculated at (P-6)/(P-8)=94/6)

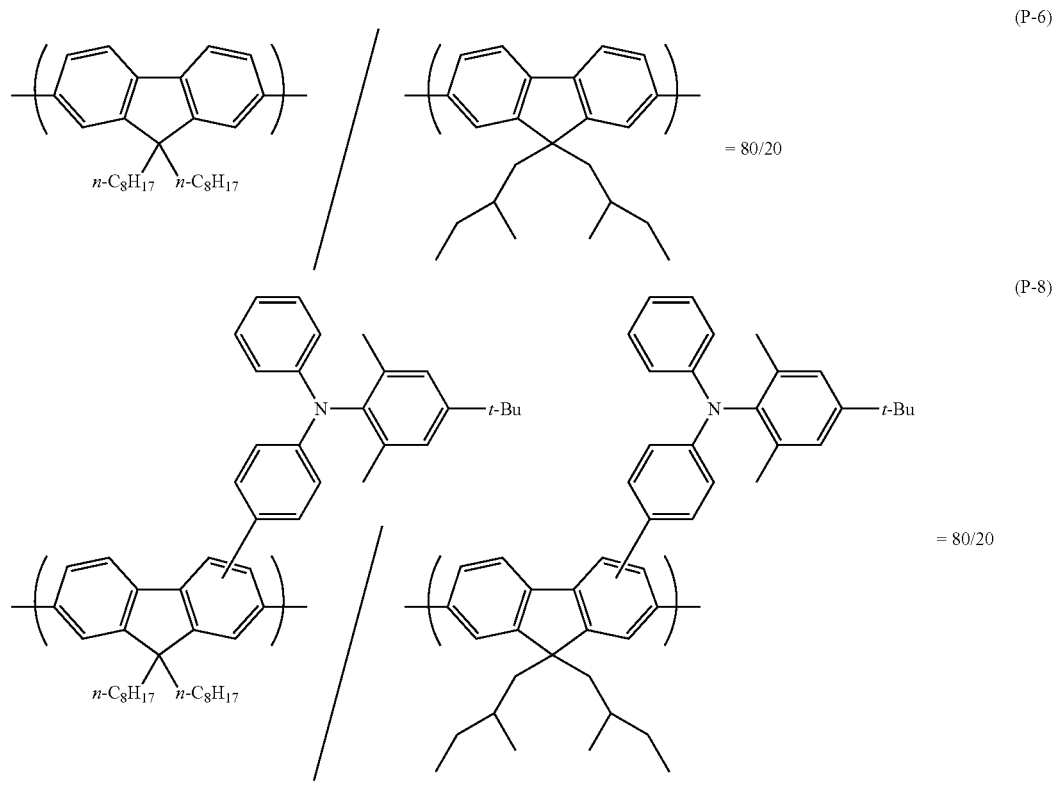

(P-6)

(P-8)

Synthesis Example 11

Synthesis of Compound L (Synthesis of Compound L-1)

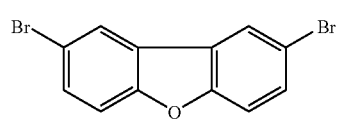

Compound L-1

Benzofuran (23.2 g, 137.9 mmol) and acetic acid (232 g) were placed in a 1-liter, three-necked flask in an inert atmosphere. They were stirred at room temperature for dissolution. The solution was heated to 75° C. Then, there was dropwise added a solution obtained by diluting bromine (92.6 g, 579.3 mmol) with acetic acid (54 g). After the completion of the dropwise addition, the mixture was stirred for 3 hours with the temperature being maintained and then was allowed to Synthesis of Compound L-3

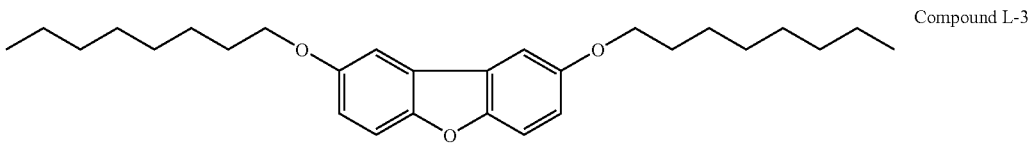
Compound L-3 sodium thiosulfate solution and water, and dried. The resulting crude product was recrystallized from hexane to obtain an intended product (yield: 21.8 g, 49%).

$^1$H-NMR (300 MHz, CDCl$_3$): δ
7.44 (d, 2H), 7.57 (d, 2H), 8.03 (s, 2H)

(Synthesis of Compound L-2)

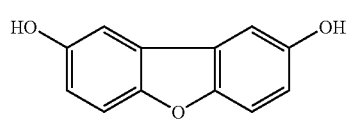
Compound L-2

A compound L-1 (16.6 g, 50.9 mmol) and tetrahydrofuran (293 g) were placed in a 500-ml, four-necked flask in an inert atmosphere. They were cooled to −78° C. Thereto was dropwise added n-butyllithium (80 ml<1.6 mol hexane solution>, 127.3 mmol). With the temperature being kept, stirring was conducted for 1 hour. The reaction mixture was dropwise added into a 1,000-ml, four-necked flask wherein a mixture of trimethoxyboronic acid (31.7 g, 305.5 mmol) and tetrahydrofuran (250 ml) was present at −78° C. in an inert atmosphere. After the completion of dropwise addition, the resulting mixture was returned to room temperature slowly, followed by stirring at room temperature for 2 hours. Then, the disappearance of raw materials was confirmed by TLC. The reaction mass was poured into a 2,000-ml beaker containing concentrated sulfuric acid (30 g) and water (600 ml), for termination of reaction. Toluene (300 ml) was added for extraction. To the resulting organic layer was added water for washing. The organic layer was subjected to distillation to remove the solvent. 8 g of the residue and ethyl acetate (160 ml) were placed in a 300-ml, four-necked flask. Thereto was added a 30% aqueous hydrogen peroxide solution (7.09 g), followed by stirring at 40° C. for 2 hours. The reaction mixture was poured into a 1,000-ml beaker containing an aqueous solution comprising iron (II) ammonium sulfate (71 g) and water (500 ml). After stirring, the organic layer was separated and washed with water. The resulting organic layer was subjected to distillation to remove the solvent to obtain 6.72 g of a crude compound L-2.

MS spectrum: M$^+$ 200.0

Synthesis of Compound L-3

In a 200-ml, four-necked flask were placed, in an inert atmosphere, a compound L-2 (2.28 g, 11.4 mmol) synthesized in the same manner as above and N,N-dimethylformamide (23 g). Stirring was conducted at room temperature for dissolution. Thereto was added potassium carbonate (9.45 g, 68.3 mmol) and the mixture was heated to 60° C. Thereto was dropwise added a solution obtained by diluting n-octyl bromide (6.60 g, 34.2 mmol) with N,N-dimethylformamide (11 g). After the completion of the dropwise addition, the mixture was heated to 60° C. With the temperature being kept, stirring was conducted for 2 hours and the disappearance of raw materials was confirmed by TLC. Water (20 ml) was added for termination of reaction. Then, toluene (20 ml) was added for extraction. The organic layer was washed with water twice, dried over anhydrous sodium sulfate, and subjected to distillation to remove the solvent. The crude product obtained was purified using a silica gel column to obtain an intended product. (Yield: 1.84 g, 38%)

MS spectrum: M$^+$ 425.3

(Synthesis of Compound L)

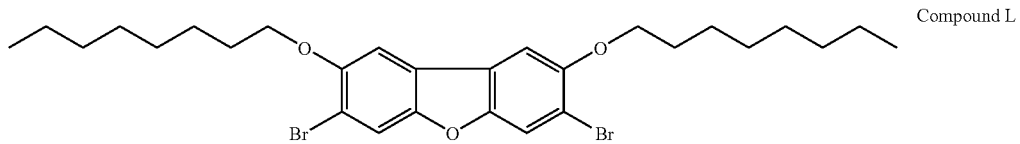
Compound L

In a 500-ml, four-necked flask were placed, in an inert atmosphere, a compound L-3 (7.50 g, 17.7 mmol) synthesized in the same manner as above and N,N-dimethylformamide, followed by stirring at room temperature for dissolution. The mixture was cooled in an ice bath. Thereto was dropwise added a solution obtained by diluting N-bromosuccinimide (6.38 g, 35.9 mmol) with N,N-dimethylformamide (225 ml). After the completion of the dropwise addition, the mixture was kept for 1 hour in an ice-bath and for 18.5 hours at room temperature, and heated to 40° C. With the temperature being kept, stirring was conducted for 6.5 hours and the disappearance of raw materials was confirmed by liquid chromatography. The resulting mixture was subjected to distillation to remove the solvent. To the residue was added toluene (75 ml) for dissolution. The solution was washed with water three times, dried over anhydrous sodium sulfate, and subjected to distillation to remove the solvent. About half of the crude product obtained was purified by silica gel column chromatography and liquid chromatography to obtain an intended product. (Yield: 0.326 g)

$^1$H-NMR (300 MHz/CDCl$_3$): δ

0.90 (t, 6H), 1.26-1.95 (m, 24H), 4.11 (t, 4H), 7.34 (s, 2H), 7.74 (s, 2H)

MS spectrum: M+ 582.1

Synthesis Example 12

Synthesis of Polymer 8

In 30 g of dehydrated tetrahydrofuran were dissolved, in a nitrogen atmosphere, 0.104 g of 3,8-dibromodibenzofuran, 0.719 g of a compound L and 0.578 g of 2,2'-bipyridyl. The solution was heated to 60° C. To the solution was added 1.040 g of bis(1,5-cyclooctadiene) nickel (0) {Ni(COD)$_2$}, and a reaction was allowed to take place at 60° C. for 3 hours. After the reaction, the reaction mixture was cooled to room temperature and was dropwise added to a mixed solution of 9 g of 25% ammonia water, 95 g of methanol and 50 g of deionized water, followed by stirring for 30 minutes. The resulting precipitate was collected by filtration, dried under reduced pressure for 2 hours, and dissolved in 30 ml of toluene. To the solution was added 30 g of 1 N hydrochloric acid, followed by stirring for 30 minutes. The aqueous layer was removed. To the organic layer was added 30 g of 4% ammonia water, followed by stirring for 3 hours. The aqueous layer was removed. The organic layer was dropwise added to 200 ml of methanol, followed by stirring for 30 minutes. The resulting precipitate was collected by filtration, dried under reduced pressure for 2 hours and dissolved in 30 ml of toluene. The solution was passed through an alumina column (alumina amount: 10 g) for purification. The resulting toluene solution was dropwise added to 200 ml of methanol, followed by stirring for 30 minutes. The resulting precipitate was collected by filtration and dried under reduced pressure for 2 hours. The yield of the polymer obtained was 0.456 g. The polymer is called polymer 8.

The number-average molecular weight Mn and weight-average molecular weight Mw (both reduced to polystyrene) of the polymer 8 were $1.3 \times 10^5$ and $4.6 \times 10^5$, respectively (GPC measurement method A).

The polymer 8 comprises dibenzofuran repeating units represented by formulas (P-9) and (P-10) and the ratio thereof, estimated from the ratio of raw materials fed is (P-9)/(P-10)=80/20.

Synthesis Example 13

Synthesis of Polymer 9

Bromination of Polymer 8

Into a 20-ml flask were fed, in an argon gas atmosphere, a polymer 8 (150 mg, 0.404 mmol in terms of dibenzofuran repeating unit) and 8 ml of chloroform. They were stirred at room temperature for dissolution. Thereinto were fed, in order, 0.6 ml of trifluoroacetic acid and a solution obtained by diluting 5.2 μl of bromine (0.10 mmol, 25 mol % relative to dibenzofuran repeating unit) with 1 ml of chloroform, followed by stirring for 20 hours under light shielding. The reaction mass was dropwise added to 38 ml of methanol with stirring, for precipitation. The precipitate was collected by filtration, washed with methanol, dried under reduced pressure for 2 hours, and dissolved in 25 ml of toluene. The solution was passed through a silica gel column and an alumina column (toluene had been passed through these columns). The columns were washed with toluene. The resulting solution and the washing were combined and concentrated under reduced pressure. The concentrate was dropwise added to methanol for precipitation. The precipitate was collected by filtration, washed with methanol, and dried under reduced pressure to obtain 152 mg of a polymer. The polymer is called polymer 9. The number-average molecular weight Mn, weight-average molecular weight Mw, peak top molecular weight Mp (all reduced to polystyrene), and dispersion degree Mw/Mn of the polymer 9 were $1.5 \times 10^5$, $3.8 \times 10^5$, $3.7 \times 10^5$ and 2.6, respectively (GPC measurement method C).

The polymer is considered to comprise dibenzofuran repeating units represented by formulas (P-9), (P-10), (P-9b) and (P-11).

The ratio of Br group-containing repeating units (formula P-9b) and (formula P-11) and Br group-free repeating units (formula P-9) and (formula P-10), estimated from the result of elemental analysis, is {(formula P-9)+(formula P-10)}/{(formula P-9b)+(formula P-11)}=77/23 and corresponds to (total dibenzofuran repeating units)/Br group=81/19.

Elemental analysis (measured): C 75.46%, H 7.93%, N<0.3%, Br 4.67%

Elemental analysis (calculated): C 76.52%, H 8.12%, N 0%, Br 4.67%

(calculated at {(formula P-9)+(formula P-10)}/{(formula P-9b)+(formula P-11)}=77/23)

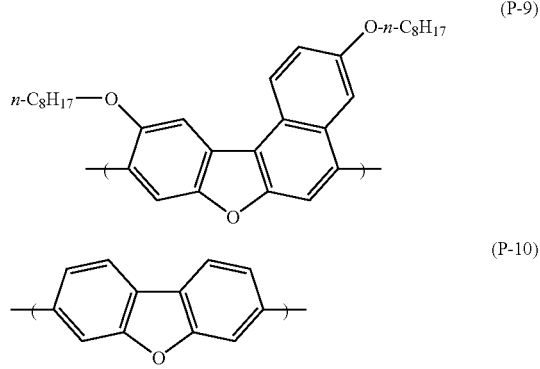

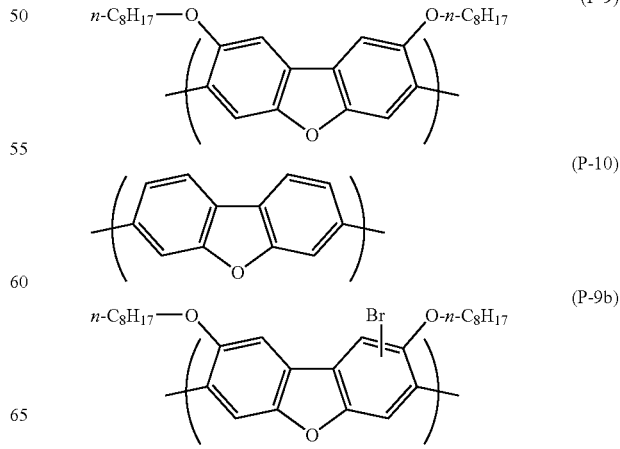

-continued

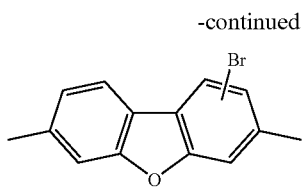
(P-11)

Example 6

Synthesis of Aromatic Polymer 6

Into a 25-ml flask were fed 40 mg of Aliquot 336, 80 mg of a polymer 9 and 15.3 mg of a compound I. The flask inside was purged with argon gas. Thereinto was fed 36 ml of commercial dehydrated toluene, followed by stirring at room temperature for dissolution. The solution was subjected to argon gas bubbling for degassing. The solution was heated to 80° C. Thereto were added 0.30 mg of palladium (II) acetate, 1.91 mg of tris(o-methoxyphenyl)phosphine and further 0.41 ml of an aqueous sodium carbonate (17.5 wt. %) solution. The mixture was heated to 105° C. and stirring was conducted for 3 hours. The heating was stopped once and there was added 42 mg of 4-(4,4,5,5-tetramethyl-[1,3,2]dioxaborolan-2-yl) butyltoluene. The mixture was heated to 105° C., followed by stirring for 2 hours. The aqueous layer was removed. The organic layer was washed with deionized water (twice), a 3% aqueous acetic acid solution (twice) and deionized water (twice) in this order, and was dropwise added to methanol for precipitation. The precipitate was collected by filtration, washed with methanol and dried under reduced pressure to obtain 93 mg of a crude polymer.

90 mg of the crude polymer was dissolved in 6 ml of toluene at room temperature. The solution was passed through a silica gel column and an alumina column (toluene had been passed through these columns). The columns were washed with toluene. The resulting solution and the washing were combined and were dropwise added to methanol for precipitation. The precipitate was collected by filtration, washed with methanol, and dried under reduced pressure to obtain 63 mg of a polymer.

The polymer is called aromatic polymer 6. The number-average molecular weight Mn, weight-average molecular weight Mw, peak top molecular weight Mp (all reduced to polystyrene), and dispersion degree Mw/Mn of the aromatic polymer 6 were $1.5 \times 10^5$, $4.7 \times 10^5$, $3.7 \times 10^5$ and 3.1, respectively (GPC measurement method C).

The polymer is considered to comprise dibenzofuran repeating units represented by formulas (P-9), (P-10), (P-9c) and (P-12).

From the result of elemental analysis, the ratio of repeating units (formula P-9) and (formula P-10) and substituent group-containing repeating units (formula P-9c) and (formula P-12) is {(formula P-9)+(formula P-10)}/{(formula P-9c)+(formula P-12)}=92/8 and corresponds to (total dibenzofuran repeating units)/carbazole substituent group=93/7.

Elemental analysis (measured): C 78.90%, H 7.90%, N 0.27%

Elemental analysis (calculated): C 80.64%, H 8.41%, N 0.27%, (calculated at {(formula P-9)+(formula P-10)}/{(formula P-9c)+(formula P-12)}=92/8)

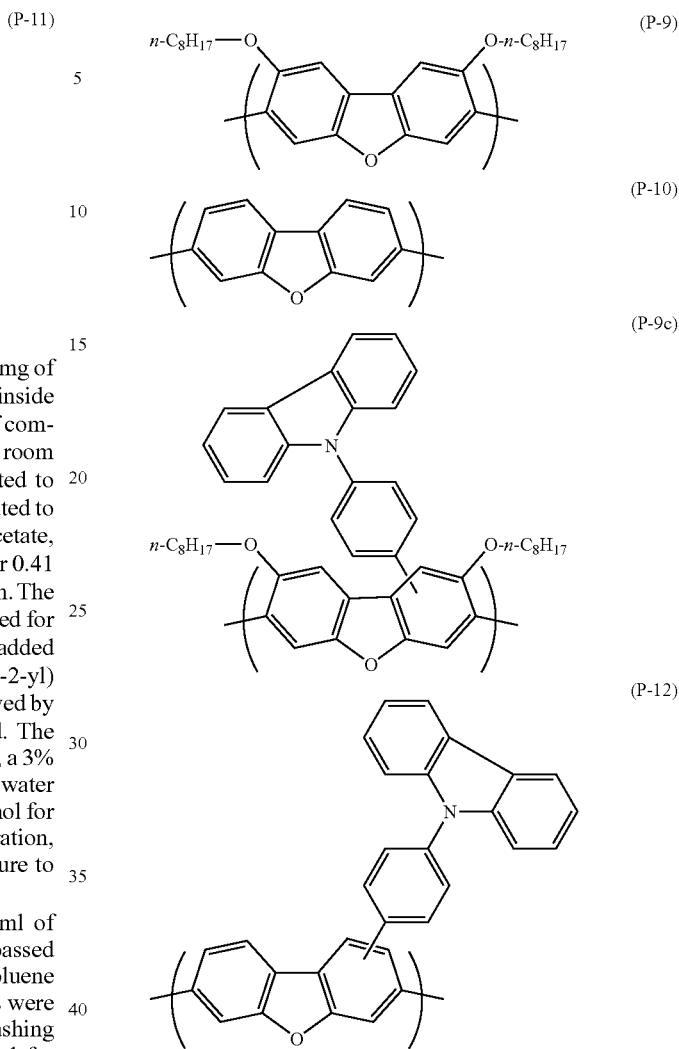

Reference Synthesis Example 1

Synthesis of Polymer 10

In 50 ml of dehydrated tetrahydrofuran were dissolved a compound E (0.800 g, 1.34 mmol), N,N-bis(4-bromophenyl)-N-(4-t-butyl-2,6-dimethylphenyl)amine (0.163 g, 0.334 mmol) and 2,2'-bipyridyl (0.626 g). The system inside was subjected to nitrogen bubbling for purging with nitrogen. To the solution was added, in a nitrogen atmosphere, bis(1,5-cyclooctadiene) nickel (0) {Ni(COD)$_2$} (1.10 g). The mixture was heated to 60° C., followed by stirring for 5 hours to give rise to a reaction. After the completion of the reaction, the reaction mixture was cooled to room temperature (about 25° C.) and dropwise added to a mixed solution of 5 ml of 25% ammonia water, about 50 ml of methanol and about 50 ml of deionized water. The mixture was stirred for 1 hour. The resulting precipitate was collected by filtration, dried under reduced pressure for 2 hours, and dissolved in 50 ml of toluene. The solution was filtered. The filtrate was passed through an alumina column for purification, and washed with 50 ml of a 5.2% aqueous hydrochloric acid solution (3 hours), 50 ml of 4% ammonia water (2 hours) and 50 ml of deionized water. The resulting solution was dropwise added to about 100 ml of methanol, followed by stirring for 1 hour. The resulting precipitate was collected by filtration and dried under reduced pressure for 2 hours. The yield of the resulting copolymer (hereinafter called polymer 10) was 295 mg.

The polystyrene reduced, number-average molecular weight Mn and weight-average molecular weight Mw of the polymer 10 were $3.1 \times 10^4$ and $6.5 \times 10^4$, respectively (GPC measurement method A).

The ratio of repeating units (P-1) and (P-13) in the polymer 10, estimated from the ratio of raw materials fed is (P-1)/(P-13)=80/20.

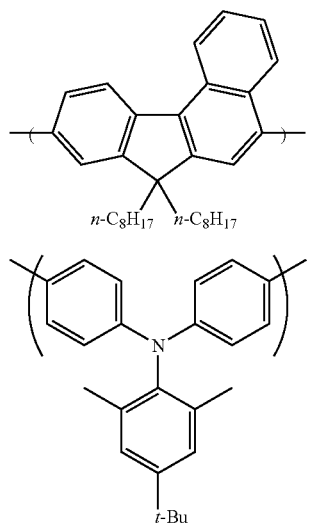

(P-1)

(P-13)

Example 7

Preparation of Solution

The aromatic polymer 1 obtained above was dissolved in toluene to prepare a toluene solution containing 2.0% by weight of the polymer.

Production of Electron Only Device

An aluminum layer having a thickness of about 500 nm was formed, by vapor deposition, on a glass substrate having thereon an ITO film of 150 nm in thickness formed by sputtering. Incidentally, the aluminum layer was formed in an electrode pattern using a vapor deposition mask. On the thus-obtained aluminum electrode substrate was formed a film in a nitrogen gas atmosphere by spin-coating the above-obtained toluene solution at 2,600 rpm. The thickness of the film was about 78 nm. The film was dried for 1 hour at 80° C. under reduced pressure. Then, lithium fluoride was vapor-deposited in a thickness of about 4 nm, calcium as cathode was vapor-deposited in a thickness of about 5 nm, thereafter, aluminum was vapor-deposited in a thickness of about 80 nm, whereby an electron only device was produced. Incidentally, the vapor deposition of metal was initiated after the vacuum had reached $1 \times 10^{-4}$ Pa or less.

Production of Hole Only Device

A thin film having a thickness of 70 nm was formed on a glass substrate having thereon an ITO film of 150 nm in thickness formed by sputtering, by spin-coating a solution obtained by filtering, through a 0.2-μm membrane filter, a suspension of poly(3,4)ethylenedioxythiophene/polystyrenesulfonic acid (a product of Bayer, Baytron P AI 4083). The thin film was dried on a hot plate at 200° C. for 10 minutes. Then, the above-obtained toluene solution was spin-coated at 2,600 rpm, to form a film. The thickness of the film was about 78 nm. The film was dried for 1 hour at 80° C. under reduced pressure. Then, gold was vapor-deposited in a thickness of 200 nm to produce a hole only device. Incidentally, the vapor deposition of metal was initiated after the vacuum had reached $1 \times 10^{-4}$ Pa or less.

Measurement of Voltage-current Characteristic

To the above-obtained electron only device and hole only device, voltage was applied at a 0.2-V step between 0 to 12 V, using a picoampere meter and a DC source (Model: 4140B) (both are products of Hewlett Packard), and the current (which flowed through each device) was recorded. Incidentally, it can be considered that, in each carrier only device, substantially only electrons flow through the electron device and substantially only holes flow through the hole device, in a relatively low voltage range, in view of the relative relation between the work functions of metals used in the anode and cathode of each device and the HOMO and LUMO of each light-emitting material. The results of measurement are shown in FIG. 1.

Comparative Example 1

An electron only device and a hole only device were produced in the same manner as in Example 7 except that the above-obtained polymer 10 was dissolved in toluene to prepare a toluene solution containing 2.0% by weight of the polymer. Incidentally, the rpm of spin coating was 3,600 and the thickness of the polymer film obtained was 82 nm.

Figure 2:
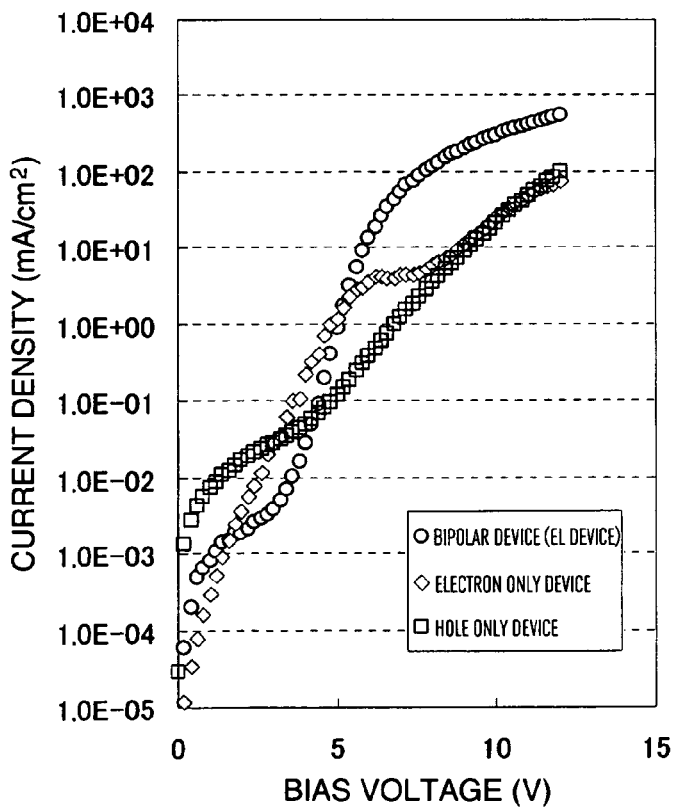
FIG. 2 shows the results of voltage-current characteristics of the electron only device and hole only device of Comparative Example 1 and the EL device of Comparative Example 2.

For the thus-obtained electron only device and hole only device, voltage-current characteristic was measured in the same manner as in Example 1. The results of measurement are shown in FIG. 2.

Example 8

Preparation of Solution

The aromatic polymer 1 obtained above was dissolved in toluene to prepare a toluene solution containing 2.0% by weight of the polymer.

Production of EL Device

A thin film having a thickness of 70 nm was formed on a glass substrate having thereon an ITO film of 150 nm in thickness formed by sputtering, by spin-coating a solution obtained by filtering, through a 0.2-μm membrane filter, a suspension of poly(3,4)ethylenedioxythiophene/polystyrenesulfonic acid (a product of Bayer, Baytron P AI 4083). The thin film was dried on a hot plate at 200° C. for 10 minutes. Then, the above-obtained toluene solution was spin-coated at 2,600 rpm, to form a film. The thickness of the film was about 78 nm. The film was dried for 1 hour at 80° C. under reduced pressure. Then, lithium fluoride was vapor-deposited in a thickness of about 4 nm, calcium as cathode was vapor-deposited in a thickness of about 5 nm, thereafter, aluminum was vapor-deposited in a thickness of about 80 nm, whereby an EL device was produced. Incidentally, the vapor deposition of metal was initiated after the vacuum had reached $1 \times 10^{-4}$ Pa or less.

Properties of EL Device

A voltage was applied to the above-obtained device, whereby electroluminescence having a peak at 460 nm was obtained from the device. The color of the electroluminescence at 8.0 V application was x=0.217 and y=0.324 when shown according to C.I.E. color coordinates. The intensity of the electroluminescence was almost proportional to the current density generated. Also in the device, the electroluminescence started from 4.2 V and the maximum electroluminescence efficiency was 0.29 cd/A. Incidentally, the voltage (V)-current (I) characteristic obtained in this measurement is shown in FIG. 1.

Comparative Example 2

Preparation of Solution

The polymer 10 obtained above was dissolved in toluene to prepare a toluene solution containing 2.0% by weight of the polymer.

Production of EL Device

An EL device was produced in the same manner as in Example 8 except that the above-obtained toluene solution was used. Incidentally, the rpm of spin-coating was 3,600 and the thickness of the polymer film obtained was 82 nm.

Properties of EL Device

A voltage was applied to the above-obtained device, whereby electroluminescence having a peak at 460 nm was obtained from the device. The color of the electroluminescence at 8.0 V application was x=0.157 and y=0.181 when shown according to C.I.E. color coordinates. The intensity of the electroluminescence was almost proportional to the current density. Also in the device, the electroluminescence started from 5.0 V and the maximum electroluminescence efficiency was 0.40 cd/A. Incidentally, the voltage (V)-current (I) characteristic obtained in this measurement is shown in FIG. 2.

Example 9

Preparation of Solution

The aromatic polymer 2 obtained above was dissolved in toluene to prepare a toluene solution containing 1.5% by weight of the polymer.

Production of EL Device

A thin film having a thickness of 80 nm was formed on a glass substrate having thereon an ITO film of 150 nm in thickness formed by sputtering, by spin-coating a solution obtained by filtering, through a 0.1-μm membrane filter, a suspension of poly(3,4)ethylenedioxythiophene/polystyrenesulfonic acid (a product of H. C. Starck, Baytron P AI 4083). The thin film was dried on a hot plate at 200° C. for 15 minutes. Then, the above-obtained toluene solution was spin-coated at 1,700 rpm, to form a film. The thickness of the film was about 83 nm. The film-formed substrate was dried for 1 hour at 90° C. in a nitrogen atmosphere. During the drying step, the oxygen concentration and the water content were 10 ppm or less. On the resulting substrate, lithium fluoride was vapor-deposited in a thickness of about 4 nm, calcium as cathode was vapor-deposited in a thickness of about 5 nm, thereafter, aluminum was vapor-deposited in a thickness of about 100 nm, whereby an EL device was produced. Incidentally, the vapor deposition of metal was initiated after the vacuum had reached $1 \times 10^{-4}$ Pa or less.

Properties of EL Device

Figure 3:
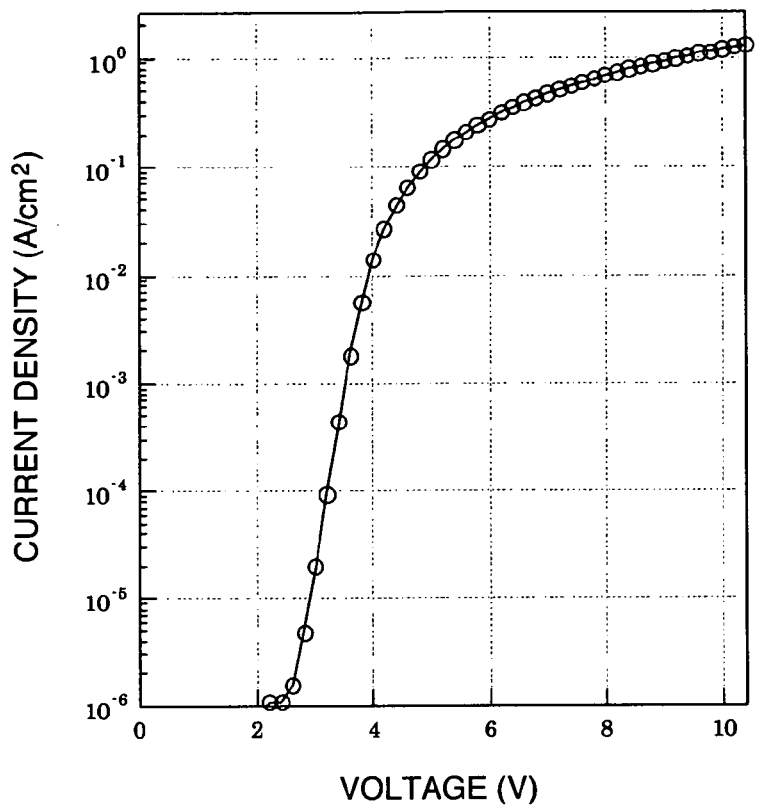
FIG. 3 shows the result of measurement of voltage-current characteristic of the EL device of Example 9.

A voltage was applied to the above-obtained device, whereby electroluminescence having a peak at 460 nm was obtained from the device. In the device, the electroluminescence started from 3.3 V and the maximum electroluminescence efficiency was 0.69 cd/A. Incidentally, the voltage (V)-current (I) characteristic obtained in this measurement is shown in FIG. 3.

Example 10

Figure 4:
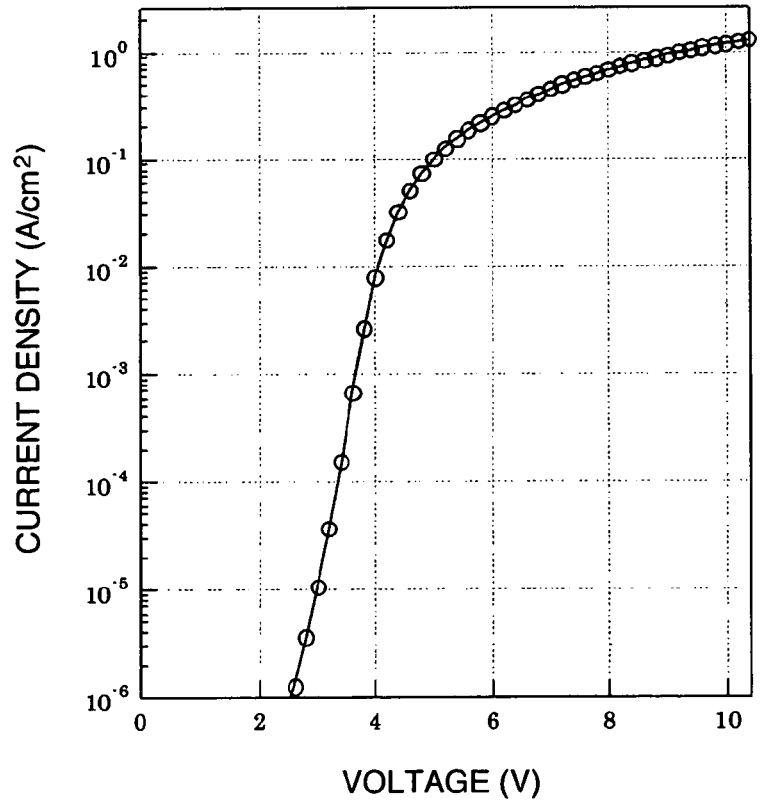
FIG. 4 shows the result of measurement of voltage-current characteristic of the EL device of Example 10.

An operation was conducted in the same manner as in Example 9 except that the aromatic polymer 3 was used in place of the aromatic polymer 2 used in Example 9 and the rpm of spin-coating was 1,300 rpm. The thickness of the film formed was about 85 nm. A voltage was applied to the device obtained, whereby electroluminescence having a peak at 505 nm was obtained from the device. In the device, the electroluminescence started from 3.4 V and the maximum electroluminescence efficiency was 1.13 cd/A. Incidentally, the voltage (V)-current (I) characteristic obtained in this measurement is shown in FIG. 4.

Example 11

Figure 5:
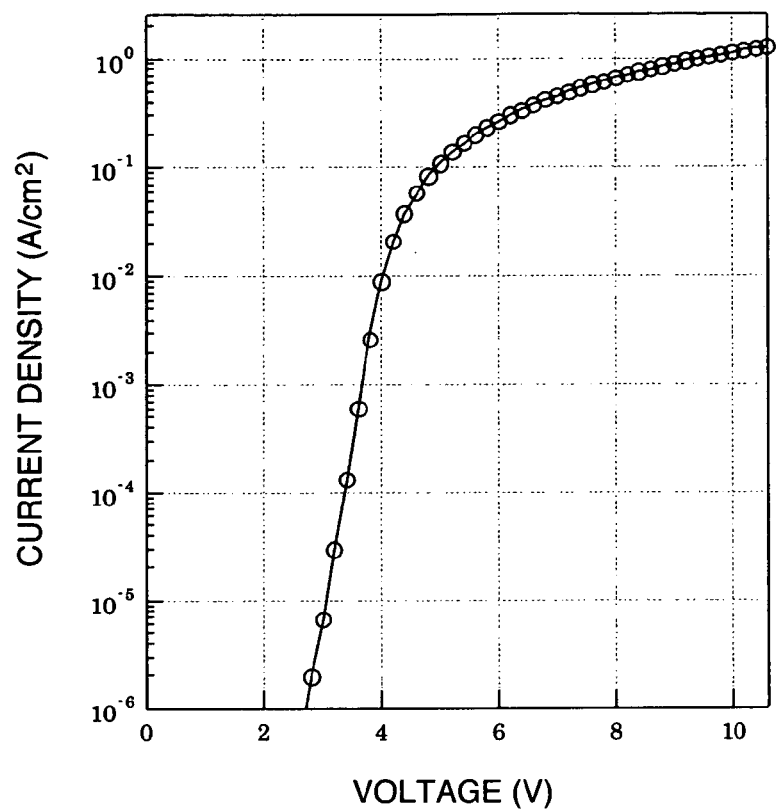
FIG. 5 shows the result of measurement of voltage-current characteristic of the EL device of Example 11.

An operation was conducted in the same manner as in Example 9 except that the aromatic polymer 4 was used in place of the aromatic polymer 2 used in Example 9 and the rpm of spin-coating was 1,500 rpm. The thickness of the film formed was about 87 nm. A voltage was applied to the device obtained, whereby electroluminescence having a peak at 460 nm was obtained from the device. In the device, the electroluminescence started from 3.4 V and the maximum electroluminescence efficiency was 0.71 cd/A. Incidentally, the voltage (V)-current (I) characteristic obtained in this measurement is shown in FIG. 5.

Comparative Example 3

Figure 6:
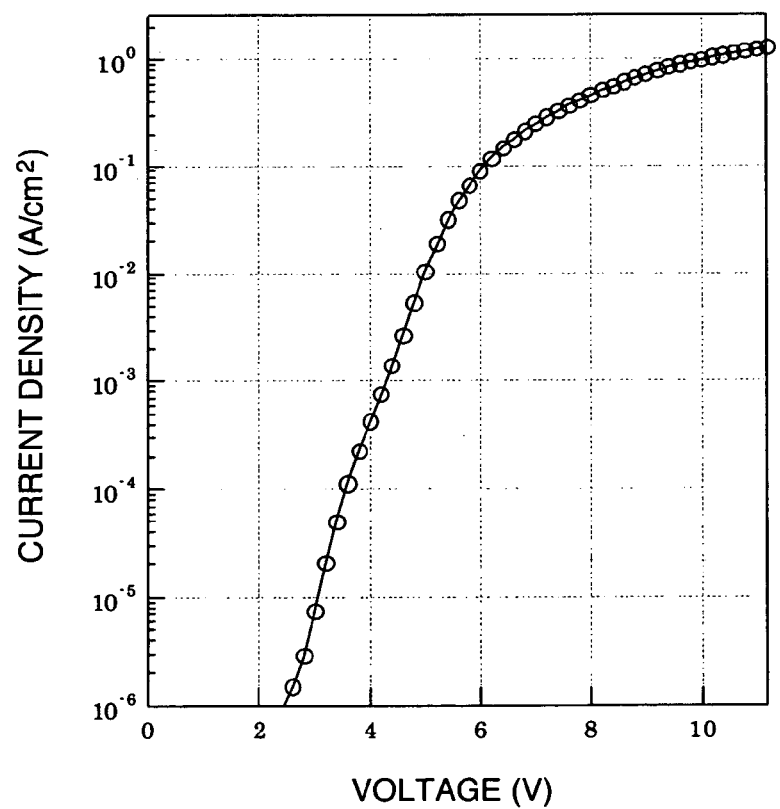
FIG. 6 shows the result of measurement of voltage-current characteristic of the EL device of Comparative Example 3.

An operation was conducted in the same manner as in Example 9 except that the polymer 3 was used in place of the aromatic polymer 2 used in Example 9 and the rpm of spin-coating was 1,300 rpm. The thickness of the film formed was about 103 nm. A voltage was applied to the device obtained, whereby electroluminescence having a peak at 470 nm was obtained from the device. In the device, the electroluminescence started from 4.4 V and the maximum electroluminescence efficiency was 0.18 cd/A. Incidentally, the voltage (V)-current (I) characteristic obtained in this measurement is shown in FIG. 6.

Effects Of The Invention

From the comparison of Example 7 and Comparative Example 1, it is clear that the aromatic polymer 1, as compared with the corresponding polymer 10, transfers any of electron and hole well. This implies that the aromatic polymer contains a large number of carriers therein (in the polymer, light-emitting material) and enables quick transfer of carriers. Thus, the aromatic polymer is highly superior as a polymer, light-emitting material or as a charge transfer material.

Comparison of Example 8 and Comparative Example 2 indicates that, in the polymer, light-emitting device using the aromatic polymer 1, as compared with the corresponding polymer 10, the voltage of light emission start is low and the current obtained at a low voltage range is large. This implies that the aromatic polymer shows a high carrier mobility particularly at a low voltage and contributes to reduction in driving voltage when used as a light-emitting material or as a charge transfer material.

Similarly, the aromatic polymers 2, 3 and 4, as compared with the corresponding polymer 3, are low in voltage of light emission start, give a large current particularly at a low voltage range, and give a high light emission efficiency.

Thus, the aromatic polymer of the invention of the present application has excellent properties when used as a material for polymer, light-emitting device.

INDUSTRIAL APPLICABILITY

The aromatic polymer of the present invention is expected as a polymer material useful in development of various high-functional materials, in electron material field, chemical field, energy material field, medicinal field, etc.

The invention claimed is

1. An aromatic polymer containing at least one kind of the repeating units represented by the following formula (1):

(1)

wherein $Ar^1$ represents an arylene group having a fused ring structure or a divalent heterocyclic compound group having a π-conjugated system and has a group represented by the following formula (2), bonding to a carbon atom having a $sp^2$ hybrid orbital, which carbon atom is contained in a ring of a ring structure of the arylene group having a fused ring structure or the divalent heterocyclic compound group having a π-conjugated system, each represented by $Ar^1$:

(2)

(wherein $E^1$ represents a hydrogen atom, a halogen atom or a monovalent organic group; $Ar^2$ represents a group having a divalent, π-conjugated cyclic compound residue; two $Ar^2$'s may be the same or different from each other; $X^1$ represents a divalent group selected from the group consisting of —$NQ^1$-, —$PQ^2$- and —$BQ^3$-; $Q^1$ to $Q^3$ independently represent a substituent; Z represents a direct bond or a divalent linking group; two Z's may be the same or different from each other; $m_i$'s each represent 0 or 1; in case where two $X^1$'s exist, they may be the same or different from each other).

2. The aromatic polymer according to claim 1, wherein, in the repeating units represented by the formula (1), the group represented by $Ar^1$ has a fused ring structure.

3. The aromatic polymer according to claim 1, which is a copolymer containing at least one kind of the repeating units represented by the formula (1) and further containing other repeating unit.

4. The aromatic polymer according to claim 3, wherein the other repeating unit is a repeating unit selected from the group consisting of the following formulas (5) to (9):

(5)

(6)

(7)

(8)

(9)

wherein $Ar^4$ represents a repeating unit formed by replacing the side chains of $Ar^1$ of formula (1) with hydrogen atoms; $Ar^5$, $Ar^6$, $Ar^7$ and $Ar^8$ each independently represent a group having a divalent, π-conjugated cyclic compound residue; $X^2$, $X^3$ and $X^4$ each independently represent a divalent linking group; and p represents 1 or 2.

5. The aromatic polymer according to claim 4, wherein the total amount of the repeating units represented by the formula (1) is not less than 11 mole % and not more than 100 mole % relative to the total amount of the repeating units represented by the formula (1) and the formulas (5) to (9), possessed by the main chain.

6. The aromatic polymer according to claim 1, comprising the repeating units represented by the formula (1).

7. The aromatic polymer according to claim 4, comprising the repeating units represented by the formulas (1) and (5).

8. The aromatic polymer according to claim 6, having a degree of dispersion (weight-average molecular weight/number-average molecular weight) of not less than 1 and not more than 12.

9. The aromatic polymer according to claim 1, having a polystyrene-reduced number-average molecular weight of $10^3$ to $10^8$.

10. The aromatic polymer according to claim 1, having a charge transfer property or having, in a solid state, a photoluminescence property.

11. A polymer composition characterized by containing at least one kind of material selected from the group consisting of a hole transfer material, an electron transfer material and a light-emitting material, and an aromatic polymer according to claim 1.

12. A solution characterized by containing an aromatic polymer according to claim 1.

13. A solution characterized by containing a polymer composition according to claim 11.

14. A light-emitting thin film containing an aromatic polymer according to claim 1, or a polymer composition characterized by containing at least one kind of material selected from the group consisting of a hole transfer material, an electron transfer material and a light-emitting material, and an aromatic polymer according to claim 1.

15. A conductive thin film containing an aromatic polymer according to claim 1, or a polymer composition characterized by containing at least one kind of material selected from the group consisting of a hole transfer material, an electron transfer material and a light-emitting material, and an aromatic polymer according to claim 1.

16. An organic semiconductor thin film containing an aromatic polymer according to claim 1, or a polymer composition characterized by containing at least one kind of material selected from the group consisting of a hole transfer material, an electron transfer material and a light-emitting material and an aromatic polymer according to claim 1.

17. An organic transistor characterized by having an organic semiconductor thin film according to claim 16.

18. A process for producing a thin film according to claim 14, characterized by using an ink jet method.

19. A process for producing a thin film according to claim 14, characterized by using screen printing, flexography, offset printing or gravure printing.

20. A polymer, light-emitting device characterized by having, between electrodes consisting of an anode and a cathode, an organic layer which contains an aromatic polymer according to claim 1, or a polymer composition characterized by containing at least one kind of material selected from the group consisting of a hole transfer material, an electron transfer material and a light-emitting material and an aromatic polymer according to claim 1.

21. A planar light source characterized by using a polymer, light-emitting device according to claim 20.

22. A segment display unit characterized by using a polymer, light-emitting device according to claim 20.

23. A dot matrix display unit characterized by using a polymer, light-emitting device according to claim 20.

24. A liquid crystal display characterized by unit using, as the back light, a polymer, light-emitting device according to claim 20.

25. The aromatic polymer according to claim 5, comprising the repeating units representing by the formulas (1) and (5).

* * * * *